(12) United States Patent
Nagata

(10) Patent No.: US 10,998,432 B2
(45) Date of Patent: May 4, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventor: Nao Nagata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 18 days.

(21) Appl. No.: 16/673,425

(22) Filed: Nov. 4, 2019

(65) Prior Publication Data

US 2020/0066888 A1   Feb. 27, 2020

Related U.S. Application Data

(62) Division of application No. 16/020,181, filed on Jun. 27, 2018, now Pat. No. 10,505,029.

(30) Foreign Application Priority Data

Jul. 27, 2017 (JP) .............................. JP2017-145400

(51) Int. Cl.
*H01L 29/73* (2006.01)
*H01L 29/739* (2006.01)
*H01L 29/06* (2006.01)
*H01L 29/08* (2006.01)
*H01L 29/10* (2006.01)
(Continued)

(52) U.S. Cl.
CPC ...... *H01L 29/7397* (2013.01); *H01L 29/0619* (2013.01); *H01L 29/0638* (2013.01); *H01L 29/0696* (2013.01); *H01L 29/083* (2013.01); *H01L 29/0834* (2013.01); *H01L 29/1087* (2013.01); *H01L 29/1095* (2013.01); *H01L 29/407* (2013.01); *H01L 29/417* (2013.01); *H01L 29/4238* (2013.01);
(Continued)

(58) Field of Classification Search
CPC . H01L 29/7397; H01L 29/407; H01L 29/417; H01L 29/4238; H01L 29/7396; H01L 29/083; H01L 29/0619; H01L 29/0638; H01L 29/0834; H01L 29/1095; H01L 29/1087
USPC ....................................................... 257/143
See application file for complete search history.

(56) References Cited

U.S. PATENT DOCUMENTS 8,633,510 B2   1/2014 Matsuura et al.
9,041,050 B2   5/2015 Matsuura
(Continued)

FOREIGN PATENT DOCUMENTS

JP   2012-256839 A   12/2012
JP   2013-140885 A   7/2013

OTHER PUBLICATIONS

U.S. PTO Notice of Allowance issued in related parent U.S. Appl. No. 16/020,181, dated Aug. 27, 2019.
Related parent U.S. Appl. No. 16/020,181, filed Jun. 27, 2018.

*Primary Examiner* — Sheikh Maruf
(74) *Attorney, Agent, or Firm* — McDermott Will & Emery LLP

(57) ABSTRACT

A semiconductor device including an IE-type trench gate IGBT requires to be improved in IE effect to reduce on voltage. The semiconductor device includes a trench gate electrode or a trench emitter electrode between an active cell region and an inactive cell region. The trench gate electrode and the trench emitter electrode are provided across the inactive cell region.

16 Claims, 59 Drawing Sheets

(51) Int. Cl.
*H01L 29/66* (2006.01)
*H01L 29/40* (2006.01)
*H01L 29/417* (2006.01)
*H01L 29/423* (2006.01)
*H02P 27/06* (2006.01)

(52) U.S. Cl.
CPC .... *H01L 29/66348* (2013.01); *H01L 29/7396* (2013.01); *H02P 27/06* (2013.01)

(56) References Cited

U.S. PATENT DOCUMENTS

| | | | |
|---|---|---|---|
| 2009/0057713 A1* | 3/2009 | Hirler | H01L 29/1095 257/143 |
| 2009/0242931 A1* | 10/2009 | Tsuzuki | H01L 29/167 257/143 |
| 2009/0283799 A1* | 11/2009 | Ruething | H01L 29/0834 257/143 |
| 2010/0078708 A1* | 4/2010 | Willmeroth | H01L 29/7802 257/328 |
| 2010/0155773 A1* | 6/2010 | Parthasarathy | H01L 29/66348 257/139 |
| 2010/0230718 A1* | 9/2010 | Hirler | H01L 29/1095 257/143 |
| 2012/0132955 A1* | 5/2012 | Saito | H01L 29/7397 257/140 |
| 2013/0175574 A1* | 7/2013 | Matsuura | H01L 29/407 257/139 |
| 2017/0256634 A1* | 9/2017 | Matsuura | H01L 29/0696 |
| 2018/0145134 A1* | 5/2018 | Nagata | H01L 29/0696 |
| 2018/0350910 A1* | 12/2018 | Saito | H01L 29/402 |
| 2020/0058645 A1* | 2/2020 | Harada | H01L 29/4238 |
| 2020/0243641 A1* | 7/2020 | Nakagawa | H01L 29/66704 |

* cited by examiner

FIG. 35
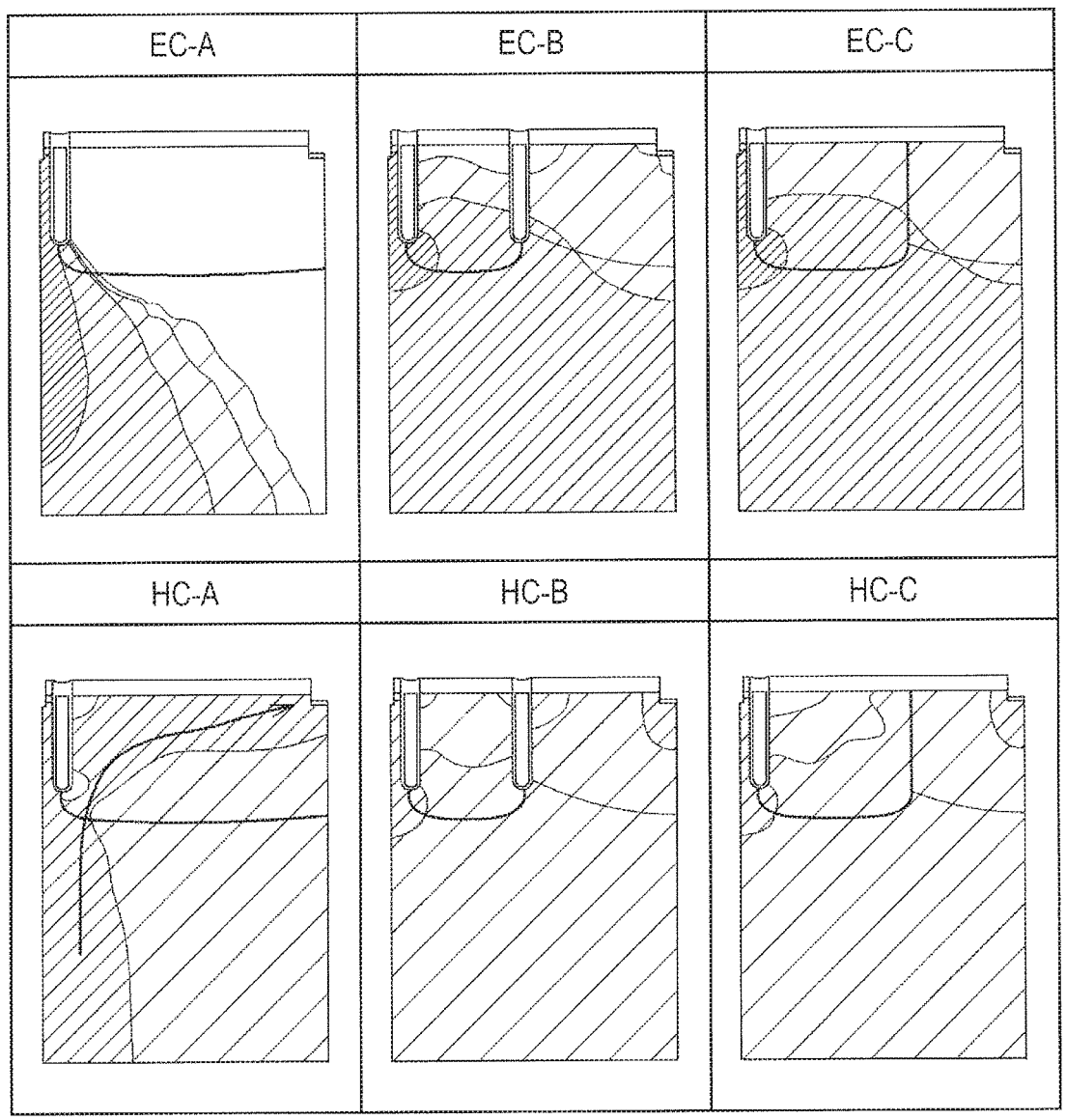
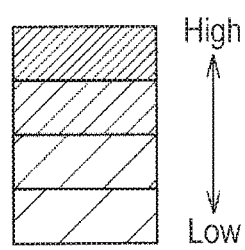

FIG. 47
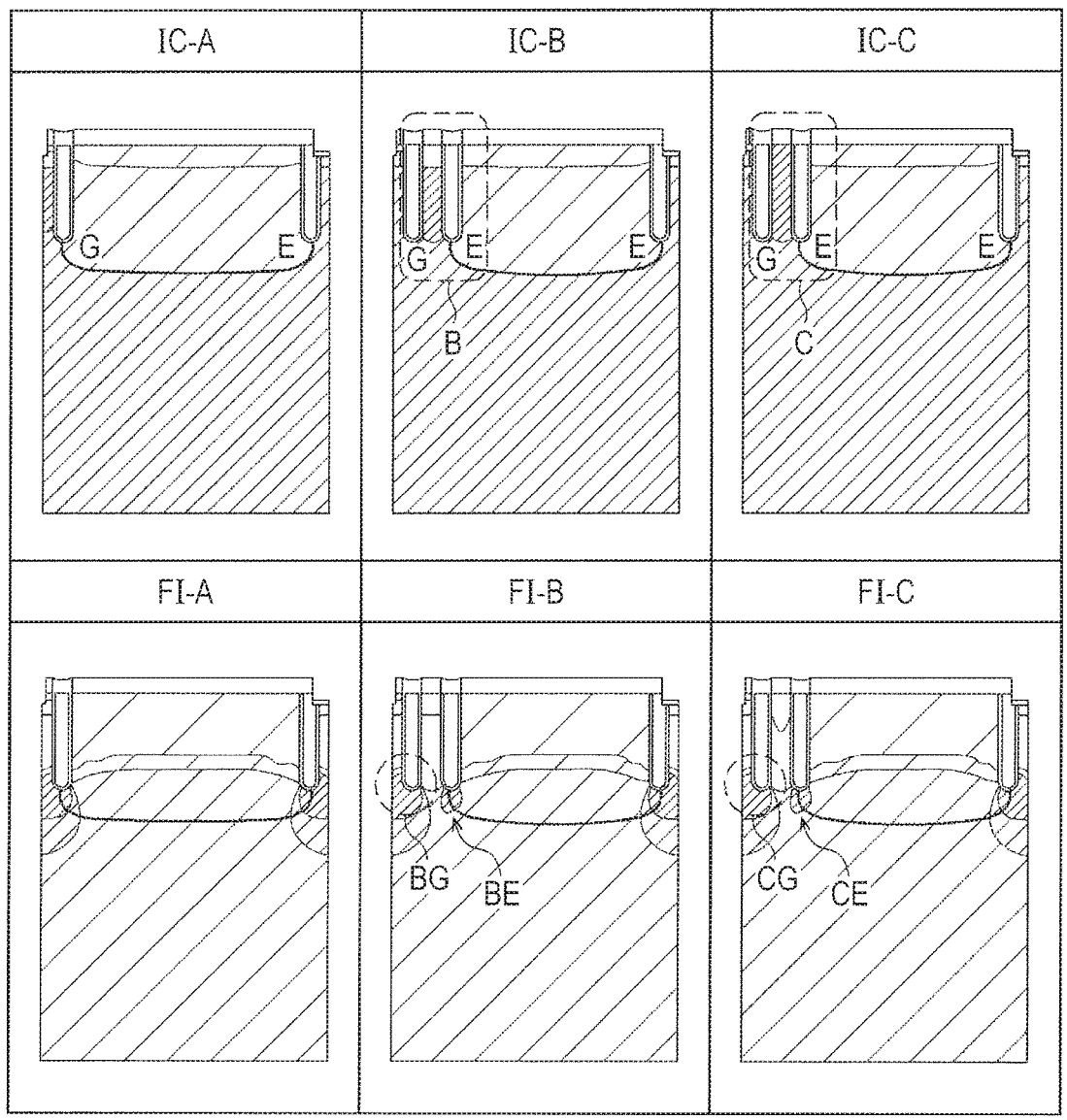
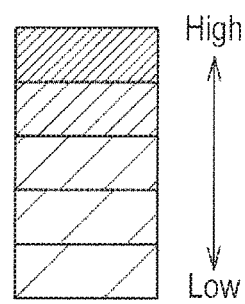

FIG. 49
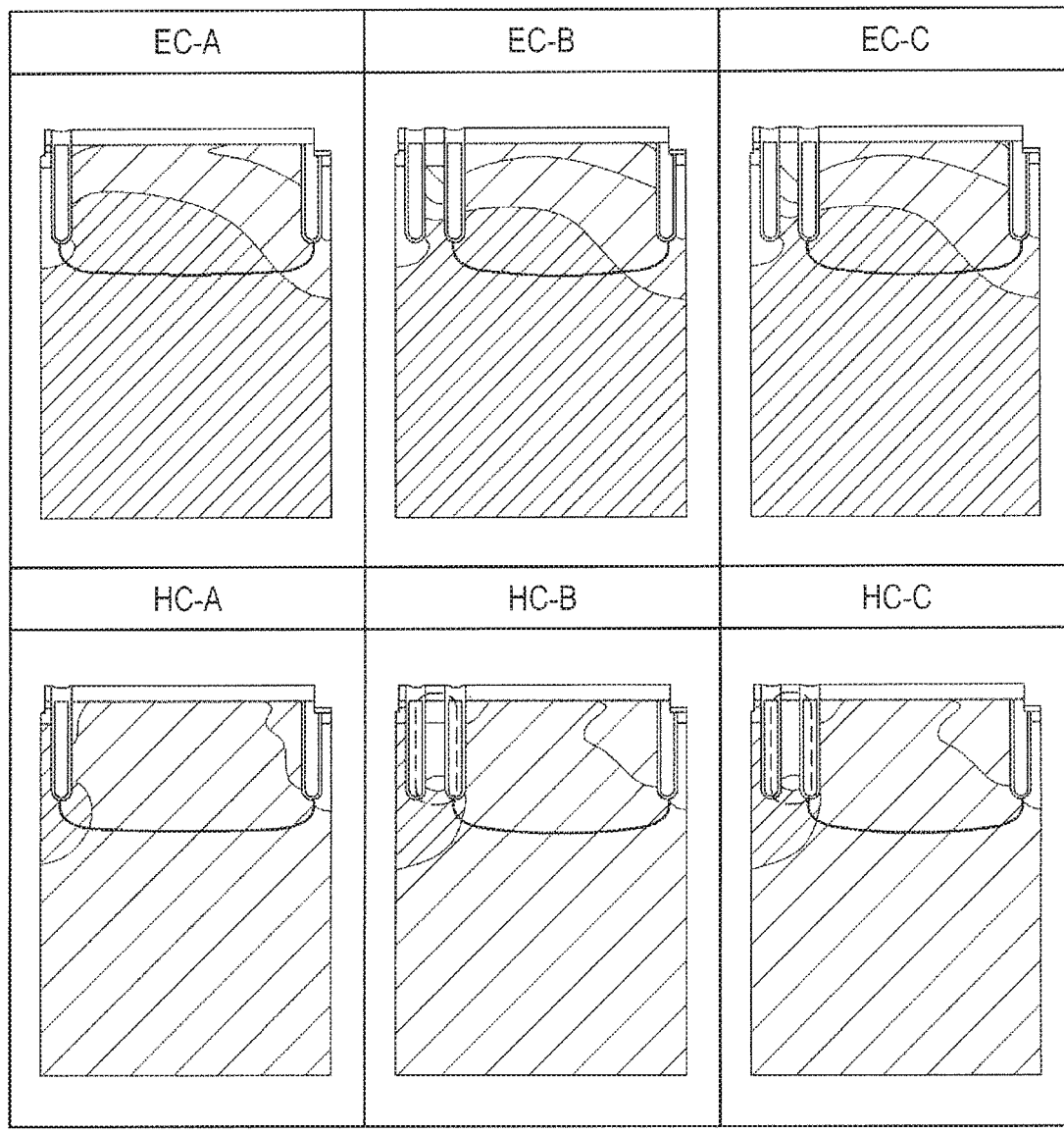
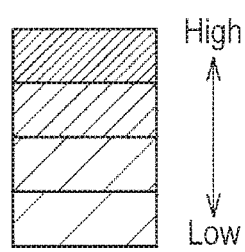

SEMICONDUCTOR DEVICE AND METHOD OF MANUFACTURING THE SAME

CROSS-REFERENCE TO RELATED APPLICATIONS

This application is a Divisional of U.S. patent application Ser. No. 16/020,181 filed on Jun. 27, 2018, which claims the benefit of Japanese Patent Application No. 2017-145400 filed on Jul. 27, 2017 including the specification, drawings and abstract are incorporated herein by reference in their entirety.

BACKGROUND

The present disclosure relates to a semiconductor device, and is applicable to an injection enhancement (IE)-type trench insulated gate bipolar transistor (IGBT).

A trench gate IGBT is widely used as an IGBT having a low collector to emitter saturation voltage VCE(sat), and the IE-type trench gate IGBT using the IE effect is developed to further promote conductivity modulation. Such an IE-type trench gate IGBT includes one IGBT having a structure, in which active cells actually coupled to an emitter electrode and inactive cells each having a floating P body region are alternately arranged in a cell region, thereby holes are easily stored on a main device surface side (emitter side) of a semiconductor substrate (for example, Japanese Unexamined Patent Application Publication Nos. 2012-256839 and 2013-140885). In this type of IE-type trench gate IGBT, an inactive cell region prevents holes injected from a collector side from escaping to an emitter side, thereby hole concentration increases between an active cell region and a collector side. Such increased hole concentration promotes electron injection from an emitter (source) side, so that electron concentration is also increased. Such increased carrier concentration (IE effect) causes conductivity modulation, allowing VCE(sat) to be reduced.

SUMMARY

A semiconductor device including the IE-type trench gate IGBT requires to be improved in the IE effect in order to more reduce the collector to emitter saturation voltage VCE(sat). Other objects and novel features will be clarified from the description of this specification and the accompanying drawings.

A typical semiconductor device of the disclosure is briefly summarized as follows. Specifically, the semiconductor device includes a trench gate electrode or a trench emitter electrode between an active cell region and an inactive cell region such that the trench gate electrode and the trench emitter electrode are provided across the inactive cell region.

According to the above-described semiconductor device, the IE effect can be further improved.

BRIEF DESCRIPTION OF THE DRAWINGS

FIG. 35 is a view to explain an electron current and a hole current.

FIG. 47 is a view to explain field strength distribution of the semiconductor device of the fifth modification.

FIG. 49 is a view to explain current density of the semiconductor device of the fifth modification.

DETAILED DESCRIPTION

Hereinafter, comparative examples, an embodiment, Example, modifications, and an application are described with reference to drawings. In the following description, the same components are designated by the same numeral, and duplicated description may be omitted. Although the drawings may schematically show width, thickness, a shape, and the like of each part to more clarify the description, such depiction is merely made as an example, and does not limit the interpretation of the present invention.

Comparative Examples

The IE-type trench gate IGBT includes a GG (configured by a gate potential coupled trench and a gate potential coupled trench)-type IGBT having a trench gate electrode between an active cell region and an inactive cell region, and an EGE (configured by an emitter potential coupled trench, a gate potential coupled trench, and an emitter potential coupled trench)-type IGBT having a trench emitter electrode between an active cell region and an inactive cell region and a trench gate electrode between the trench emitter electrodes in the active cell region. The inventors of this application have investigated a GG-type IGBT (first comparative example) and an EGE-type IGBT (second comparative example). Results of such investigation are described below.

Figure 1:
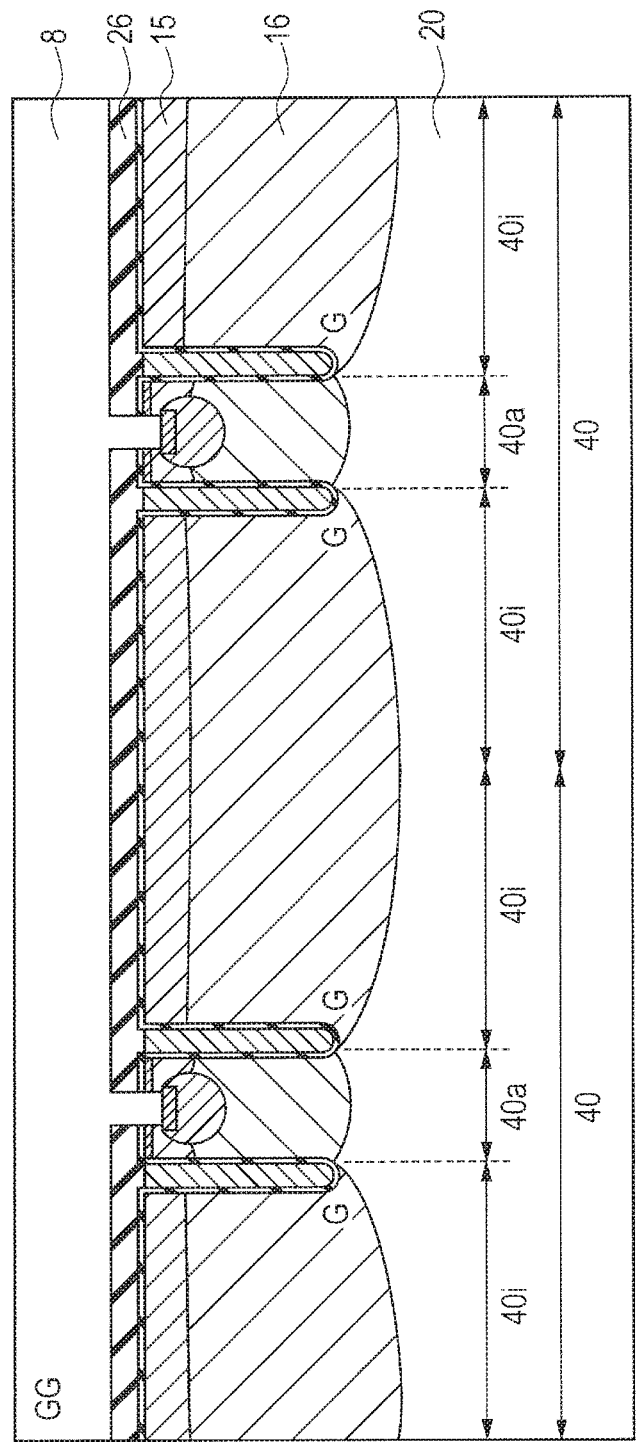
FIG. 1 illustrates a GG-type IGBT.
Figure 2:
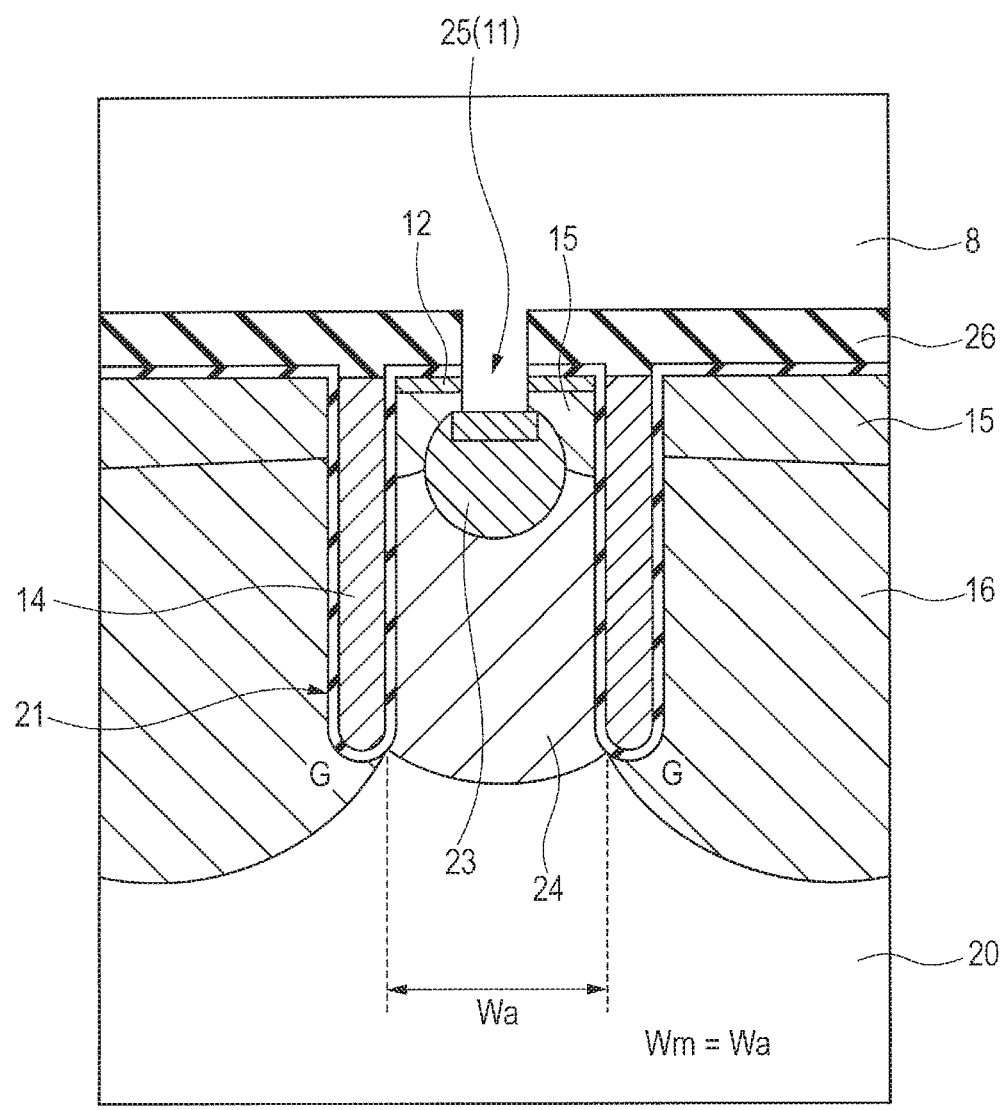
FIG. 2 illustrates the GG-type IGBT.
Figure 3:
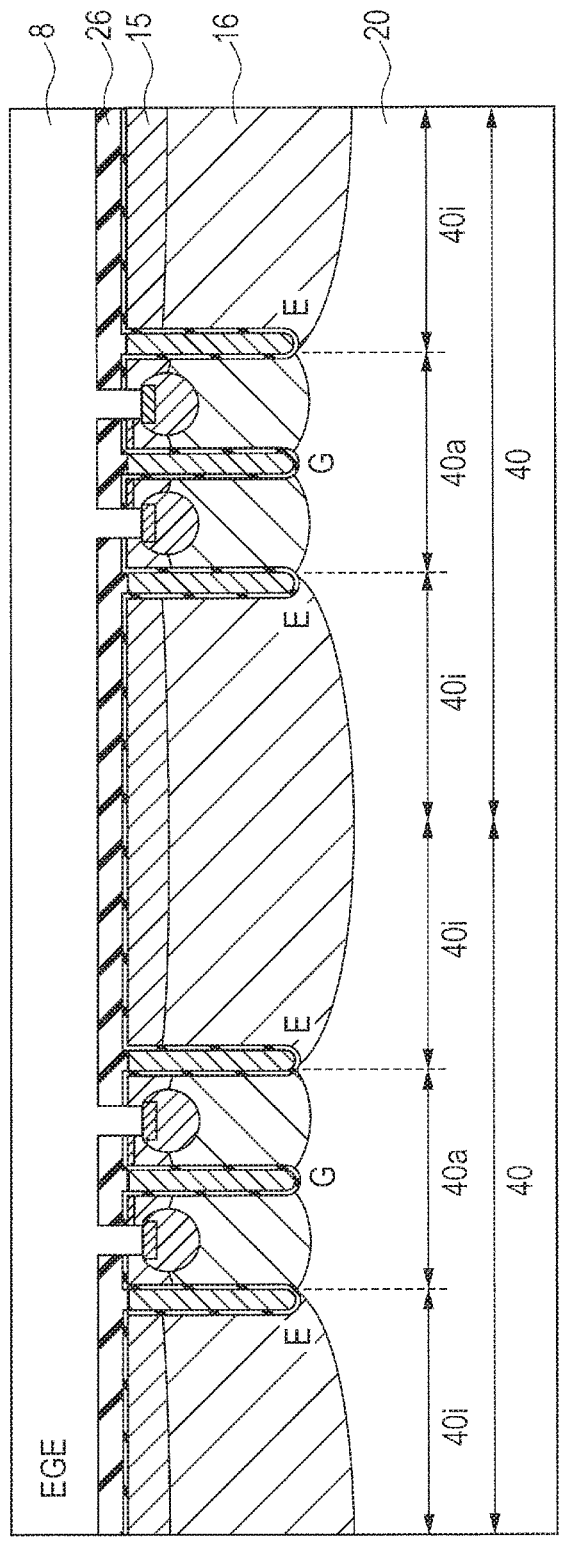
FIG. 3 illustrates an EGE-type IGBT.
Figure 4:
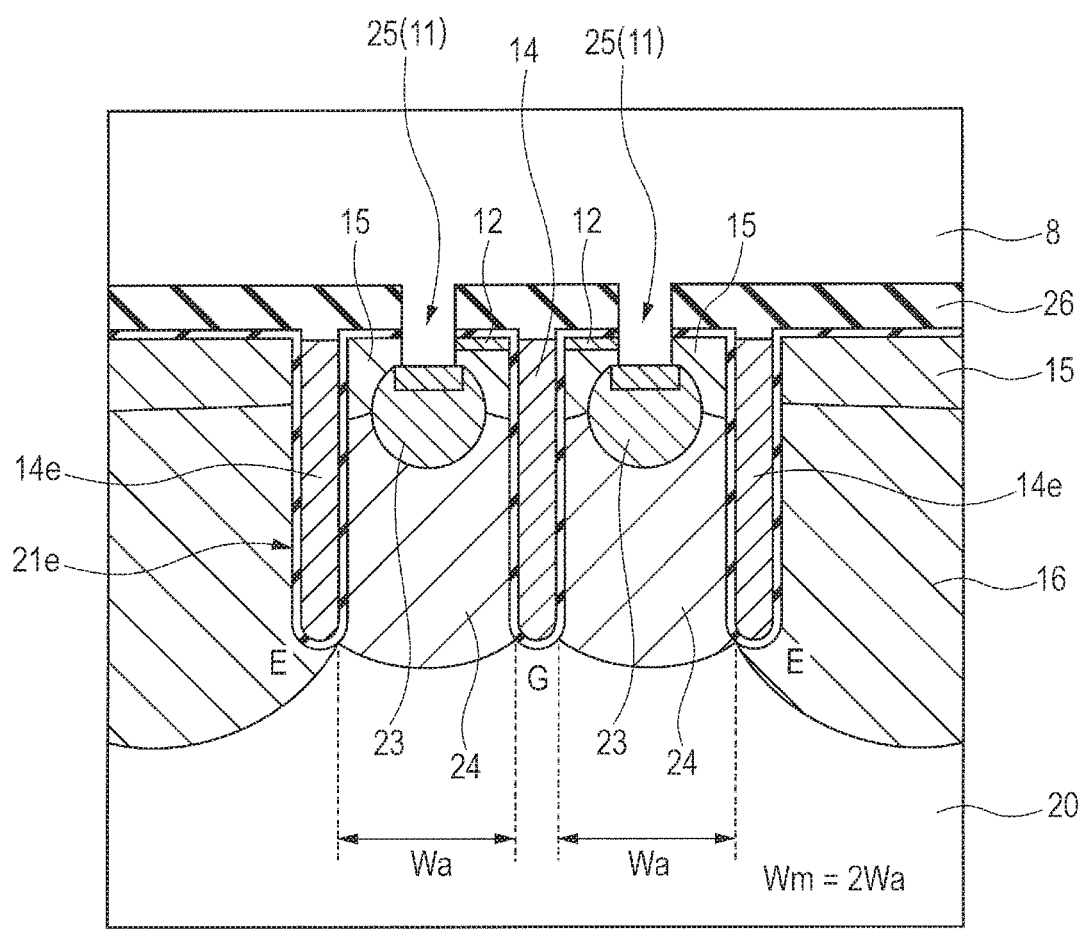
FIG. 4 illustrates the EGE-type IGBT.

Semiconductor devices of the comparative examples are now described with reference to FIGS. 1 to 4. FIG. 1 is a sectional view of a GG-type IGBT. FIG. 2 is a major-part enlarged view of FIG. 1. FIG. 3 is a sectional view of an EGE-type IGBT. FIG. 4 is a major-part enlarged view of FIG. 2.

As shown in FIG. 1, a unit cell region 40 of the GG-type IGBT has an active cell region 40a and an inactive cell region 40i. A trench gate electrode 14 is disposed between the active cell region 40a and the inactive cell region 40i.

As shown in FIG. 2, an n-type hole barrier region 24, a p-type body region 15, and an n$^+$-type emitter region 12 are provided in order from the lower side on an n$^-$-type drift region 20 configuring a major part of a semiconductor substrate in the active cell region 40a. An interlayer insulating film 26 is formed over the trench gate electrode 14, the p-type body region 15, and the n$^+$-type emitter region 12, a contact trench 11 running to the inside of the semiconductor substrate is formed in a portion of the interlayer insulating film 26 in the active cell region 40a, and a p$^+$-type body contact region 25 and a p$^+$-type latch-up prevention region 23 are provided from the upper side in the semiconductor region under the bottom of the contact trench 11. The p-type body region 15 and the n$^+$-type emitter region 12 are coupled to a metal emitter electrode 8 provided over the interlayer insulating film 26 via the contact trench 11 and the like.

The n-type hole barrier region 24 is a barrier region to prevent holes from flowing into a path to the n$^+$-type emitter region 12 from the n$^-$-type drift region 20, and has an impurity concentration lower than that of the n$^+$-type emitter region 12 and higher than that of the n$^-$-type drift region 20. The n-type hole barrier region 24 makes it possible to effectively prevent holes stored in the inactive cell region 40i from entering an emitter path (path from the n$^-$-type drift region 20 to the p$^+$-type body contact region 25) in the active cell region 40a.

On the other hand, a p-type floating region 16 and the p-type body region 15 are provided in order from the lower side in the n$^-$-type drift region 20 in the inactive cell region 40i, and the p-type floating region 16 has a depth deeper than the depth of the trench 21 and is distributed so as to cover the lower end of the trench 21.

As shown in FIG. 3, a unit cell region 40 of the EGE-type IGBT has an active cell region 40a and an inactive cell region 40i. A trench emitter electrode 14e is disposed between the active cell region 40a and the inactive cell region 40i, and a trench gate electrode 14 is disposed in the middle of the active cell region 40a.

As shown in FIG. 4, an n-type hole barrier region 24, a p-type body region 15, and an n$^+$-type emitter region 12 are provided in order from the lower side on an n$^-$-type drift region 20 in the active cell region 40a. The n$^+$-type emitter region 12 is provided only on a side close to the trench gate electrode 14. An interlayer insulating film 26 is formed over the trench gate electrode 14, the trench emitter electrode 14e, the p-type body region 15, and the n$^+$-type emitter region 12, and a contact trench 11 running to the inside of the semiconductor substrate between the trench gate electrode 14 and the trench emitter electrode 14e is formed in a portion of the interlayer insulating film 26 in the active cell region 40a. A p$^+$-type body contact region 25 and a p$^+$-type latch-up prevention region 23 are provided from the upper side in the semiconductor region under the bottom of the contact trench 11. The p-type body region 15 and the n$^+$-type emitter region 12 are coupled to a metal emitter electrode 8 provided over the interlayer insulating film 26 via the contact trench 11 and the like.

The n-type hole barrier region 24 is a barrier region to prevent holes from flowing into a path to the n$^+$-type emitter region 12 from the n$^-$-type drift region 20, and has an impurity concentration lower than that of the n$^+$-type emitter region 12 and higher than that of the n$^-$-type drift region 20. The n-type hole barrier region 24 makes it possible to effectively prevent holes stored in the inactive cell region 40$i$ from entering an emitter path (path from the n$^-$-type drift region 20 to the p$^+$-type body contact region 25) in the active cell region 40$a$.

On the other hand, a p-type floating region 16 and the p-type body region 15 are provided in order from the lower side in the n$^-$-type drift region 20 in the inactive cell region 40$i$, and the p-type floating region 16 has a depth deeper than the depth of the trench 21 and is distributed so as to cover the lower end of the trench 21.

Figure 5:
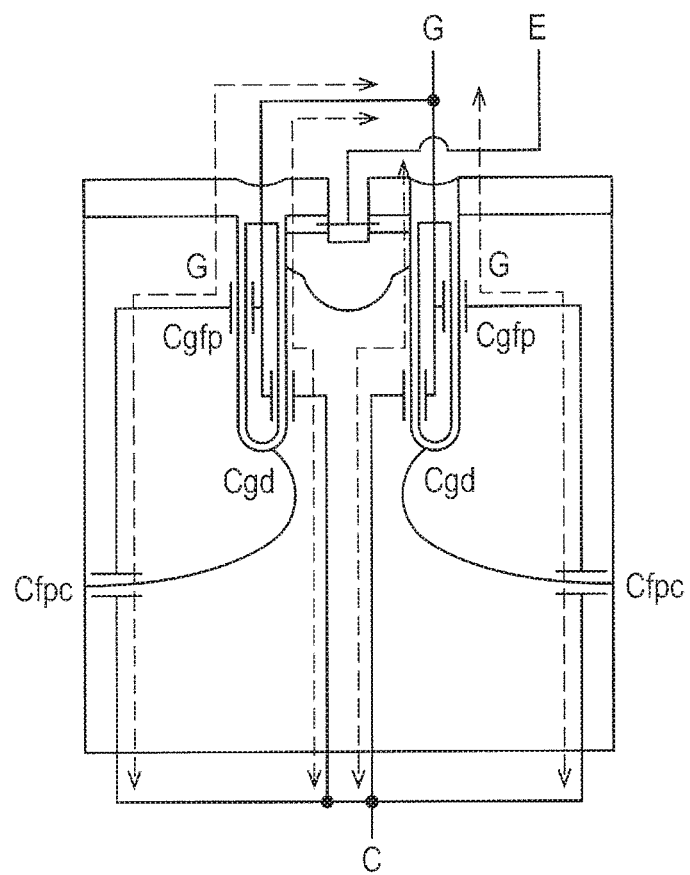
FIG. 5 illustrates a displacement current path of the GG-type IGBT.
Figure 6:
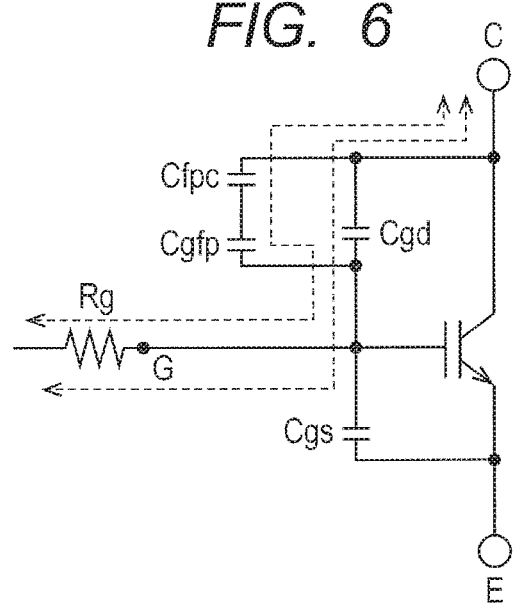
FIG. 6 illustrates the displacement current path of the GG-type IGBT.
Figure 7A:
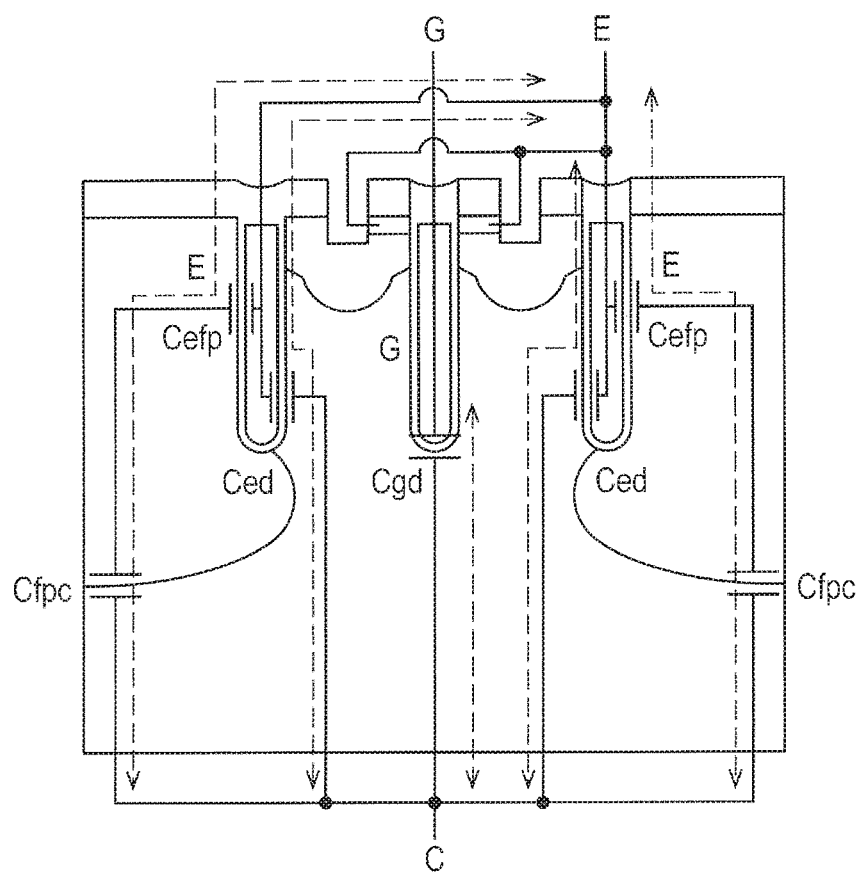
FIG. 7A illustrates a displacement current path of the EGE-type IGBT.
Figure 7B:
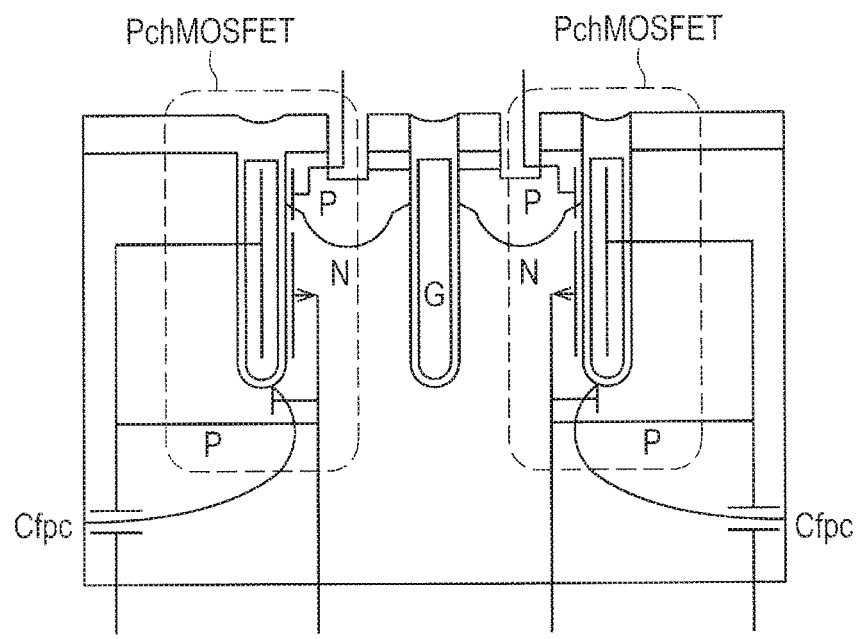
FIG. 7B illustrates a parasitic P channel-type MOSFET of the EGE-type IGBT.
Figure 8:
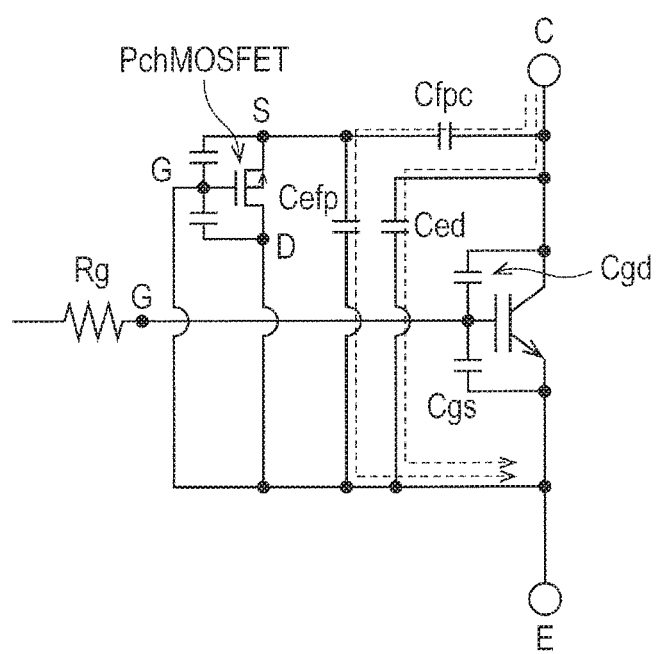
FIG. 8 illustrates the displacement current path and the parasitic P channel-type MOSFET of the EGE-type IGBT.

Generation of displacement current to the gate is now described with reference to FIGS. 5 to 8. FIG. 5 is a sectional view illustrating a displacement current path of the GG-type IGBT. FIG. 6 is an equivalent circuit diagram of the displacement current path. FIG. 7A is a sectional view illustrating a displacement current path of the EGE-type IGBT. FIG. 8 is an equivalent circuit diagram of the displacement current path.

In the following description, switching operation of the IGBT from an off state (isolation state) to an on state is referred to as "turn-on", and switching operation of the IGBT from the on state to the off state (isolation state) is referred to as "turn-off". Loss at turn-on is referred to as "turn-on loss", loss during the on state is referred to as "conduction loss", and loss at turn-off is referred to as "turn-off loss"

In the GG-type IGBT, electric potential varies in the p-type floating region due to a collector voltage variation at L load switching, and gate potential oscillates by influence of such a potential variation.

At the L load switching, a displacement current (Idis=(±) dvc/dt×C, where C is a capacitance of a gate oxide film) is generated with a variation in collector voltage so as to flow to a gate via a parasitic capacitance. A voltage other than the gate control voltage is generated according to Idis×L (R), where L is inductance of, for example, interconnections and R is gate resistance, and disadvantageously causes oscillation, a reduction in breaking tolerance, and the like. For example, at turn-off, gate potential is maintained constant even after Qdg discharge by influence of such voltage generation, which increases switching turn-off loss (Eoff). At turn-on, a voltage generated by the displacement current is superimposed on the gate and thus a serge voltage is generated, causing a reduction in stability of switching in parallel coupling, oscillation, breaking, and the like.

As shown in FIGS. 5 and 6, a displacement current flows into the gate via a parasitic capacitance of Cgd (Cres) or a parasitic capacitance of Cfpc and Cgfp as a displacement current path of the GG-type IGBT. In contrast to the GG-type IGBT, the EGE-type IGBT shown in FIG. 3 has a structure capable of suppressing the influence of such a displacement current. As shown in FIGS. 7A and 8, in the EGE-type IGBT, a displacement current via the floating layer can be cut off by a trench having an emitter potential, and Cgd (Cres) can be reduced structurally, resulting in a reduction in influence of the displacement current on the gate.

However, as shown in FIGS. 3 and 4, in the EGE-type IGBT, a mesa width (trench to trench distance) as a hole bypass is large compared with the GG-type IGBT, and thus the IE effect is reduced. As shown in FIG. 7B, a parasitic p channel-type MOSFET (PchMOSFET) is formed in the EGE-type IGBT. The parasitic p channel-type MOSFET disadvantageously discharges holes even at turn-on and during the on state (during conduction), leading to a reduction in the IE effect. The parasitic p channel-type MOSFET may be formed in any IGBT other than the EGE-type IGBT, which includes a p-type floating region, an emitter potential trench (trench emitter electrode), an n-type hole barrier region, and a p$^+$-type latch-up prevention region (p$^+$-type body contact region, p-type body region).

Although decreasing a pitch of the mesa width is necessary to improve the IE effect for improvement in performance, such improvement in performance is limited due to a limitation in processing accuracy. This is a problem common to all the IE-type trench IGBTs such as the GG-type IGBT and the EGE-type IGBT.

In addition, in the GG-type IGBT, carriers stored during switching-on cannot be fully extracted at turn-off due to decreasing the mesa width pitch, resulting in a significant increase in switching-off loss (Eoff).

As described above, in the GG-type IGBT, although the IE effect is secured in some degree, the displacement current greatly affects the gate, so that switching stability is bad. In the EGE-type IGBT, although switching stability is improved, the IE effect is reduced.

Subsequently, necessity of the p-type floating region is described. Forming the p-type floating region two-dimensionally narrows a carrier (hole) discharge path during conduction, which increases resistance (hole limiting factor) against carriers. A higher hole limiting factor increases the carrier storage amount, which reduces conduction loss.

Embodiment

A semiconductor device of an embodiment includes a trench gate electrode or a trench emitter electrode between an active cell region and an inactive cell region. The trench gate electrode and the trench emitter electrode are provided across the inactive cell region.

The semiconductor device of the embodiment is an IE-type trench gate IGBT, which is a GE (configured by agate potential coupled trench and an emitter potential coupled trench)-type IGBT including the trench gate electrode or the trench emitter electrode between the active cell region and the inactive cell region. Since the active cell region is narrower than that of the GG-type IGBT, the IGBT is hereinafter referred to as GE-S (configured by a gate potential coupled trench and an emitter potential coupled trench (shrink type))-type IGBT.

Figure 9:
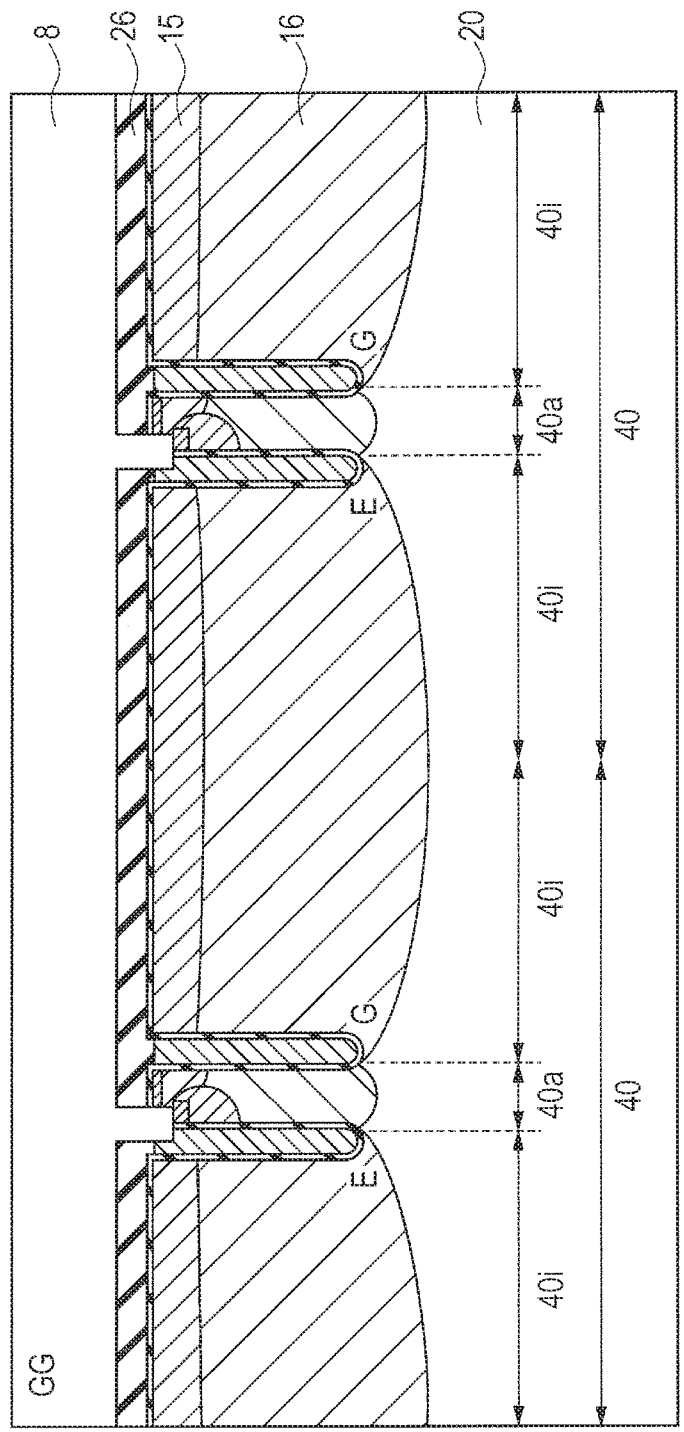
FIG. 9 illustrates a GE-S-type IGBT.
Figure 10:
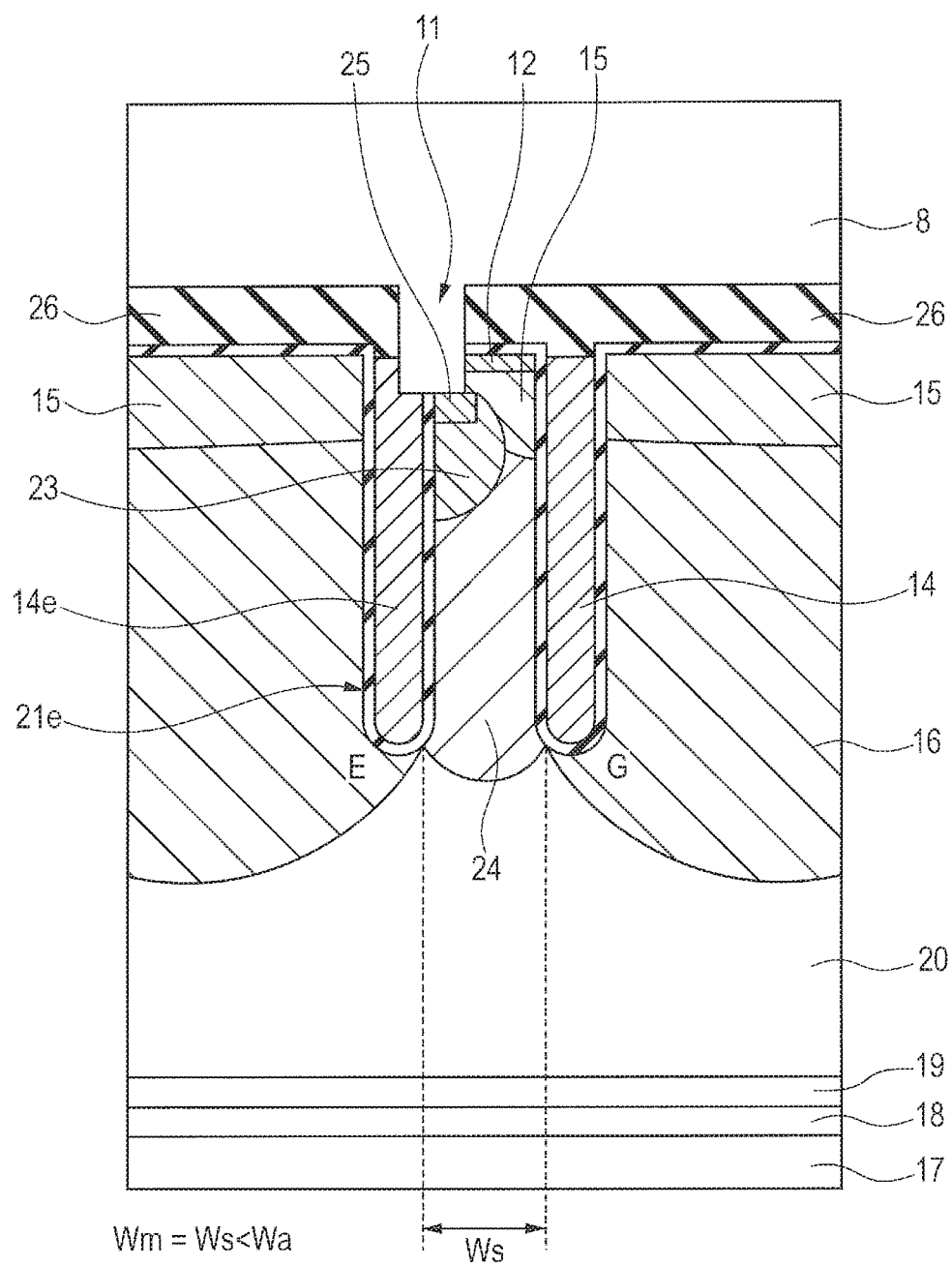
FIG. 10 illustrates the GE-S-type IGBT.

FIG. 9 is a sectional view of the GE-S-type IGBT. FIG. 10 is a major-part enlarged view of FIG. 9.

As shown in FIG. 9, a unit cell region 40 of the GE-S-type IGBT has an active cell region 40$a$ and an inactive cell region 40$i$. A trench gate electrode 14 and a trench emitter electrode 14$e$ are disposed between the active cell region 40$a$ and the inactive cell region 40$i$.

As shown in FIG. 10, a p$^+$-type collector region 18 is provided in a semiconductor region on a back of a semiconductor chip, and a metal collector electrode 17 is provided on the surface of the p$^+$-type collector region 18. An n-type field stop region 19 is provided between an n$^-$-type drift region 20 configuring a major part of a semiconductor substrate and the p$^+$-type collector region 18. An n-type hole barrier region 24, a p-type body region 15, and an n$^+$-type emitter region 12 are provided in order from the lower side on the n$^-$-type drift region 20 in the active cell region 40$a$. The n$^+$-type emitter region 12 is provided only on a side close to the trench gate electrode 14. An interlayer insulating film 26 is formed over the trench gate electrode 14, the trench emitter electrode 14$e$, the p-type body region 15, and the n⁺-type emitter region 12, and the trench emitter electrode 14e and a contact trench 11 running to the inside of the semiconductor substrate are formed in a portion of the interlayer insulating film 26 in the active cell region 40a. A p⁺-type body contact region 25 and a p⁺-type latch-up prevention region 23 are provided from the upper side in the semiconductor region under the bottom of the contact trench 11. The p-type body region 15 and the n⁺-type emitter region 12 are coupled to a metal emitter electrode 8, which is provided over the interlayer insulating film 26, via the contact trench 11 and the like.

The n-type hole barrier region 24 is a barrier region to prevent holes from flowing into a path to the n⁺-type emitter region 12 from the n⁻-type drift region 20, and has an impurity concentration lower than that of the n⁺-type emitter region 12 and higher than that of the n⁻-type drift region 20. The n-type hole barrier region 24 makes it possible to effectively prevent holes stored in the inactive cell region 40i from entering an emitter path (path from the n⁻-type drift region 20 to the p⁺-type body contact region 25) in the active cell region 40a.

On the other hand, a p-type floating region 16 and the p-type body region 15 are provided in order from the lower side in the n⁻-type drift region 20 in the inactive cell region 40i. The p-type floating region 16 has a depth deeper than the depth of the trench 21 and is distributed so as to cover the lower end of the trench 21.

Figure 11:
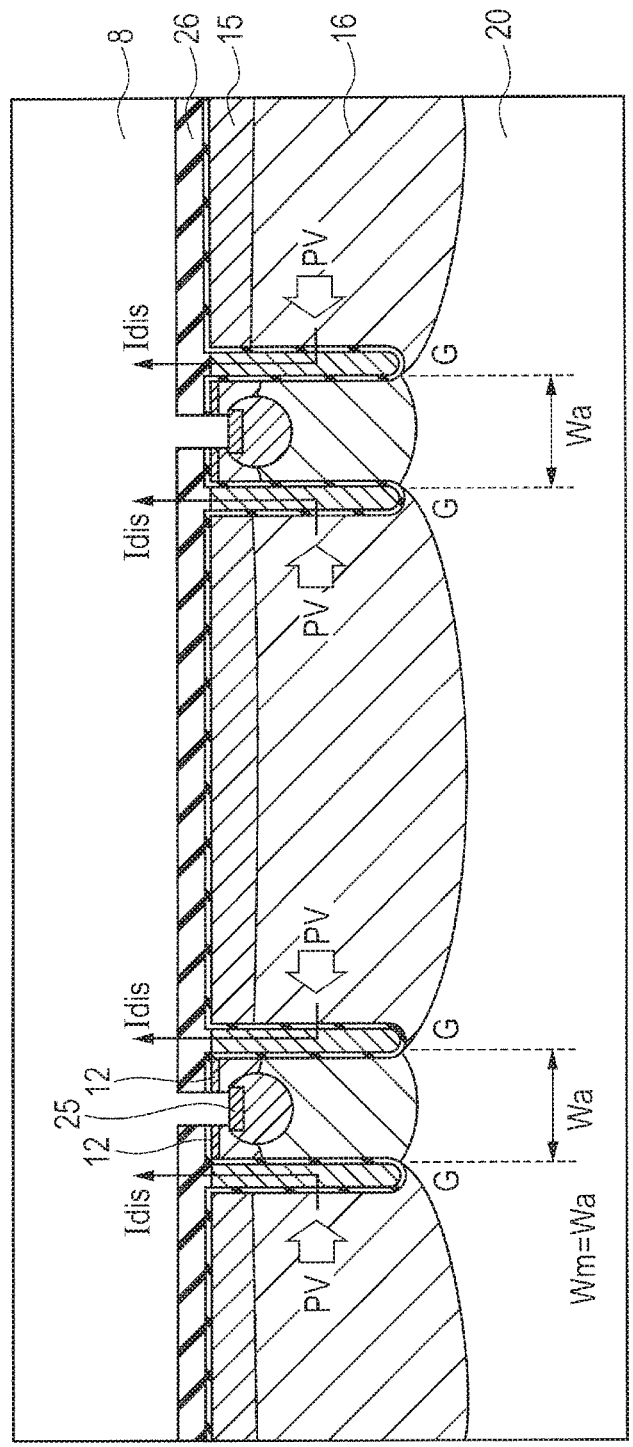
FIG. 11 illustrates a problem of the GG-type IGBT.
Figure 12:
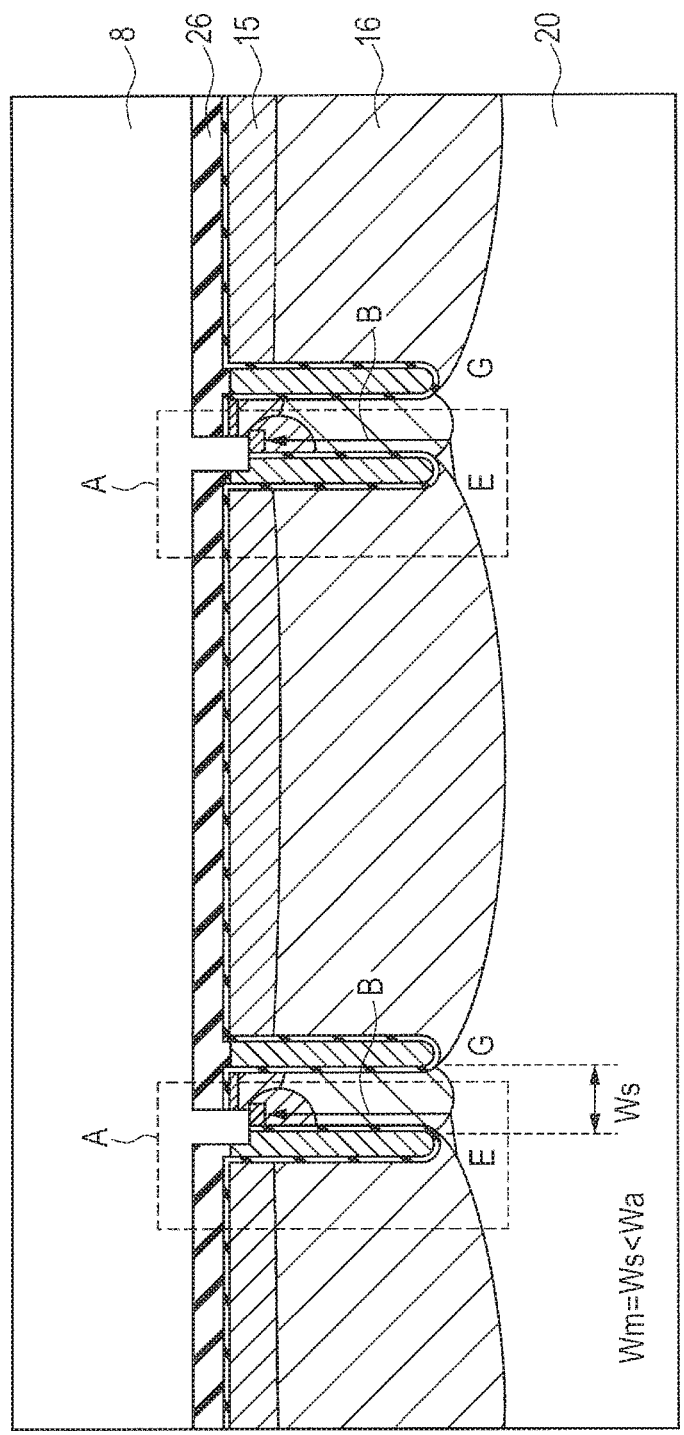
FIG. 12 illustrates the GE-S-type IGBT.

The IE effect of the GE-S-type IGBT is described with reference to FIGS. 11 and 12 in comparison with the GG-type IGBT. FIG. 11 is a sectional view of the GG-type IGBT. FIG. 12 is a sectional view of the GE-S-type IGBT.

As shown in FIG. 11, in the GG-type IGBT, the n⁺-type emitter regions 12 are formed on both sides of the p⁺-type body contact region 25; hence, decreasing the pitch of the mesa width (Wm) has a limit in processing accuracy.

On the other hand, in the GE-S-type IGBT, the n⁺-type emitter region 12 is formed on one side, making it possible to decrease a pitch of the mesa width (Wm) as shown in FIG. 12. A distance (Ws) between the trench gate electrode 14 and the trench emitter electrode 14e is reduced to decrease the pitch of the mesa width, thereby resistance (hole limiting factor) against holes is increased, which improves a hole storage effect and thus allows the IE effect to be improved.

In the GG-type IGBT, as the distance between the trench gate electrodes is reduced, hole extraction at turn-off is reduced, and turn-off loss is abruptly increased. On the other hand, in the GE-S-type IGBT, as shown in FIG. 12, a parasitic p channel-type MOSFET is formed on one side (in a portion of the broken line A), thereby even if a pitch of the mesa width is decreased, carriers stored during conduction can be effectively extracted at turn-off, making it possible to improve the IE effect while suppressing an increase in turn-off loss.

In the GG-type IGBT, as shown in FIG. 11, a displacement current (Idis) flows to the gate due to a potential variation PV of the p-type floating region 16, and gate potential oscillation occurs by the influence of interconnection inductance and the like. On the other hand, in the GE-S-type IGBT, one electrode (trench emitter electrode 14e) of the trench electrodes in contact with the p-type floating region 16 is coupled to the emitter potential. This results in formation of the parasitic p channel-type MOSFET in a portion of the broken line A in FIG. 12, and holes are discharged via the parasitic p channel-type MOSFET (through a route of an arrow B), thereby a potential variation in the p-type floating region 16 can be suppressed. This makes it possible to suppress generation of the displacement current to the gate (influence of a variation in floating potential).

The trench electrodes sandwiching the floating region typically need to have the same potential. In the GE-S-type IGBT, however, the floating region is sandwiched by a trench electrode having a gate potential and a trench electrode having an emitter potential. Such a difficulty can be solved by a layout of an end portion of the floating region as descried later.

Figure 13:
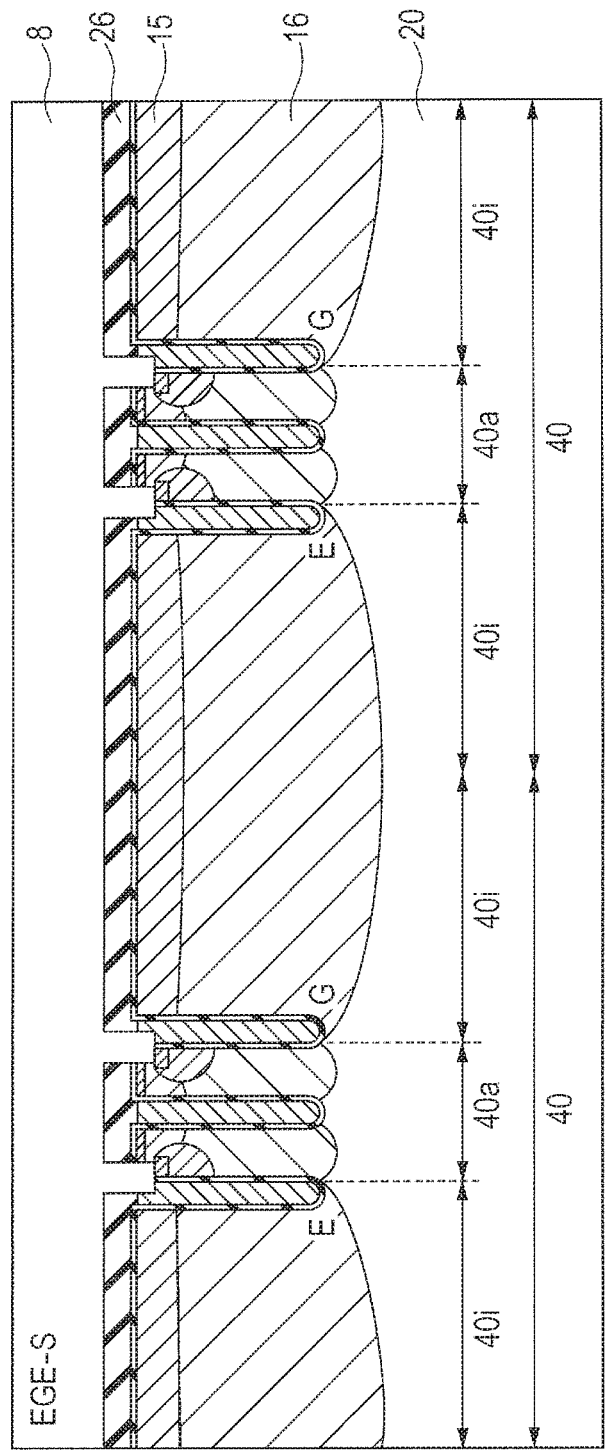
FIG. 13 illustrates an EGE-S-type IGBT.
Figure 14:
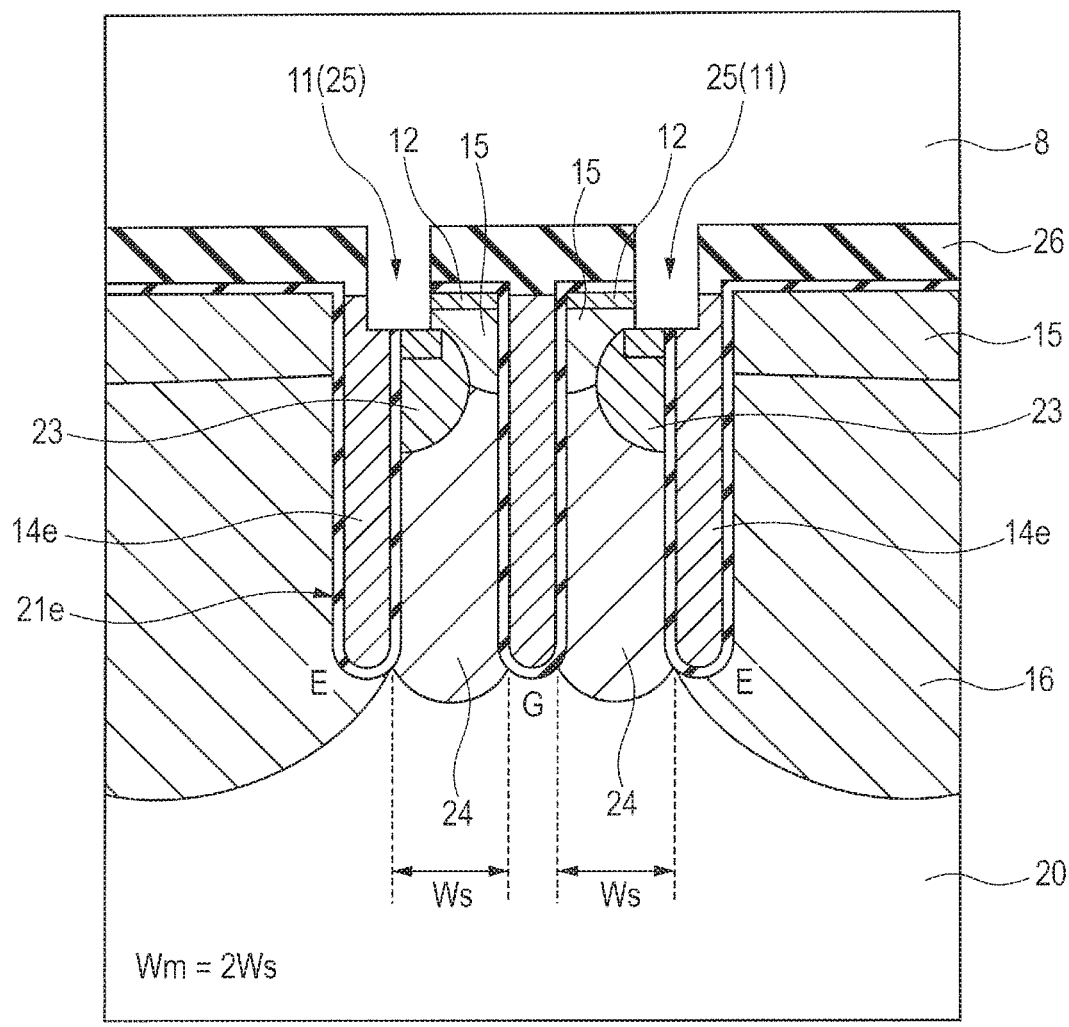
FIG. 14 illustrates the EGE-S-type IGBT.

An improvement (effect) of the GE-S-type IGBT compared with the EGE-type IGBT is now described. Since the IE effect is small in the EGE-type IGBT, the improvement is described in contrast to the EGE-S (configured by an emitter potential coupled trench, a gate potential coupled trench, and an emitter potential coupled trench (shrink type))-type IGBT according to a third comparative example that is improved in the IE effect by decreasing the mesa width pitch. FIG. 13 is a sectional view of the EGE-S-type IGBT. FIG. 14 is a major-part enlarged view of FIG. 13.

As shown in FIG. 14, in the EGE-S-type IGBT, the contact trench 11 extends to a part of the trench emitter electrode 14e as with the GE-S-type IGBT, and the sectional areas of the p-type body region 15, the p⁺-type body contact region 25, and the p⁺-type latch-up prevention region 23 are each about half the sectional area of that of the EGE type IGBT. As a result, the EGE-S-type IGBT is improved in the IE effect by decreasing the cell pitch compared with the EGE type IGBT.

(Improvement in IE Effect (1))

Figure 15:
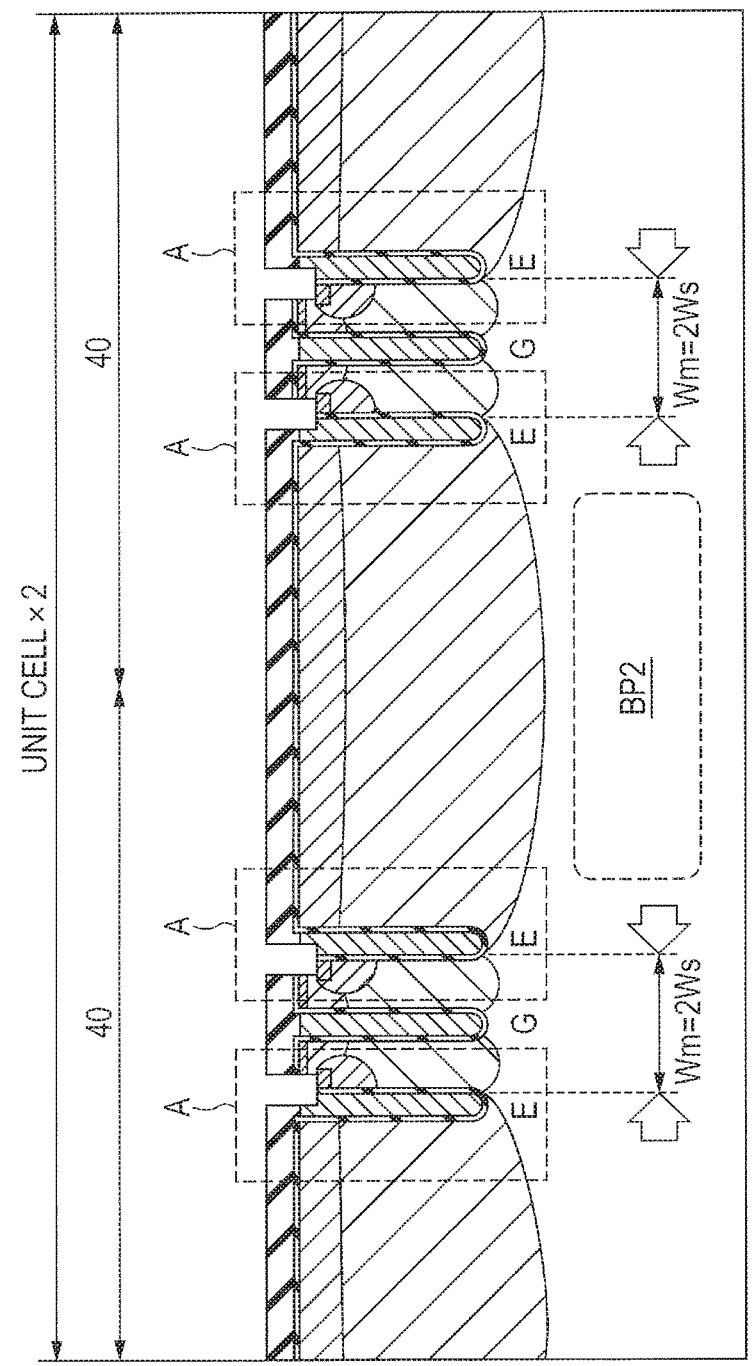
FIG. 15 illustrates the EGE-S-type IGBT.
Figure 16:
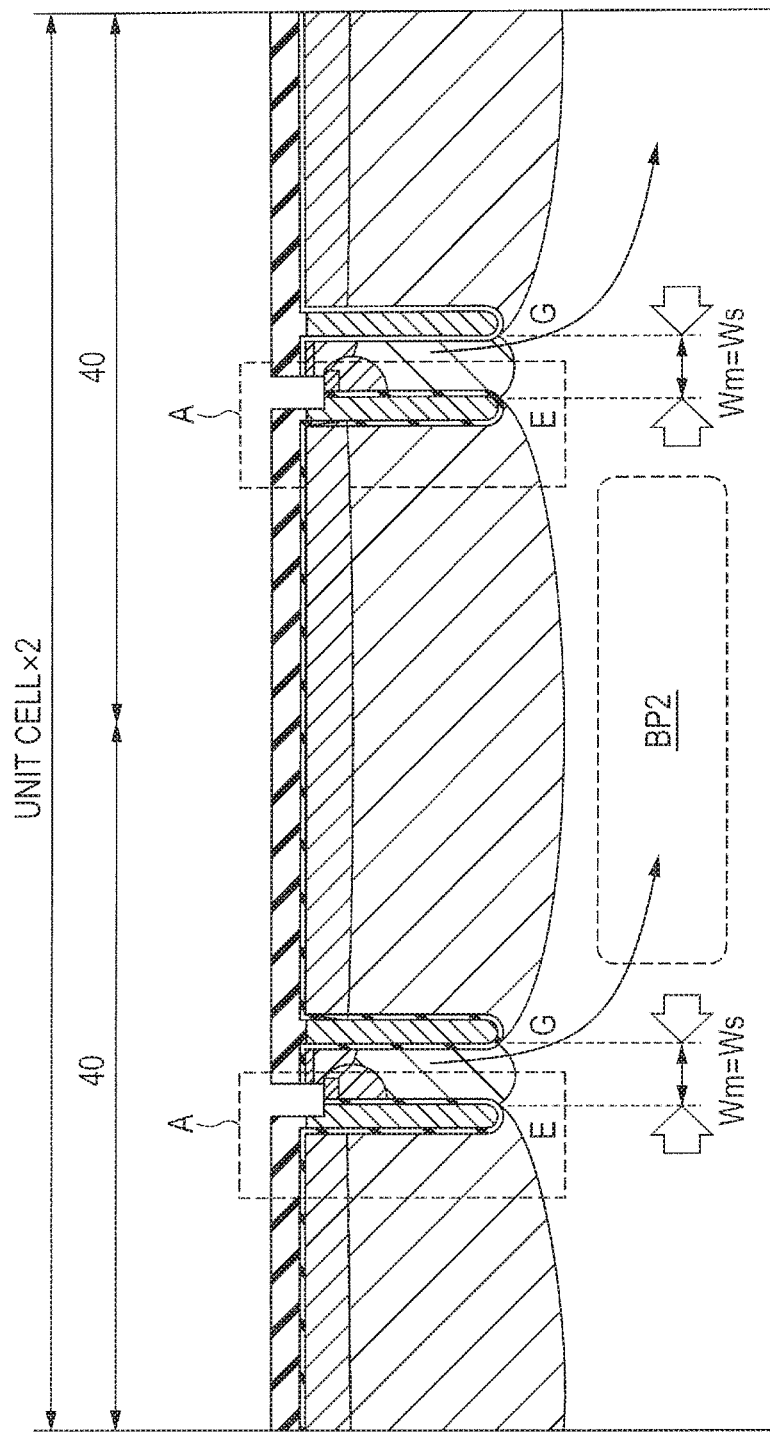
FIG. 16 illustrates the GE-S-type IGBT.

FIG. 15 shows the mesa width and the parasitic p channel-type MOSFET of the EGE-S-type IGBT. FIG. 16 shows the mesa width and the parasitic p channel-type MOSFET of the GE-S-type IGBT.

As shown in FIGS. 15 and 16, two unit cell regions (having the same width) are used for comparison. The mesa width as a bypass of holes in the GE-S-type IGBT is ½ of that of the EGE-S-type IGBT for the same unit cell region width, leading to an increase in carrier storage amount in the GE-S-type IGBT. Although the GE-S-type IGBT and the EGE-S-type IGBT have the same interval between the trench gate electrode 14 and the trench emitter electrode 14e, an interval as the hole bypass between the trench gate electrode and the trench emitter electrode is 4Ws in the EGE-S-type IGBT while being 2WS in the GE-S-type IGBT.

The number of formation of the parasitic p channel-type MOSFET (broken line A portion) is also decreased from four to two, which also suppresses hole discharge.

From such two respects, the GE-S-type IGBT can be improved in the IE effect compared with the EGE-S-type IGBT.

(Improvement in IE Effect (2))

Figure 17:
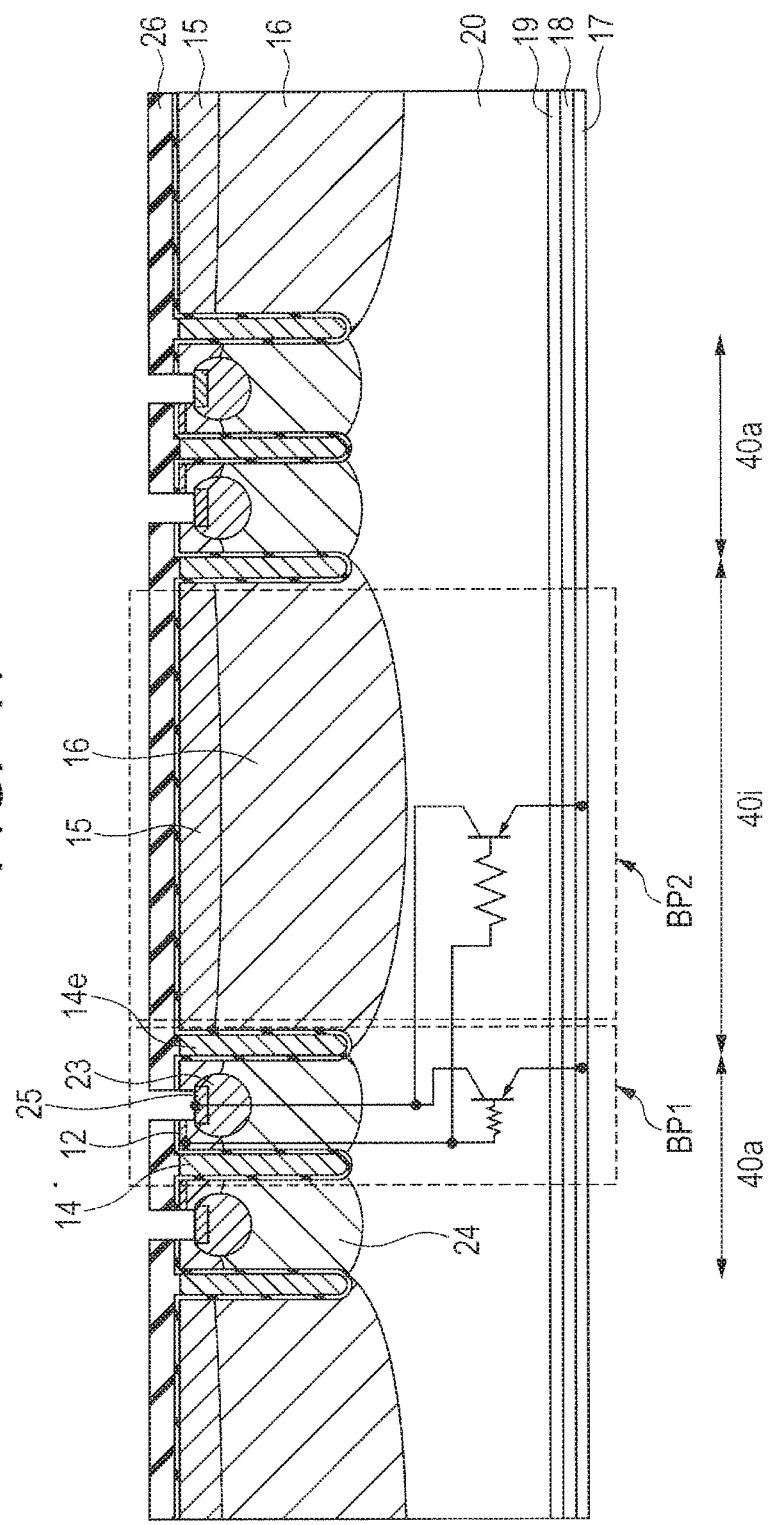
FIG. 17 illustrates a parasitic PNP bipolar transistor.

FIG. 17 illustrates a parasitic PNP bipolar transistor.

A first parasitic PNP bipolar transistor BP1 and a second parasitic PNP bipolar transistor BP2, which each operate in an on state (a state where a plus voltage (for example, +15 V) is applied to a gate so that continuity is established between a collector and an emitter, and thus VCE(sat) is generated), are formed in a cell formation region of the semiconductor device of the IE-type IGBT.

The first parasitic PNP bipolar transistor BP1 is formed in the active cell region 40a, and includes the p⁺-type collector region 18, an n-type semiconductor region (the n⁻-type drift region 20, the n-type hole barrier region 24, and the n⁺-type emitter region 12), and a p⁺-type semiconductor region (the p⁺-type body contact region 25 and the p⁺-type latch-up prevention region 23). The second parasitic PNP bipolar transistor BP2 is formed in the inactive cell region 40i, and includes the p$^+$-type collector region 18, the n-type semiconductor region (the n$^-$-type drift region 20, the n-type hole barrier region 24, and the n$^+$-type emitter region 12), and the p$^+$-type semiconductor region (the p$^+$-type body contact region 25 and the p$^+$-type latch-up prevention region 23).

Generally, concentration of carriers (holes) stored in the n$^-$-type drift region 20 is effectively increased to reduce resistance of the n$^-$-type drift region 20 in order to improve the IE effect. To achieve this, functions (activation) of the first parasitic PNP bipolar transistor BP1 and the second parasitic PNP bipolar transistor BP2 are necessary to be enhanced.

Electron supply from the n$^+$-type emitter region 12 in the on state (a plus voltage (for example, +15 V) is applied to the gate) corresponds to base current supply to the first parasitic PNP bipolar transistor BP1 and the second parasitic PNP bipolar transistor BP2. Sufficient electron supply is therefore necessary to be performed to the first parasitic PNP bipolar transistor BP1 and the second parasitic PNP bipolar transistor BP2 in order to enhance functions (activation) of both the bipolar transistors. However, a distance from the n$^+$-type emitter region 12, from which electrons are supplied, to the second parasitic PNP bipolar transistor BP2 formed in the inactive cell region 40i is longer than a distance from the n$^+$-type emitter region 12, from which electrons are supplied, to the first parasitic PNP bipolar transistor BP1 formed in the active cell region 40a. As a result, base resistance of the second parasitic PNP bipolar transistor BP2 is larger than base resistance of the first parasitic PNP bipolar transistor BP1, causing a difference in electronic current supply amount.

Hence, even if width of the p-type floating region 16 is increased to reduce the collector to emitter saturation voltage VCE(sat), a larger width of the p-type floating region 16 than a certain width reduces supply of base current (electronic current) to the second parasitic PNP bipolar transistor BP2. This weakens the function (activation) of the second parasitic PNP bipolar transistor BP2, leading to a reduction in the IE effect. As a result, the collector to emitter saturation voltage VCE(sat) is increased.

It is therefore necessary to increase the base current (electron supply from the emitter) to the parasitic PNP bipolar transistor as viewed from a collector side in order to improve the IE effect. As shown in FIG. 17, the parasitic PNP bipolar transistor can be dividedly seen between below the active cell region 40a and below the p-type floating region in the inactive cell region.

In the EGE-type IGBT (EGE-S-type IGBT), the base current supply amount to the region below the p-type floating region 16 is particularly decreased, so that the IE effect is reduced. This is because the trench having the emitter potential (trench emitter electrode 14e) hinders base current supply to below the p-type floating region 16. To describe in detail, on an electronic current path, in the GE-S-type IGBT, electrons are attracted to the trench gate electrode having a plus potential in the on state (a plus voltage (for example, +15 V) is applied to the gate), and electrons are diffused via a portion directly below the trench gate electrode, so that electron density (contributing to a base current of the parasitic PNP bipolar transistor) increases in a region below the p-type floating region. With space-charge density distribution, an oxide film bottom part of the bottom of the trench gate electrode of the GE-S-type IGBT is minus charge dominant by a plus potential of the trench gate electrode. On the other hand, in the EGE-S-type IGBT, it is confirmed that the bottom is plus charge dominant, and thus electron diffusion is hindered. As described above, the EGE-S type is reduced in base current supply capacity to the parasitic PNP bipolar transistor BP2 below the p-type floating region, so that the IE effect is reduced.

As shown in FIGS. 15 and 16, in the EGE-S-type IGBT, the trench emitter electrodes 14e having an emitter potential are in contact with both sides of the p-type floating region 16. On the other hand, the GE-S-type IGBT has a structure where the trench gate electrode 14 having a gate potential is in contact with one side of the p-type floating region 16, and thus the amount of base current supply to the region (parasitic PNP bipolar transistor BP2) below the p-type floating region 16 is increased compared with the EGE-S-type, so that the IE effect can be improved.

(Improvement in Degree of Freedom in Design (Gate Capacitance Adjustment Range))

Figure 18:
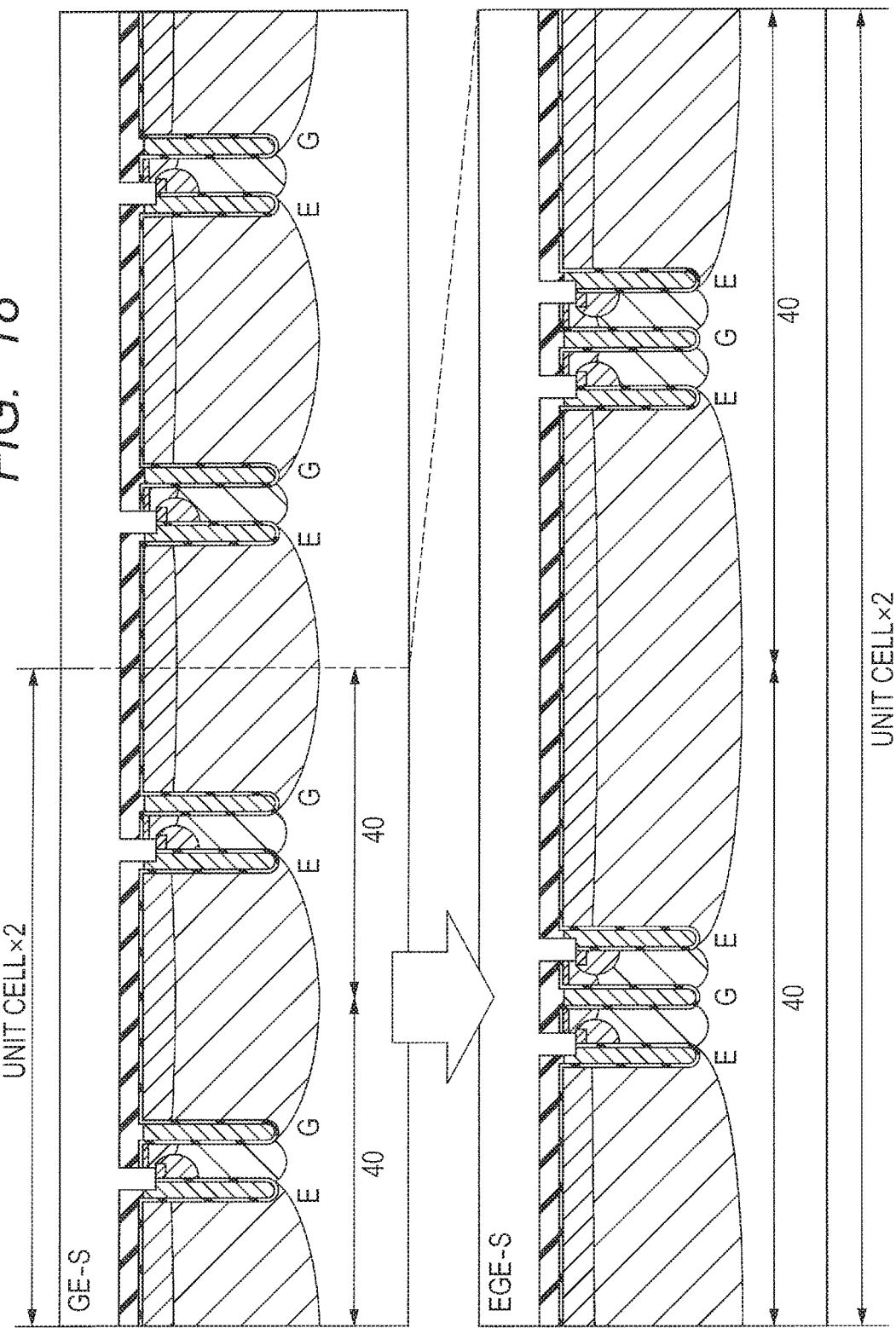
FIG. 18 illustrates the degree of freedom in design of the GE-S-type IGBT.

FIG. 18 is a view to explain the degree of freedom in design of the GE-S-type IGBT. The GE-S-type IGBT and the EGE-S-type IGBT of FIG. 18 have the same hole limiting factor.

The gate capacitance is necessary to be adjusted to be small for high-speed switching, but large for improvement in stability. A requirement for IGBT varies depending on applications of the IGBT, and thus a base structure of the IGBT requires to have a wide adjustable range of the gate capacitance. In the structure of the EGE-type IGBT, gate capacitance is small, which disadvantageously causes an insufficient dumping capacitance to suppress resonance (oscillation) in an interconnection loop formed when chips are coupled in parallel. However, when width of the p-type floating region is reduced to increase density of the active cell region in order to secure a gate capacitance, the IE effect is reduced, causing an increase in loss. As a result, the gate capacitance cannot be increased. This means a narrow gate adjustment range, i.e., a low degree of freedom in design.

The EGE-S-type IGBT is improved in the degree of freedom in design compared with the EGE-type IGBT. As shown in FIG. 18, the GE-S-type IGBT can be further improved in the degree of freedom in design compared with the EGE-S-type IGBT. For example, when the width of the p-type floating region is set for the same IE effect, the gate capacitance can be doubled in the GE-S-type IGBT. For the same hole limiting factor, the gate capacitance of the GE-S-type IGBT can be adjusted up to twice the gate capacitance of the EGE-S-type IGBT. The EGE-S-type IGBT requires width of the p-type floating region twice as large as that of the GE-S-type IGBT to have the same hole limiting factor, resulting in small gate capacitance per chip area. In other words, the adjustment range of the gate capacitance is expanded in the GE-S-type IGBT. The IE effect is remarkably improved in the GE-S-type IGBT compared with the EGE-S-type IGBT for the same width of the p-type floating region.

(Others)

In the GE-S-type IGBT, as shown in FIG. 16, since the parasitic p channel-type MOSFET is formed on one side, the parasitic p channel-type MOSFET is provided for any of the p-type floating regions 16, making it possible to suppress a potential variation in the p-type floating region 16.

This allows stable operation (suppression of gate potential oscillation), high break tolerance (suppression of break caused by local current concentration due to uneven operation in a chip plane), elimination of influence on switching loss, and adaptation to parallel coupling operation (suppression of uneven operation between chips).

(Verification of Effects of Improvement in Performance)

Improvement in performance of the GE-S-type IGBT structure is described using a technology computer-aided design (TOAD) tool.

Since the EGE-S-type IGBT has a highest performance (low VCE(sat)) among the comparative examples (performance is higher in EGE-S-type IGBT than in GG-type IGBT), the GE-S-type IGBT is compared with the EGE-S-type IGBT. Since saturation current varies in two-dimensional simulation (2D), TCAD computation is performed as three-dimensional simulation (3D) to adjust the saturation current for performance verification.

Figure 19:
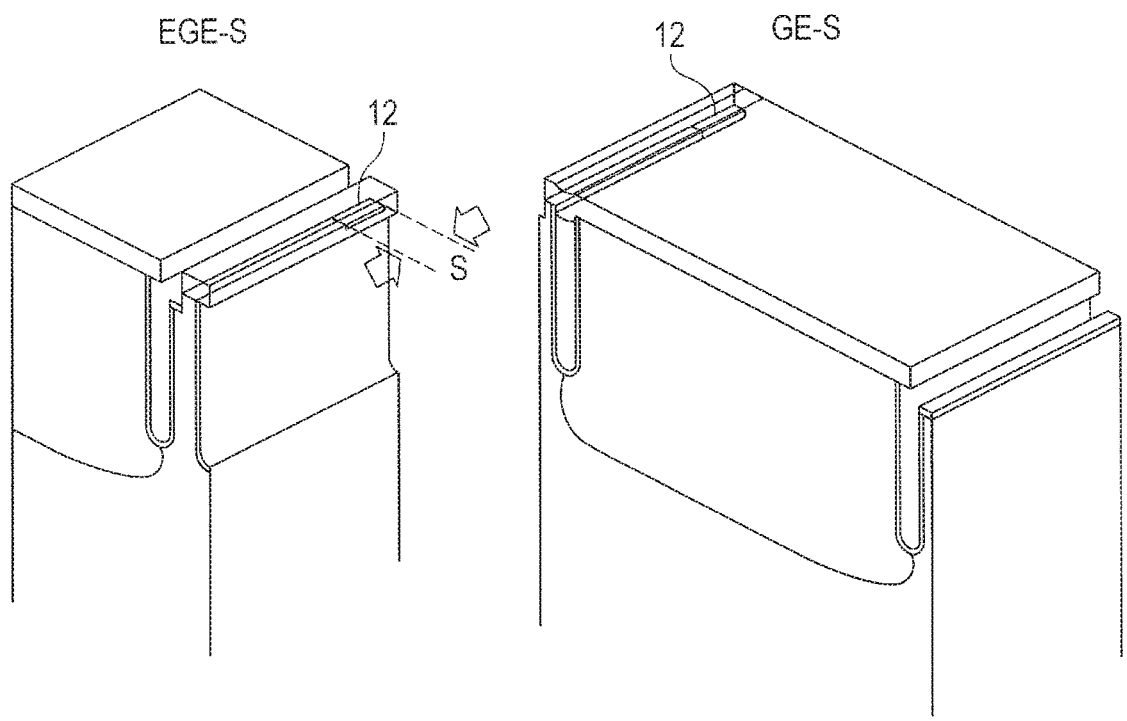
FIG. 19 illustrates three-dimensional TCAD.
Figure 20:
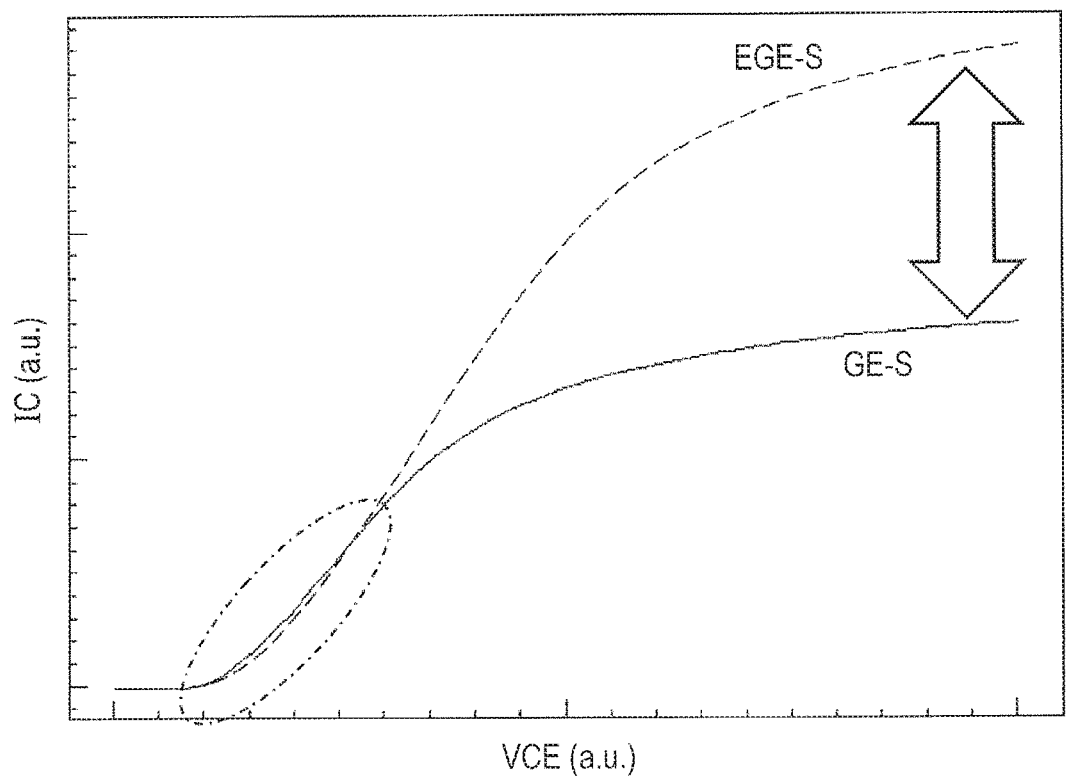
FIG. 20 illustrates VCE(sat) characteristics before adjustment of saturation current.
Figure 21:
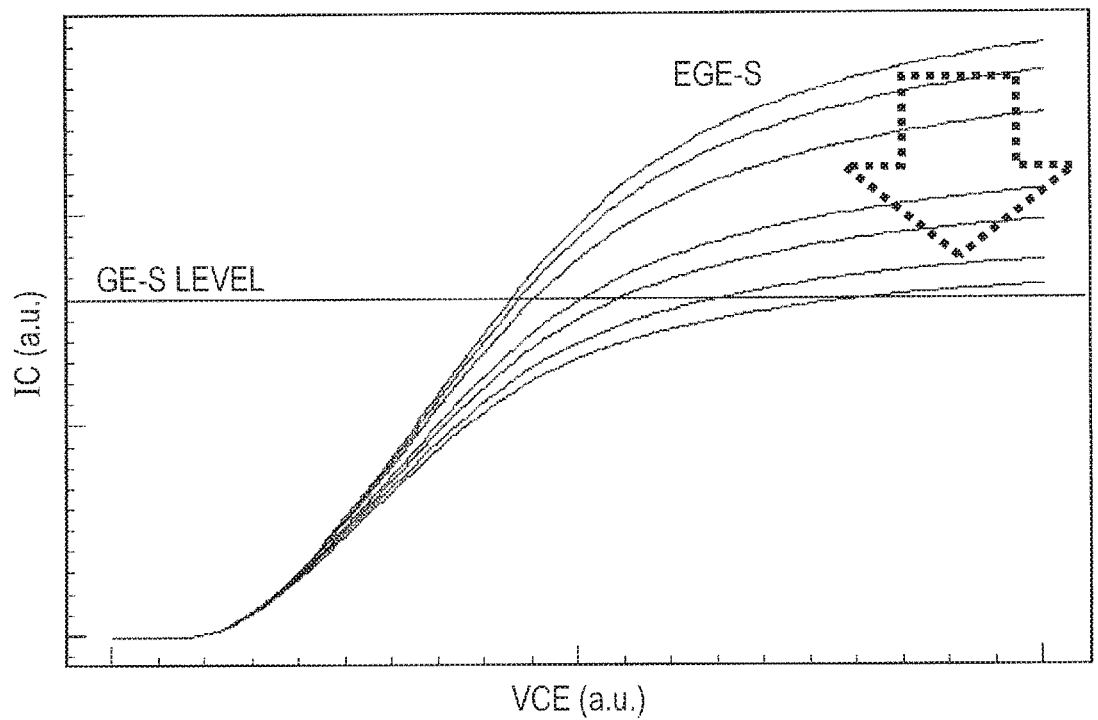
FIG. 21 illustrates adjustment of saturation current.
Figure 22:
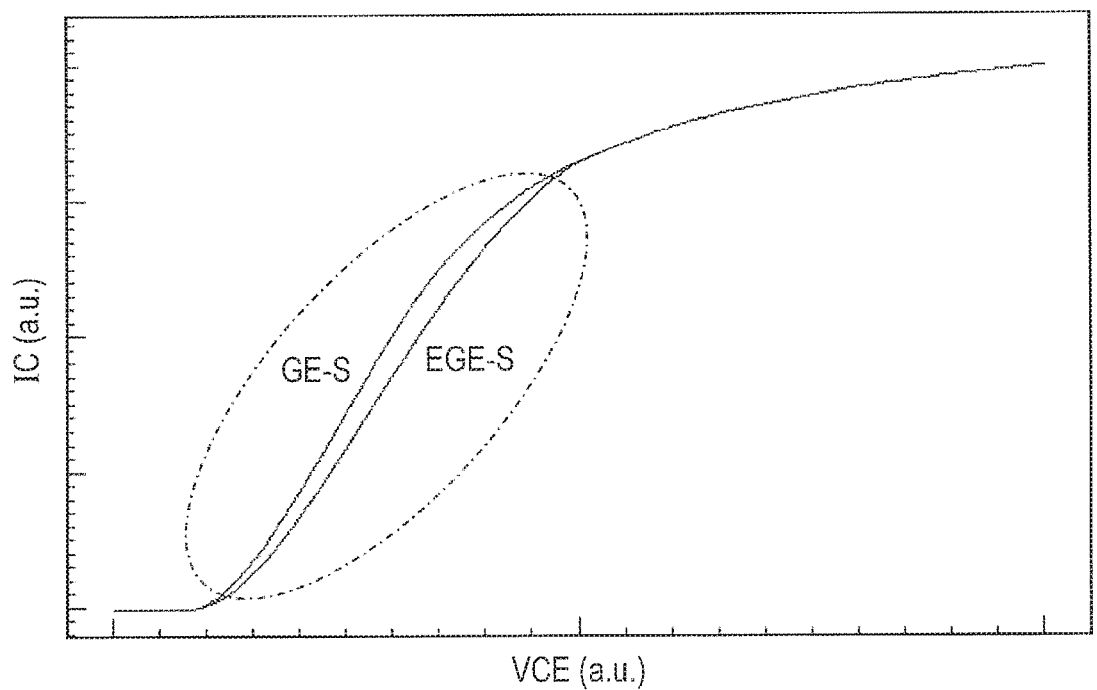
FIG. 22 illustrates VCE(sat) characteristics after adjustment of saturation current.

FIG. 19 is a view to explain 3D-TCAD, where the left shows a half cell of the EGE-S-type IGBT, and the right shows one cell of the GE-S-type IGBT. FIG. 20 illustrates VCE(sat) characteristics before matching of saturation current (collector current IC dependence of collector to emitter voltage VC in the on state (a state where VG=+15 V is applied). FIG. 21 is a view to explain adjustment of the saturation current. FIG. 22 illustrates the VCE(sat) characteristics after matching of the saturation current.

First, as shown in FIG. 19, when the EGE-S-type IGBT is compared to the GE-S-type IGBT with the same width and size in depth of a unit cell region, emitter widths differ from each other in unit area, resulting in a difference in saturation current. As shown in FIG. 20, therefore, the saturation current amount of the GE-S-type IGBT is about half the saturation current amount of the EGE-S-type IGBT, and accurate performance comparison cannot be performed. Although the saturation current amount of the GE-S-type IGBT is about half the saturation current amount of the EGE-S-type IGBT, a VCE(sat) reduction effect is seen in a portion of a broken-line ellipse in FIG. 20, showing that the IE effect is extremely improved.

Since the emitter width (S) per area of the GE-S-type IGBT is ½ (saturation current is also ½) of that of the EGE-S-type IGBT, 3D calculation is necessary. The emitter width (S) in the depth direction is adjusted to match the saturation current for comparison of the VCE(sat). The saturation current increases with an increase in the emitter width (S) per area. Such an increased saturation current greatly reduces the VCE(sat).

As shown in FIG. 21, therefore, the emitter width (S) of the EGE-S-type IGBT is adjusted to match the saturation current (the emitter width (S) is adjusted to be small so as to provide the same saturation current as that of the GE-S-type IGBT) for comparison of the VCE(sat). FIG. 22 shows a result of comparison of the VCE(sat) after matching of the saturation current, showing that the VCE(sat) can be greatly reduced in the GE-S-type IGBT.

When a short-circuit current occurs (abnormal mode), the IGBT used in an inverter controller requires to be not broken until a protection circuit isolates each IGBT after detecting an excess current. This is defined as load short-circuit tolerance (tolerant time (tsc) (sec) of an IGBT without break when a short-circuit current flows through the IGBT with load short-circuit). To maintain or improve the load short-circuit tolerance, load stress (applied energy) is necessary to be suppressed as shown in the following expression. That is, it is necessary that a short-circuit current (collector saturation current) is adjusted (suppressed) so as not to make the short-circuit current flow more than necessary.

$$tsc \propto C/W$$

where C is heat capacity (chip area×chip thickness) of a chip, and W is applied power (supply voltage×short-circuit current).

To suppress the collector current, the emitter width (12 (S) in FIG. 19), through which electrons are supplied, is necessary to be decreased by a method of intermittently disposing emitter parts (thinning the emitter width (S)) or a method of widening the width of the p-type floating region (resulting in a reduction in the emitter width (S)). In the IGBT used in an inverter controller, the saturation current is necessary to be controlled to a certain amount or less in light of the load short-circuit tolerance.

SUMMARY

Summary of the semiconductor device of the embodiment is now described. An element in parenthesis is shown as an example.

A semiconductor device includes:

(a) a semiconductor substrate having a first main surface (surface) and a second main surface (back) on a side opposite to the first main surface (surface);

(b) a first semiconductor region ($n^-$-type drift region) having a first conductivity type (n type) provided in the semiconductor substrate;

(c) a second semiconductor region (p-type body region) having a second conductivity type (p type) different from the first conductivity type (n type) provided in the semiconductor substrate between the first semiconductor region ($n^-$-type drift region) and the first main surface (surface);

(d) a third semiconductor region ($p^+$-type collector region) having the second conductivity type (p type) provided in the semiconductor substrate between the first semiconductor region ($n^-$-type drift region) and the second main surface (back);

(e) a first trench (gate trench) penetrating the second semiconductor region (p-type body region), and a second trench (emitter trench) provided away from the first trench (gate trench) while penetrating the second semiconductor region (p-type body region);

(f) a fourth semiconductor region ($n^+$-type emitter region) having the first conductivity type (n type) that is provided on a side close to the first main surface in the second semiconductor region (p-type body region) so as to be in contact with a first side surface of the first trench (gate trench), and is located between the first trench (gate trench) and the second trench (emitter trench);

(g) a first trench electrode (trench gate electrode) provided over an inside of the first trench (gate trench) with a first insulating film in between;

(h) a second trench electrode (trench emitter electrode) provided over an inside of the second trench (emitter trench) with a second insulating film in between;

(i) a fifth semiconductor region (p-type floating region) having the second conductivity type (p type) formed in the first semiconductor region in a portion located on a side opposite to the fourth semiconductor region ($n^+$-type emitter region) across the first trench (gate trench);

(j) a sixth semiconductor region (p-type floating region) having the second conductivity type (p type) formed in the first semiconductor region ($n^-$-type drift region) in a portion located on a side opposite to the fourth semiconductor region ($n^+$-type emitter region) across the second trench (emitter trench); and (k) a contact hole (contact trench) in contact with the second trench (emitter trench) and the fourth semiconductor region ($n^+$-type emitter region).

In the embodiment, since the parasitic p channel-type MOSFET is formed for any of the entire floating regions, a potential variation in the floating region can be suppressed.

In addition, since the mesa width can be reduced, the hole limiting factor can be increased to improve the IE effect, and thus the collector to emitter saturation voltage VCE(sat) can be reduced. In addition, since the adjustment range of the gate capacitance can be expanded without deteriorating performance, the degree of freedom in design can be increased. Moreover, the parasitic p channel-type MOSFET is formed and thus carriers can be effectively extracted at turn-off. This makes it possible to reduce a side effect (carriers stored during conduction cannot be extracted at turn-off and thus turn-off loss increases) of decreasing a mesa width pitch.

Example

Figure 23:
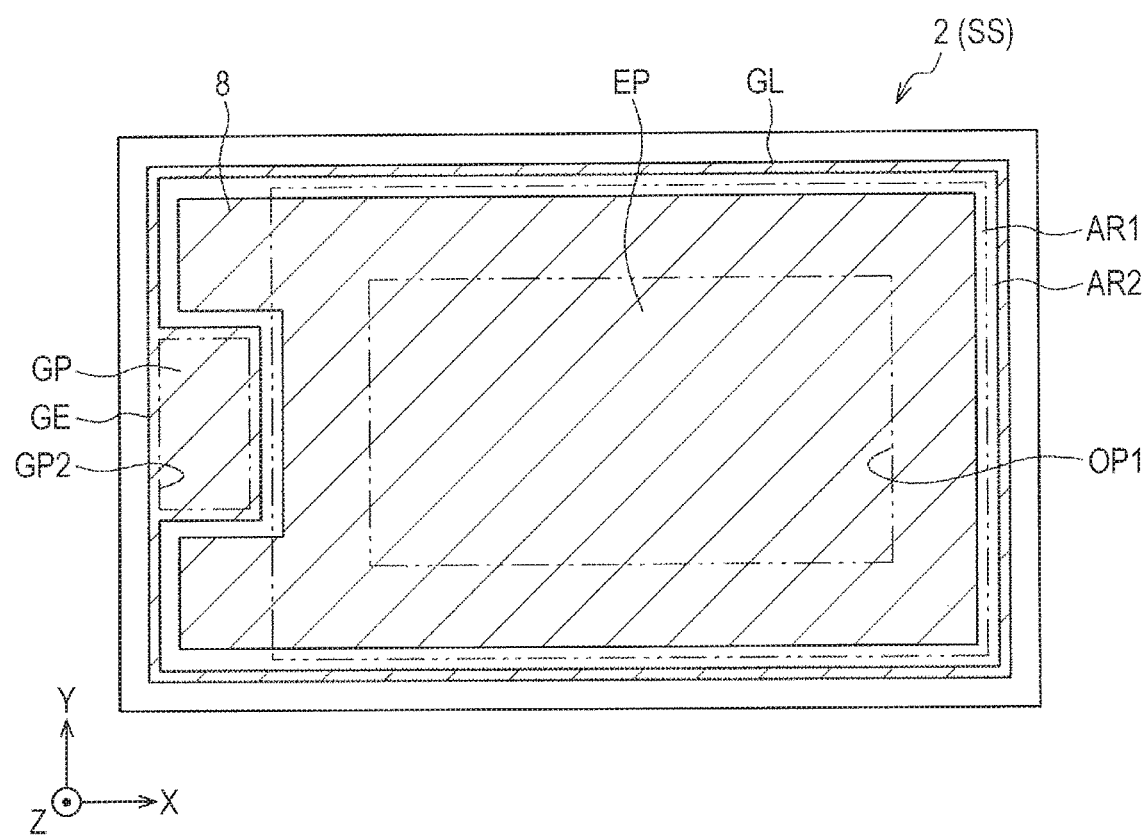
FIG. 23 illustrates an exemplary configuration of a semiconductor device.

FIG. 23 is a plan view showing an exemplary configuration of a semiconductor device (semiconductor chip). FIG. 23 shows a see-through image of the semiconductor device while an insulating film FPF (see FIG. 31) is removed to ease the understanding, showing the periphery of each of a cell formation region AR1, an emitter pad EP, and a gate pad GP by a two-dot chain line. The semiconductor device of FIG. 23 is a GE-S-type IGBT.

As shown in FIG. 23, a semiconductor chip 2 as the semiconductor device includes a semiconductor substrate SS. The semiconductor substrate SS has a surface as one main surface and a back as the other main surface on a side opposite to the surface. The semiconductor substrate SS further has the cell formation region AR1 as a part of the surface, and a gate line lead-out region AR2 as another part of the surface. The gate line lead-out region AR2 is provided, for example, on an outer circumferential side of the semiconductor substrate SS with respect to the cell formation region AR1.

An emitter electrode 8 is provided in the cell formation region AR1. The middle of the emitter electrode 8 is formed as an emitter pad EP to be coupled to a bonding wire and the like. The emitter pad EP includes the emitter electrode 8 in a portion exposed from an opening OP1 formed in the insulating film FPF (see FIG. 31) formed so as to cover the emitter electrode 8. The emitter electrode 8 includes a metal film including aluminum as a main component, for example.

A gate line GL and a gate electrode GE are provided in the gate line lead-out region AR2. The gate line GL is provided on the outer circumferential side of the semiconductor substrate SS with respect to the emitter electrode 8, for example. The gate line GL is coupled to the gate electrode GE. The middle of the gate electrode GE is formed as a gate pad GP to be coupled to a bonding wire and the like. The gate pad GP includes the gate electrode GE in a portion exposed from an opening OP2 formed in the insulating film FPF (see FIG. 31) formed so as to cover the gate electrode GE. The gate line GL and the gate electrode GE include a metal film including aluminum as a main component, for example.

(Configuration of Cell Formation Region of Semiconductor Device)

Figure 24:
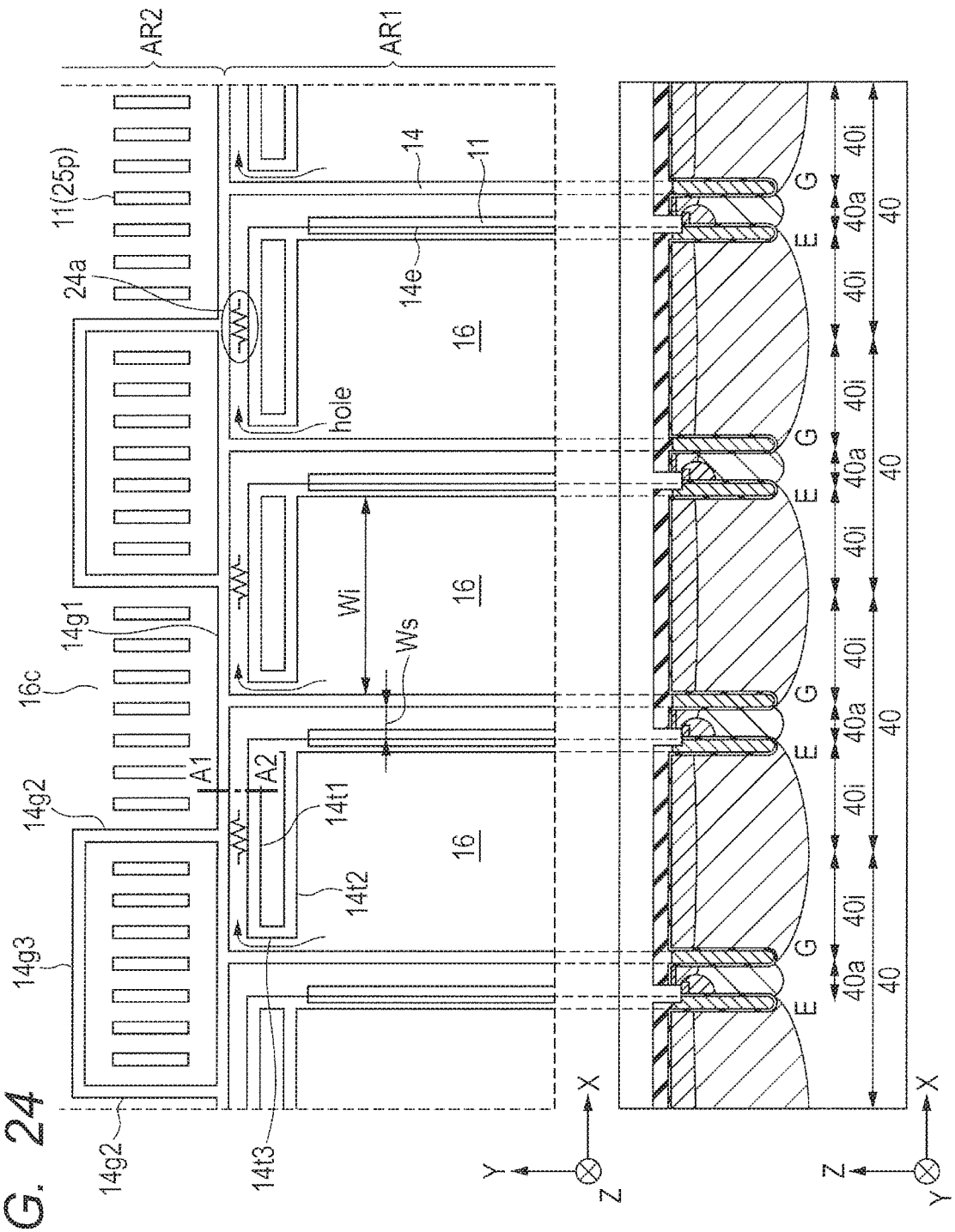
FIG. 24 illustrates the semiconductor device of FIG. 23.
Figure 25:
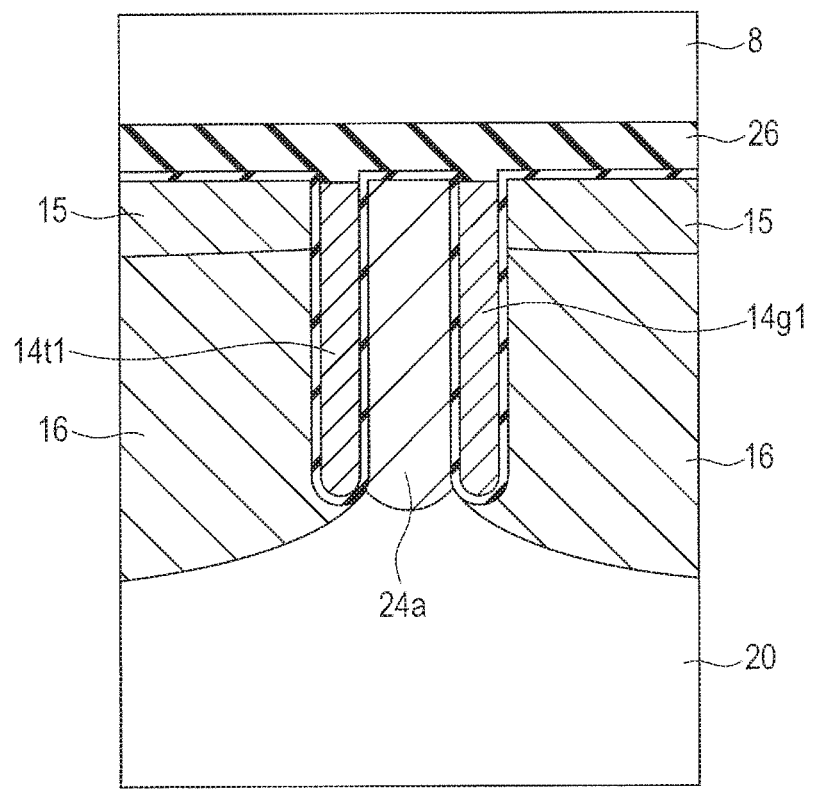
FIG. 25 illustrates the semiconductor device of FIG. 23.
Figure 63:
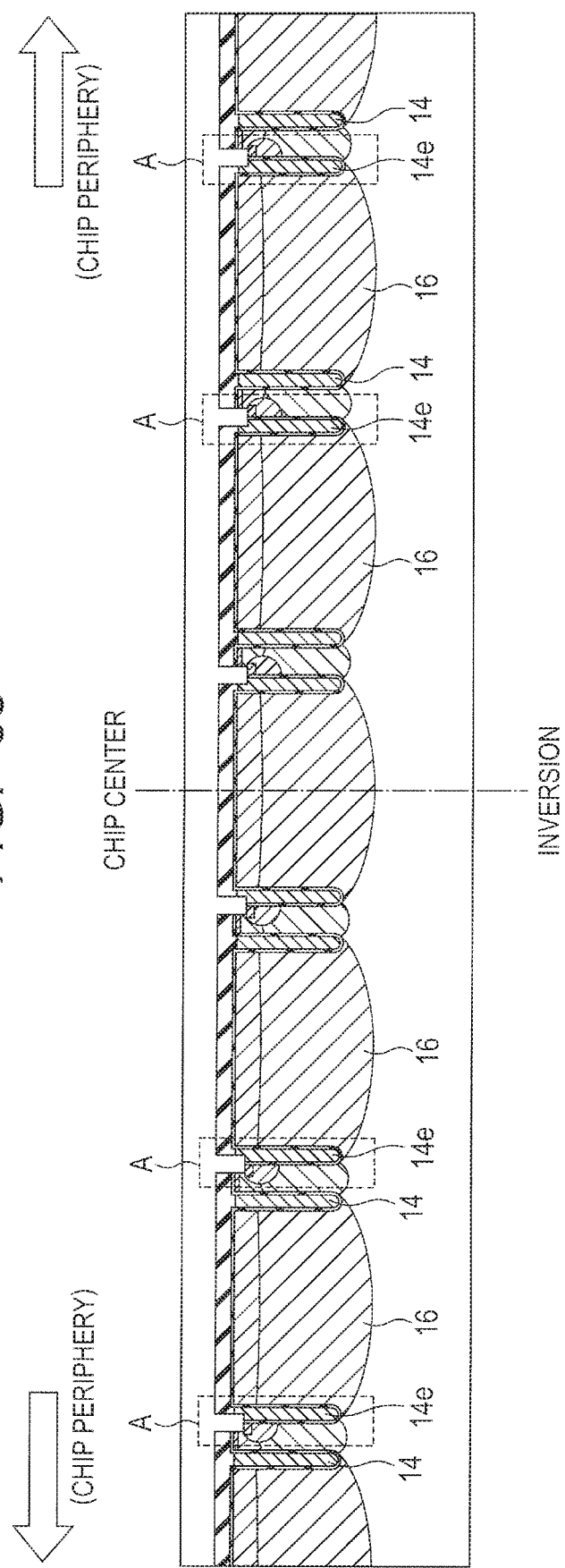
FIG. 63 illustrates the semiconductor device of FIG. 23.

A configuration of the cell formation region of the semiconductor device of FIG. 23 is described with reference to FIGS. 24 to 25 and 31. FIG. 24 includes a plan view showing the semiconductor device (the cell formation region and the gate line lead-out region) of FIG. 23, and a sectional view of the cell formation region. FIG. 25 is a sectional view along a line A1-A2 in FIG. 24. FIG. 63 is a sectional view of the semiconductor device of FIG. 23. FIG. 24 shows a see-through image of the semiconductor device while the insulating film FPF, the emitter electrode 8, and the interlayer insulating film 26 (see FIG. 31) are removed to ease the understanding.

As shown in FIG. 24, two directions, which intersect, preferably orthogonally, each other in the surface of the semiconductor substrate SS, are defined as an x-axis direction and a y-axis direction, and a direction perpendicular to the surface of the semiconductor substrate SS, i.e., a vertical direction, is defined as a z-axis direction. As shown in FIG. 24, a plurality of active cell regions 40a and a plurality of inactive cell regions 40i are provided in the cell formation region AR1. The active cell regions 40a extend in the y-axis direction and are periodically arranged in the x-axis direction in planar view. In other words, the active cell regions 40a are each formed in a longitudinal stripe shape. The inactive cell regions 40i extend in the y-axis direction and are periodically arranged in the x-axis direction in planar view. The active cell regions 40a and the inactive cell regions 40i are alternately arranged in the x-axis direction.

In this specification, "in planar view" means viewing from a direction perpendicular to the surface of the semiconductor substrate SS.

The trench gate electrode 14 and the trench emitter electrode 14e are provided in the active cell region 40a. The trench gate electrode 14 and the trench emitter electrode 14e extend in the y-axis direction in planar view. The respective trench gate electrode 14 and trench emitter electrode 14e are provided on both sides in the x-axis direction across the p-type body region 15 and the n-type hole barrier region 24. The trench gate electrode 14 is electrically coupled to the gate electrode GE. The trench emitter electrode 14e is electrically coupled to the emitter electrode 8. The n-type hole barrier region 24 is provided deeper than the p-type body region 15 (see FIG. 31).

In the active cell region 40a, a plurality of $n^+$-type emitter regions 12 are provided in a portion of the p-type body region 15 on a surface side of the semiconductor substrate SS. The p-type body region 15 is a semiconductor region having a p-type conductivity type. The $n^+$-type emitter region 12 is a semiconductor region having an n-type conductivity type different from the p-type conductivity type. In the active cell region 40a, the p-type body region 15 is continuously formed along the y-axis direction in planar view. In the active cell region 40a, the $n^+$-type emitter regions 12 are disposed at a certain interval along the y-axis direction. This makes it possible to reduce the emitter width (S).

In this specification, the p conductivity type of a semiconductor means that hole concentration is higher than electron concentration, i.e., holes are main charge carriers while charge carriers may include only holes or both electrons and holes. Similarly, the n conductivity type of a semiconductor means that electron concentration is higher than hole concentration, i.e., electrons are main charge carriers while charge carriers may include only electrons or both electrons and holes.

In the inactive cell region 40i, the p-type body region 15 is provided between the trench gate electrode 14 and the trench emitter electrode 14e adjacent to each other. The p-type floating region 16 is provided deeper than the p-type body region 15.

In the example shown in FIG. 24, the width (Ws) in the x-axis direction of the active cell region 40a is narrower than the width (Wi) in the x-axis direction of the inactive cell region 40i (Wa<Wi). In such a case, the IE effect of the IGBT can be improved.

The gate line lead-out region AR2 has a portion in which the p-type region 16c is provided so as to surround the cell formation region AR1, for example. The p-type region 16c is electrically coupled to the emitter electrode 8 via the p+-type body contact region 25 in a portion exposed in the bottom of the contact trench 11.

In the gate line lead-out region AR2, the gate line GL is disposed, and the trench gate electrodes 14 extend toward the gate line GL from within the cell formation region AR1. In the gate line lead-out region AR2, the ends of the two adjacent trench gate electrodes 14 are coupled to each other by a trench gate electrode 14g1. Trench gate electrodes 14g2 are provided so as to extend in any direction from the trench gate electrode 14g1, and the ends of the two adjacent trench gate electrodes 14g2 are coupled to each other by a trench gate electrode 14g3. The trench gate electrode 14g3 is disposed in a region, in which the gate line GL is disposed, in planar view. The trench gate electrode 14g3 is electrically coupled to the gate line GL.

The trench gate electrode 14 and the trench emitter electrode 14e are disposed on both sides across the inactive cell region 40i located between the two adjacent active cell regions 40a in planar view.

In the active cell region 40a, the p+-type semiconductor region including the p+-type body contact region 25 and the p+-type latch-up prevention region 23 is continuously formed along the y-axis direction. In the active cell region 40a, the contact trench 11 as an opening is continuously formed along the y-axis direction in the p-type body region 15. The contact trench 11 runs up to the p+-type body contact region 25 disposed in the active cell region 40a.

Trench end electrodes 14t1 and 14t2 extend in the x-axis direction from the trench emitter electrode 14e in the inactive cell region 40i in the cell formation region AR1. The ends of the trench end electrodes 14t1 and 14t2 are coupled to each other by a trench end electrode 14t3. As shown in FIG. 63, for a cell layout in a chip plane of the semiconductor chip 2, the trench emitter electrode 14e (the parasitic p channel-type MOSFET enclosed by a broken line A) is disposed near the chip periphery, and the trench gate electrode 14 is disposed near the chip center with respect to each p-type floating region 16. This allows the carrier storage amount (during conduction) of the chip periphery to be lower than that of the chip middle, making it possible to suppress current concentration on the chip periphery at turn-off; hence, the reverse bias safe operating area (RB-SOA) can be increased (switching turn-off isolation capability can be improved).

The trench electrodes sandwiching the floating region are typically necessary to have the same electric potential. A hole barrier region 24a (resistance region against holes) is necessary to be provided between the p-type floating region 16 and the contact trench 11 to isolate the p-type floating region 16 in order to form a structure sandwiching the p-type floating region 16 by trench electrodes having different electric potentials (the trench gate electrode 14 and the trench emitter electrode 14e) as in the GE-S-type IGBT. An unisolated p-type floating region 16 does not work as the floating region.

As shown in FIG. 25, the hole barrier region 24a between the trench gate electrodes 14g1 and the trench end electrode 14t1 is formed by a high-concentration n-type layer similar to that of the n-type hole barrier region 24, which increases resistance against holes (provides a hole barrier effect in a lateral direction (x direction)). The p-type floating region 16 works as a floating layer by suppressing hole discharge. The p-type floating region 16 is formed such that a deep p-type diffusion layer covers a trench bottom for each of the trench gate electrodes 14g1 and the trench end electrode 14t1; hence, field strength does not increase. The trench gate electrodes 14g1 and the trench emitter electrode 14e1 are disposed such that a space therebetween is as narrow as possible in order to increase the resistance against holes.

(Method of Manufacturing Semiconductor Device)

A method of manufacturing the semiconductor device of FIG. 23 is now described with reference to FIGS. 26 to 31.

FIGS. 26 to 31 are sectional views showing a manufacturing process of the semiconductor device of FIG. 23. FIGS. 26 to 31 are sectional views of the same section as that of the sectional view of FIG. 24.

Figure 26:
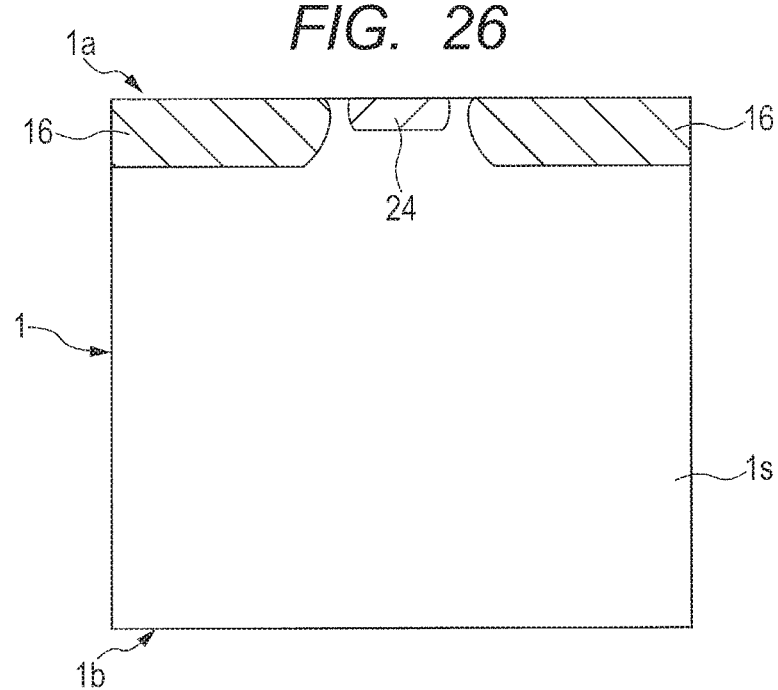
FIG. 26 illustrates a method of manufacturing the semiconductor device of FIG. 23.

First, as shown in FIG. 26, there is provided a semiconductor wafer 1 including a semiconductor substrate is of silicon single crystal to which an n-type impurity such as phosphorus is introduced, for example. The semiconductor wafer 1 has a surface 1a as a first main surface and a back 1b as a second main surface on a side opposite to the surface 1a.

The concentration of the n-type impurity in the semiconductor wafer 1 can be adjusted to about $2\times10^{14}$ cm$^{-3}$, for example. The thickness of the semiconductor wafer 1 can be adjusted to about 450 to 1000 μm, for example.

Subsequently, an n-type impurity is introduced into the semiconductor substrate 1s on a side close to the surface 1a of the semiconductor wafer 1 by an ion implantation process with a resist pattern as a mask to form the n-type hole barrier region 24. An example of a preferred condition of such ion implantation may include a condition, in which an ion species is phosphorous, a dose amount is about $6\times10^{12}$ cm$^{-2}$, and implantation energy is about 200 keV.

The n-type hole barrier region 24 is formed in the active cell region 40a.

Subsequently, a p-type impurity is introduced into the semiconductor substrate 1s on the surface 1a side of the semiconductor wafer 1 by an ion implantation process with a resist pattern as a mask to form the p-type floating region 16. An example of a preferred condition of such ion implantation may include a condition, in which an ion species is boron, a dose amount is about $3.5\times10^{13}$ cm$^{-2}$, and implantation energy is about 75 keV.

The p-type floating region 16 is formed in the inactive cell region 40i. When the p-type floating region 16 is formed in the cell formation region AR1, the p-type floating region 16 is also formed in the gate line lead-out region AR2 (see FIG. 24), for example.

Figure 27:
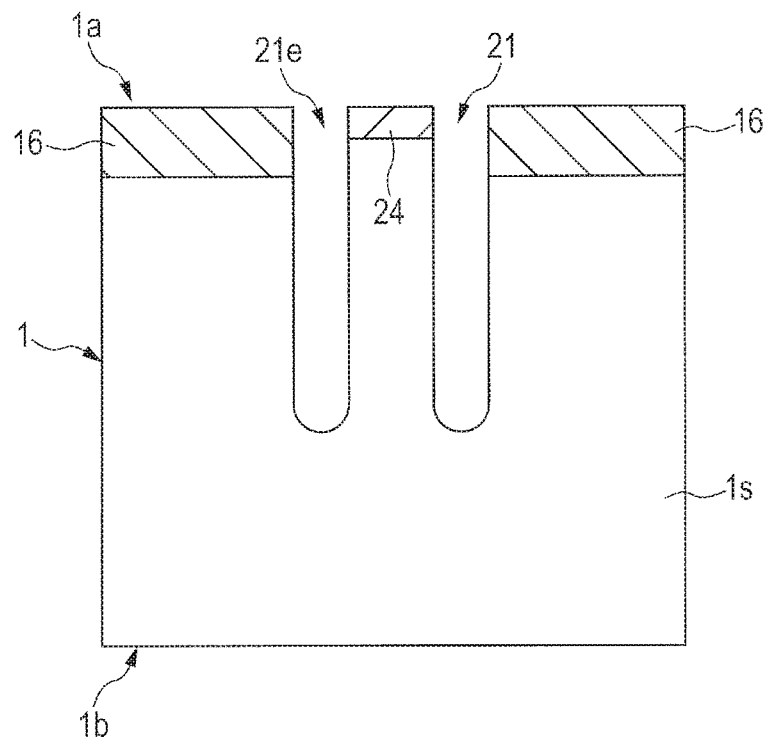
FIG. 27 illustrates the method of manufacturing the semiconductor device of FIG. 23.

Subsequently, as shown in FIG. 27, trenches 21 and 21e are formed by, for example, an anisotropic dry etching process using a hard mask including a silicon oxide film, for example. An example of a preferred gas for such anisotropic dry etching may include $Cl_2/O_2$-based gas.

Figure 28:
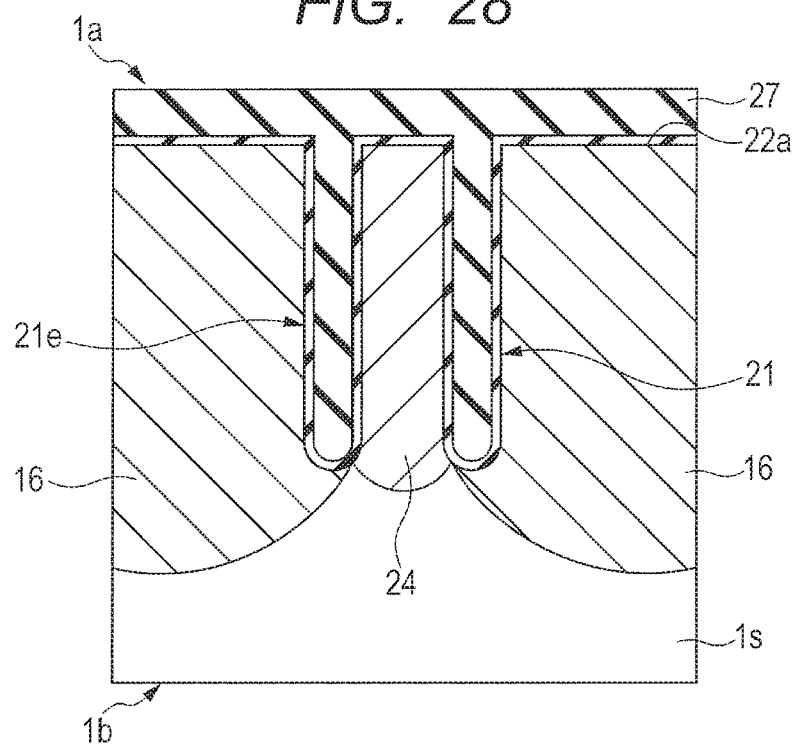
FIG. 28 illustrates the method of manufacturing the semiconductor device of FIG. 23.

Subsequently, as shown in FIG. 28, extension diffusion (for example, 1200° C., about 30 min) is performed on the p-type floating region 16 and the n-type hole barrier region 24. At this time, the extension diffusion is performed such that the end on the back 1b side of the p-type floating region 16 is disposed on each of the ends on the back 1b side of the trenches 21 and 21e in the z-axis direction.

Subsequently, agate insulating film 22 including, for example, a silicon oxide film is formed on the surface 1a of the semiconductor wafer 1 and on each of the inner walls of the trenches 21 and 21e by a thermal oxidation process, for example. The thickness of the gate insulating film 22 is about 0.12 μm, for example.

The p-type floating region 16 is formed between the adjacent trenches 21 and 21e by the extension diffusion.

Preferably, the p-type floating region 16 is in contact with the gate insulating film 22 formed on each of the inner walls of the trenches 21 and 21e.

The n-type hole barrier region 24 is formed between the trenches 21 and 21e. Preferably, the n-type hole barrier region 24 formed between the trenches 21 and 21e is in contact with the gate insulating film 22 formed on each of the inner walls of the trenches 21 and 21e.

A region of the n-type semiconductor wafer 1, in which the p-type floating region 16 and the n-type hole barrier region 24 are not formed, becomes the n$^-$-type drift region 20 during the extension diffusion.

Between the trenches 21 and 21e, the n-type impurity concentration of the n-type hole barrier region 24 is higher than that of the n$^-$-type drift region 20 and lower than that of the n$^+$-type emitter region 12 as described later.

Subsequently, a conductive film 27 including a phosphorous-doped polycrystalline silicon (doped poly-silicon) film is formed by a chemical vapor deposition (CVD) or the like over the surface 1a of the semiconductor wafer 1 and within each of the trenches 21 and 21e. The thickness of the conductive film 27 is about 0.5 to 1.5 µm, for example.

Figure 29:
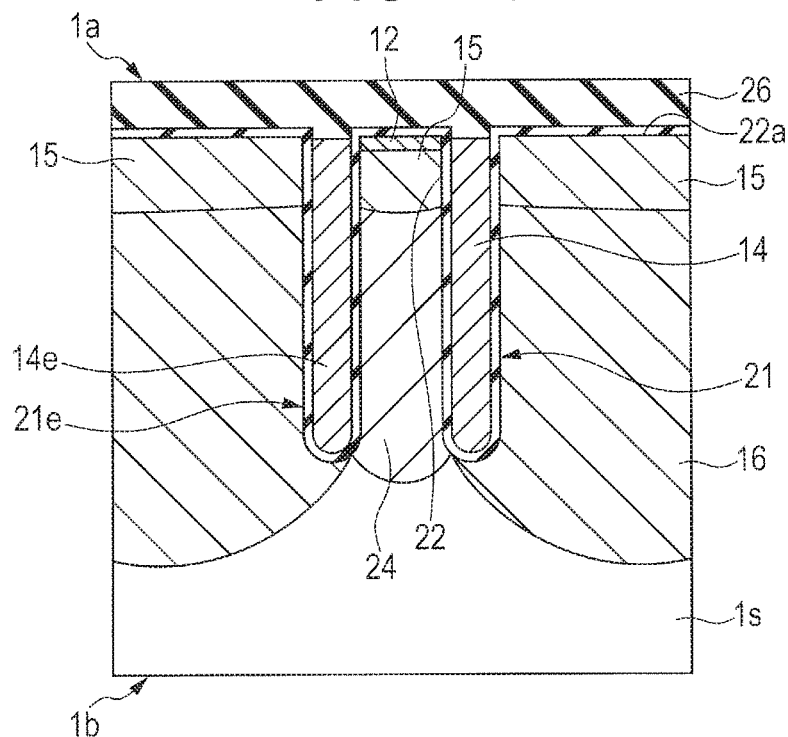
FIG. 29 illustrates the method of manufacturing the semiconductor device of FIG. 23.

Subsequently, as shown in FIG. 29, the conductive film 27 is etched back by a dry etching process, for example. This results in formation of the trench gate electrode 14 including the conductive film 27 embedded in the trench 27 while the gate insulating film 22 is provided between the conductive film 27 and the inside of the trench 21. In addition, there is formed the trench emitter electrode 14e including the conductive film 27 embedded in the trench 21e while the gate insulating film 22 is provided between the conductive film 27 and the inside of the trench 21e. An example of a gas for such etching may preferably include SF$_6$ gas.

Subsequently, the gate insulating film 22 other than within the trenches 21 and 21e is removed by a dry etching process, for example.

Subsequently, an insulating film 22a including a silicon oxide film having a relatively small thickness (similar to the thickness of the gate insulating film 22, for example) for subsequent ion implantation is formed by a thermal oxidation process or a CVD process on the surface 1a of the semiconductor wafer 1, for example.

Subsequently, a p-type impurity is introduced into the entire surface of the cell formation region AR1 and other necessary portions by an ion implantation process with a resist pattern as a mask to form the p-type body region 15.

Specifically, the p-type body region 15 is formed between the trenches 21 and 21e so as to be in contact with the gate insulating film 22 formed on the inner wall of each of the trenches 21 and 21e. The p-type body region 15 is formed on the n-type hole barrier region 24. The p-type body region 15 is formed on the p-type floating region 16 in the inactive cell region 40i.

An example of a preferred condition of such ion implantation may include a condition, in which an ion species is boron, a dose amount is about $3 \times 10^{13}$ cm$^{-2}$, and implantation energy is about 75 keV.

Furthermore, an n-type impurity is introduced into an upper portion of the p-type body region 15 in the active cell region 40a to form the n$^+$-type emitter region 12.

An example of a preferred condition of such ion implantation may include a condition, in which an ion species is arsenic, a dose amount is about $5 \times 10^{15}$ cm$^{-2}$, and implantation energy is about 80 keV.

Figure 30:
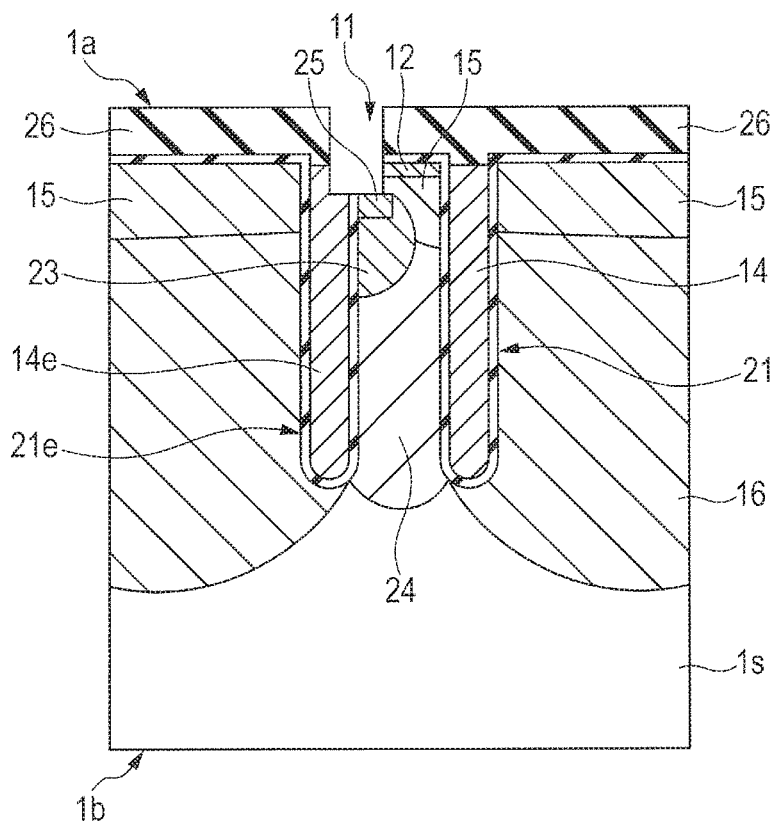
FIG. 30 illustrates the method of manufacturing the semiconductor device of FIG. 23.

Subsequently, as shown in FIG. 30, an interlayer insulating film 26 including, for example, a phosphosilicate glass (PSG) film is formed on the surface 1a of the semiconductor wafer 1 by a CVD process, for example. The interlayer insulating film 26 is formed so as to cover the p-type body region 15 with the insulating film 22a in between in each of the active cell region 40a and the inactive cell region 40i. The thickness of the interlayer insulating film 26 is about 0.6 µm, for example. An example of a preferred material of the interlayer insulating film 26 may include the PSG film, a borophosphosilicate glass (BPSG) film, a non-doped silicate glass (NSG) film, and a spin-on-glass (SOG) film, and a composite film thereof.

Subsequently, the contact trench 11 is formed in the interlayer insulating film 26 by an anisotropic dry etching process with a resist pattern as a mask. An example of a preferred gas for such anisotropic dry etching may include a mixed gas including Ar gas, CHF$_3$ gas, and CF$_4$ gas. Subsequently, the contact trench 11 is led into the semiconductor wafer 1 by an anisotropic dry etching process. As a result, the contact trench 11 as an opening is formed in the active cell region 40a so as to run through the interlayer insulating film 26 up to a middle portion of each of the p-type body region 15 and the trench 21e. In a unit active cell region 40a, the contact trench 11 is continuously formed along the y-axis direction in planar view. An example of a preferred gas for such anisotropic dry etching may include Cl$_2$/O$_2$ gas.

Subsequently, a p-type impurity is ion-implanted through, for example, the contact trench 11 to form the p$^+$-type body contact region 25. An example of a preferred condition of such ion implantation may include a condition, in which an ion species is boron, a dose amount is about $5 \times 10^{15}$ cm$^{-2}$, and implantation energy is about 80 keV. When the p$^+$-type body contact region 25 is formed in the cell formation region AR1, a p$^+$-type body contact region 25p is formed in the gate line lead-out region AR2 (see FIG. 24), for example.

Subsequently, a p-type impurity is ion-implanted through, for example, the contact trench 11 to form the p$^+$-type latch-up prevention region 23. An example of a preferred condition of such ion implantation may include a condition, in which an ion species is boron, a dose amount is about $1 \times 10^{15}$ cm$^{-2}$, and implantation energy is about 100 keV. The impurity concentration of the p$^+$-type body contact region 25 is higher than that of the p$^+$-type latch-up prevention region 23.

The p$^+$-type body contact region 25 and the p$^+$-type latch-up prevention region 23 are formed in a portion of the p-type body region 15 exposed in the contact trench 11 in the active cell region 40a. The p$^+$-type body contact region 25 and the p$^+$-type latch-up prevention region 23 are continuously formed along the y-axis direction in planar view in the active cell region 40a.

That is, the p$^+$-type body contact region 25 and the p$^+$-type latch-up prevention region 23 are formed in a portion located between the trenches 21 and 21e so as to be in contact with the p-type body region 15. The p-type impurity concentration of each of the p$^+$-type body contact region 25 and the p$^+$-type latch-up prevention region 23 is higher than that of the p-type body region 15 in the active cell region 40a.

Figure 31:
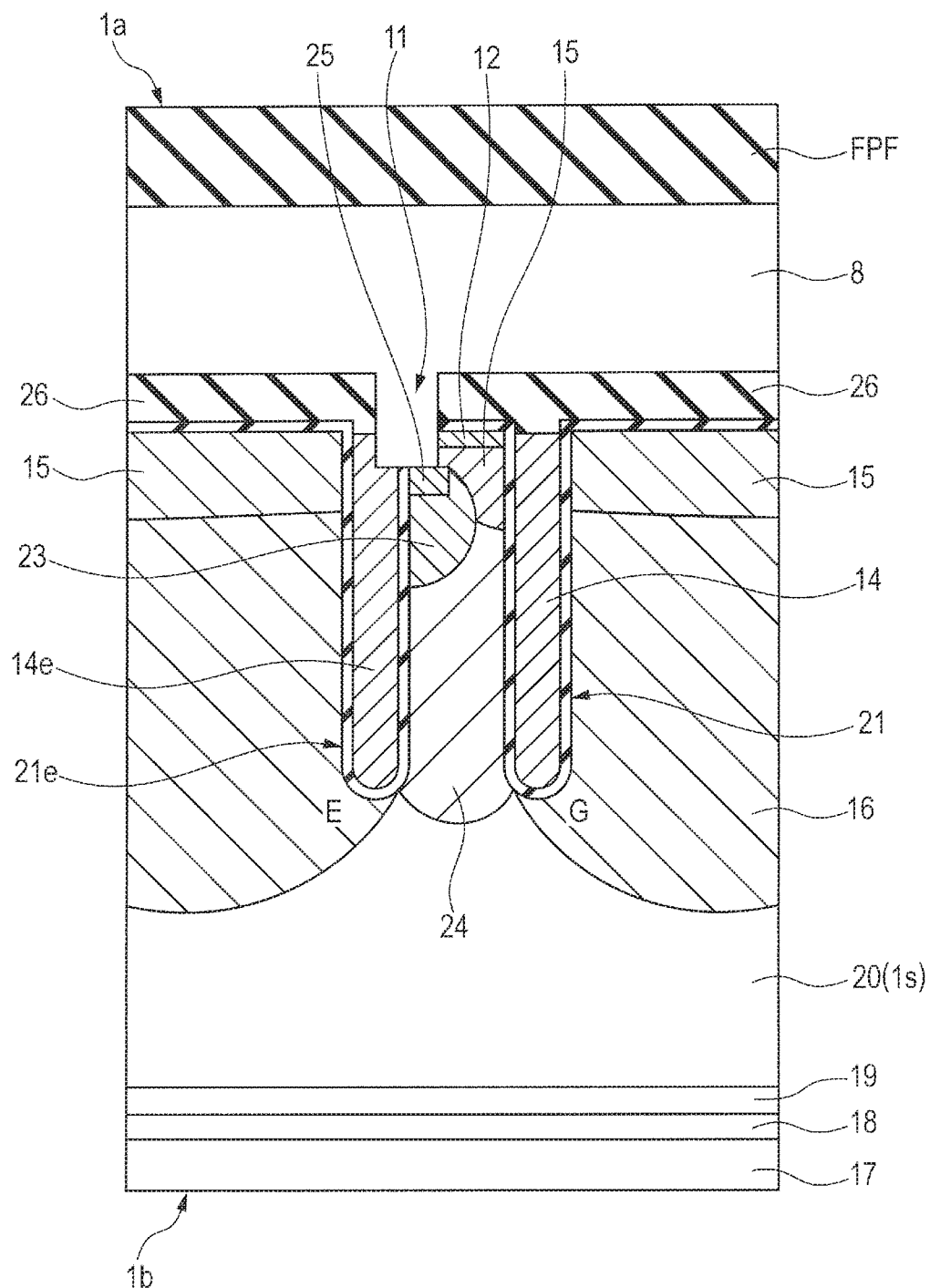
FIG. 31 illustrates the method of manufacturing the semiconductor device of FIG. 23.

Subsequently, as shown in FIG. 31, the emitter electrode 18 is formed. Specifically, the emitter electrode 18 is formed in the following procedure. First, a titanium tungsten film as a barrier metal film is formed on the surface 1a of the semiconductor wafer 1 by a sputtering process, for example. The thickness of the titanium tungsten film is about 0.2 µm, for example.

Subsequently, silicide anneal of, for example, about 600° C. and about 10 min is performed in nitrogen atmosphere, and then an aluminum-based metal film (for example, a few percent of silicon is contained, and the remainder consists of aluminum) is formed by, for example, a sputtering process over the entire surface of the barrier metal film so as to fill the contact trench 11. The thickness of the aluminum-based metal film is about 5 µm, for example.

Subsequently, the emitter electrode 8 including the aluminum-based metal film and the barrier metal film is formed by a dry etching process with a resist pattern as a mask. An example of a preferred gas for such dry etching may include $Cl_2/BCl_3$ gas.

As a result, the emitter electrode 8 is formed within the contact trench 11 and over the interlayer insulating film 26 in the active cell region 40*a*.

The emitter electrode 8 is electrically coupled, via a coupling electrode CP formed in the active cell region 40*a*, to the plurality of n⁺-type emitter regions 12, the plurality of p⁺-type body contact regions 25, and the plurality of p⁺-type latch-up prevention regions 23 formed in the active cell region 40*a*.

When the emitter electrode 8 is formed, the gate electrode GE may be formed so as to be electrically coupled to the trench gate electrode 14 (see FIG. 23). When the emitter electrode 8 is formed in the cell formation region AR1, the gate line GL and the gate electrode GE may be formed in the gate line lead-out region AR2 (see FIG. 23).

Subsequently, an insulating film FPF as a passivation film, which includes an organic film including, for example, polyimide as a main component, is formed over the emitter electrode 8. The thickness of the insulating film FPF is about 2.5 µm, for example.

Subsequently, the insulating film FPF is patterned by a dry etching process with a resist pattern as a mask to form the opening OP1 that runs up to the emitter electrode 8 through the insulating film FPF (see FIG. 23), and thus form the emitter pad EP including the emitter electrode 8 in a portion exposed in the opening OP1 (see FIG. 23).

When the insulating film FPF is formed over the emitter electrode 8 in the cell formation region AR1, the insulating film FPF is also formed over the gate electrode GE in the gate line lead-out region AR2 (see FIG. 23). When the opening OP1 is formed in the cell formation region AR1, the opening OP2, which runs up to the gate electrode GE through the insulating film FPF, is formed in the gate line lead-out region AR2 to form the gate pad GP including the gate electrode GE in a portion exposed in the opening OP2 (see FIG. 23).

Subsequently, the back 1*b* of the semiconductor wafer 1 is subjected to back grinding to reduce a thickness of, for example, about 800 µm to, for example, about 30 to 200 µm as necessary. For example, if the withstand voltage is about 600 V, final thickness is about 70 µm. Chemical etching or the like is also performed to remove damage to the back 1*b* as necessary.

Subsequently, an n-type impurity is introduced into the back 1*b* of the semiconductor wafer 1 by, for example, an ion implantation process to form the n-type field stop region 19. An example of a preferred condition of such ion implantation may include a condition, in which an ion species is phosphorous, a dose amount is about $7 \times 10^{12}$ cm$^{-2}$, and implantation energy is about 350 keV. Subsequently, laser anneal or the like is performed on the back 1*b* of the semiconductor wafer 1 to activate the impurity as necessary.

Subsequently, a p-type impurity is introduced into the back 1*b* of the semiconductor wafer 1 by, for example, an ion implantation process to form the p⁺-type collector region 18. An example of a preferred condition of such ion implantation may include a condition, in which an ion species is boron, a dose amount is about $1 \times 10^{13}$ cm$^{-2}$, and implantation energy is about 40 keV. Subsequently, laser anneal or the like is performed on the back 1*b* of the semiconductor wafer 1 to activate the impurity as necessary.

Subsequently, a collector electrode CE is formed on the back 1*b* of the semiconductor wafer 1 by, for example, a sputtering process so as to be electrically coupled to the p⁺-type collector region 18. Subsequently, the semiconductor substrate SS is divided into chip regions by dicing or the like, and the divided chips are each sealed into a package, so that the semiconductor device of the Example is substantially completed.

An exemplary main dimension of each part (see FIGS. 24 and 31) of the device is shown to more specifically exemplify the device structure. Specifically, the width (Ws) of the active cell region is about 0.8 to 0.9 µm, the width (Wi) of the inactive cell region is about 3.3 µm (the width (Ws) of the active cell region is desirably narrower than the width (Wi) of the inactive cell region, and a value of Wi/Ws is preferably in a range from 2 to 3, for example), the contact width is about 0.3 µm, the trench width is about 0.4 to 0.5 µm, the trench depth is about 3 µm, the depth of the n⁺-type emitter region 12 is about 250 nm, the depth of the p-type body region 15 (channel region) is about 0.8 µm, the depth of the p⁺-type latch-up prevention region 23 is about 1.4 µm, the depth of the p-type floating region 16 is about 4.5 µm, the thickness of the n-type field stop region 19 is about 1.5 µm, the thickness of the p⁺-type collector region 18 is about 0.5 µm, and the thickness of the semiconductor substrate SS is about 70 µm (in this exemplary case, the withstand voltage is about 600 V). The thickness of the semiconductor substrate SS strongly depends on a required withstand voltage. Hence, the thickness is, for example, about 120 µm for the withstand voltage of 1200 V, and about 40 µm for the withstand voltage of 400 V. These numerical values are merely shown as an example.

(Isolation Characteristics Between Floating Region and Contact Trench)

TCAD verification is performed on a method of isolating the floating region 16 from the contact trench 11.

Figure 32:
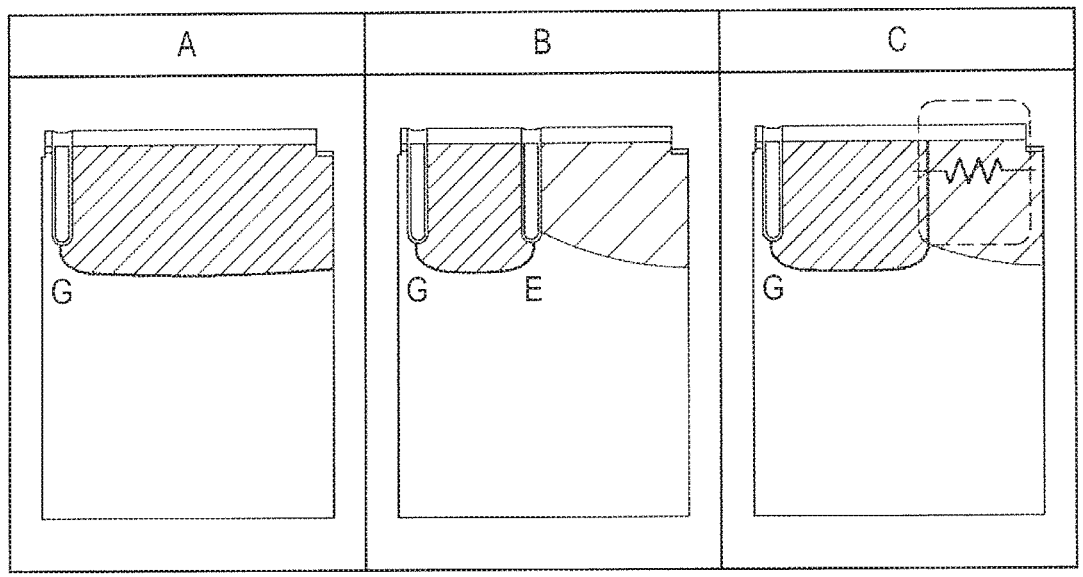
FIG. 32 is a view to explain an isolation structure of a floating region and a contact trench.
Figure 33:
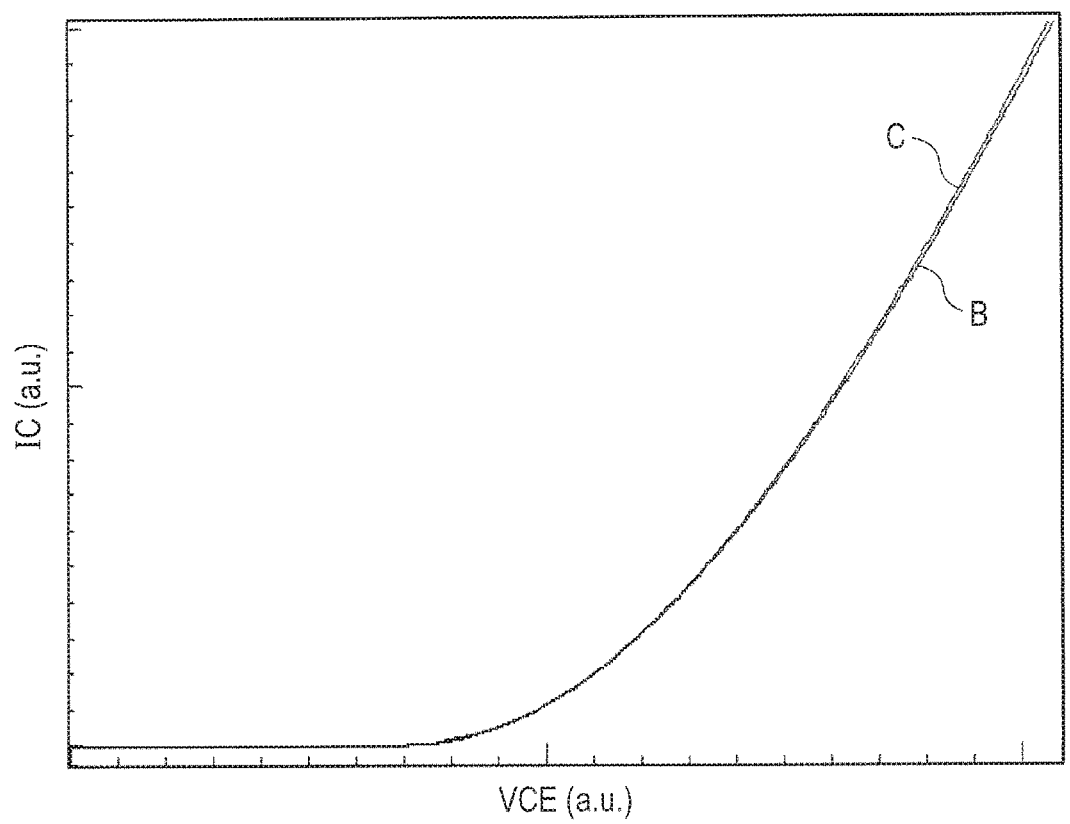
FIG. 33 is a view to explain VCE(sat) characteristics.
Figure 34:
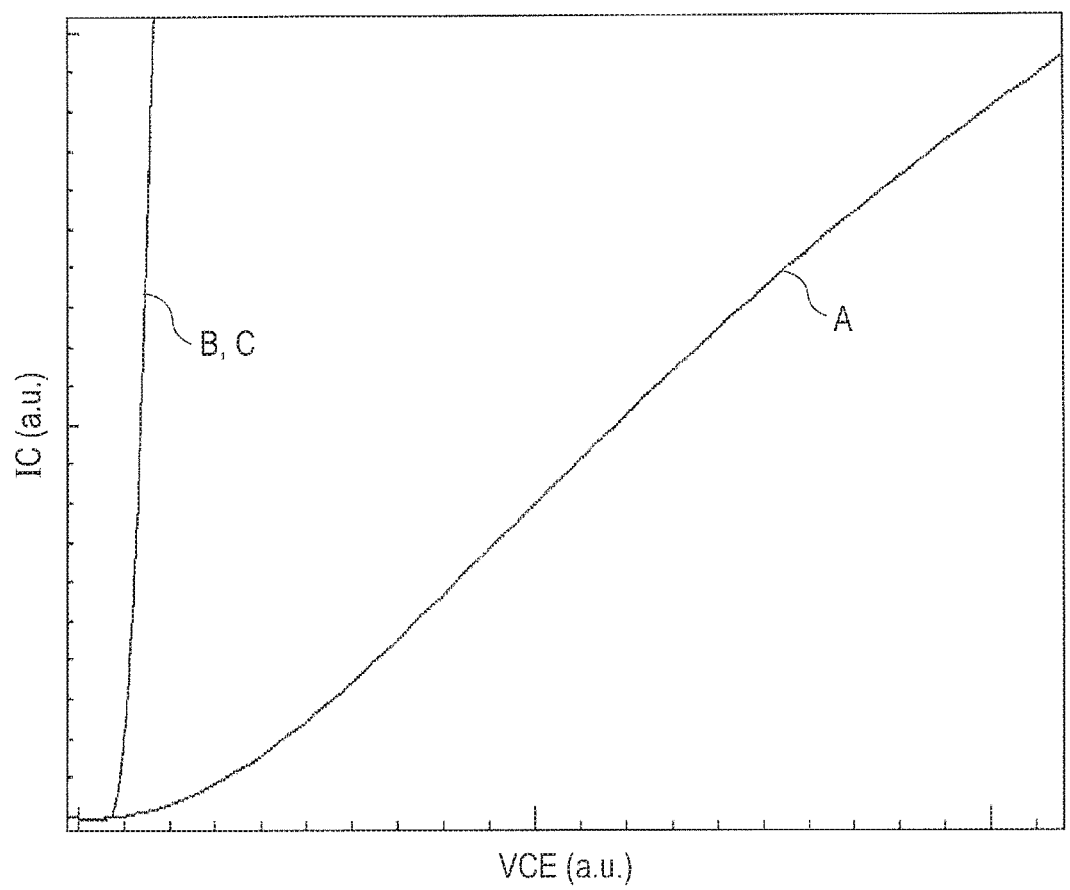
FIG. 34 is a view to explain the VCE(sat) characteristics.

FIG. 32 is a view to explain an isolation structure between a floating region and a contact trench. FIG. 33 illustrates VCE(sat) characteristics for each of the structures B and C of FIG. 32. FIG. 34 illustrates VCE(sat) characteristics for each of the structures A, B, and C of FIG. 32. In FIG. 32, high-density hatching represents a p-type floating region, and low-density hatching represents a hole barrier layer (high-concentration n-type layer).

As shown in FIG. 32, the floating region is isolated by the trench emitter electrode in the structure B, while the floating region is isolated only by the high-concentration n-type layer without forming the trench emitter electrode in the structure C. No difference is found between the output results of the VCE(sat) characteristics of the structures B and C. In other words, even if the trench electrode for isolation is not formed, the p-type floating region 16 can be isolated from the contact trench 11 by the hole barrier layer (high-concentration n-type layer) and thus can serve as the floating layer.

For the structure A without isolation by the trench emitter electrode or the high-concentration n-type layer, no isolation layer exists, and the floating region is coupled to the contact trench and thus does not serve as the floating layer. As shown in FIG. 34, only the structure, in which the floating layer is not isolated, shows a high VCE(sat), i.e., loses the function of the floating layer and is thus reduced in the IE effect.

Figure 36:
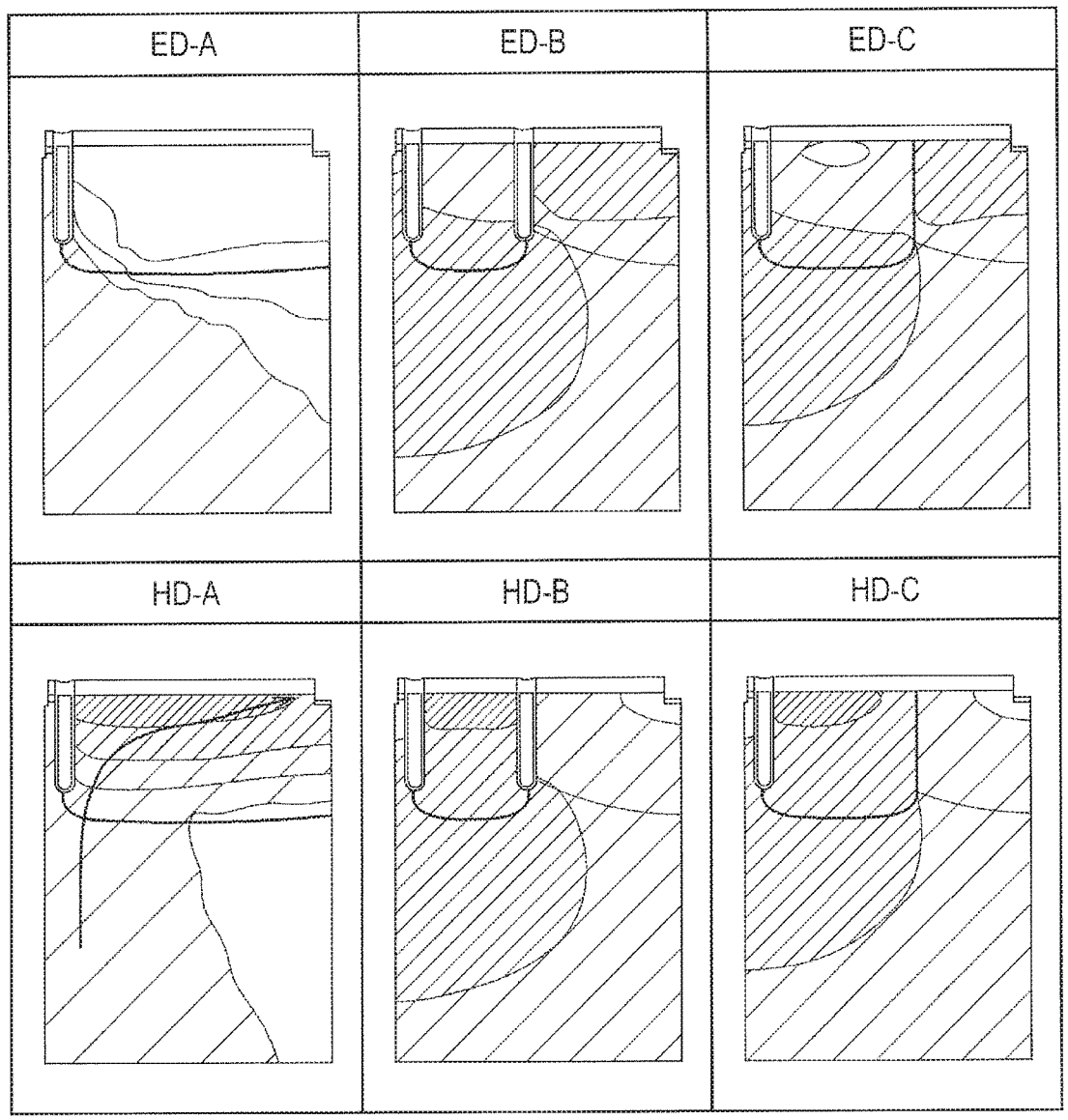
FIG. 36 is a view to explain an electron concentration and a hole concentration.

FIG. 35 illustrates electron current density distribution and hole current density distribution of each of the structures A, B, and C of FIG. 32. EC-A shows the electron current density distribution of the structure A, EC-B shows the electron current density distribution of the structure B, EC-C shows the electron current density distribution of the structure C, HC-A shows the hole current density distribution of the structure A, HC-B shows the hole current density distribution of the structure B, and HC-C shows the hole current density distribution of the structure C. FIG. 36 illustrates electron concentration distribution and hole concentration distribution of each of the structures A, B, and C of FIG. 32. ED-A shows the electron concentration distribution of the structure A, ED-B shows the electron concentration distribution of the structure B, EC-C shows the electron concentration distribution of the structure C, HD-A shows the hole concentration distribution of the structure A, HD-B shows the hole concentration distribution of the structure B, and HD-C shows the hole concentration distribution of the structure C. In FIGS. 35 and 36, higher hatching density shows higher density or higher concentration.

As shown in HC-A of FIG. 35, in the structure A, hole current is discharged through a deep p layer having a low resistance against holes. The arrow indicates a direction of the hole current. As shown in EC-B and EC-C as well as HC-B and HC-C of FIG. 35, the structures C and B have similar hole density distributions and similar electron density distributions.

As shown in ED-B and ED-C as well as HD-B and HD-C of FIG. 36, the structures C and B have similar carrier storage amounts (hole concentration distributions and electron concentration distributions). In particular, the floating regions have substantially the same carrier concentration levels. Consequently, isolation by the structure C (high-concentration n-type layer) secures a function of the floating layer (no carriers (holes) are discharged) in the same way as isolation by the structure B (formation of the trench emitter electrode).

In the Example, the hole barrier region 24a (resistance region against holes) is provided between the p-type floating region 16 and the contact trench 11 to isolate the p-type floating region 16. As a result, a structure, in which the p-type floating region 16 is sandwiched by the trench electrodes having different potentials (the trench gate electrode 14 and the trench emitter electrode 14e), can be formed, so that the p-type floating region 16 can serve as the floating region.

Modifications

Typical modifications are now exemplified. In the following description of the modifications, a portion having a configuration and a function similar to those in the above-described Example may be designated by a reference numeral similar to that in the Example. The description in the Example may be appropriately used for such a portion within a technically consistent scope. Part of the Example and all or part of the modifications are appropriately compositely used within a technically consistent scope.

First Modification

Figure 37:
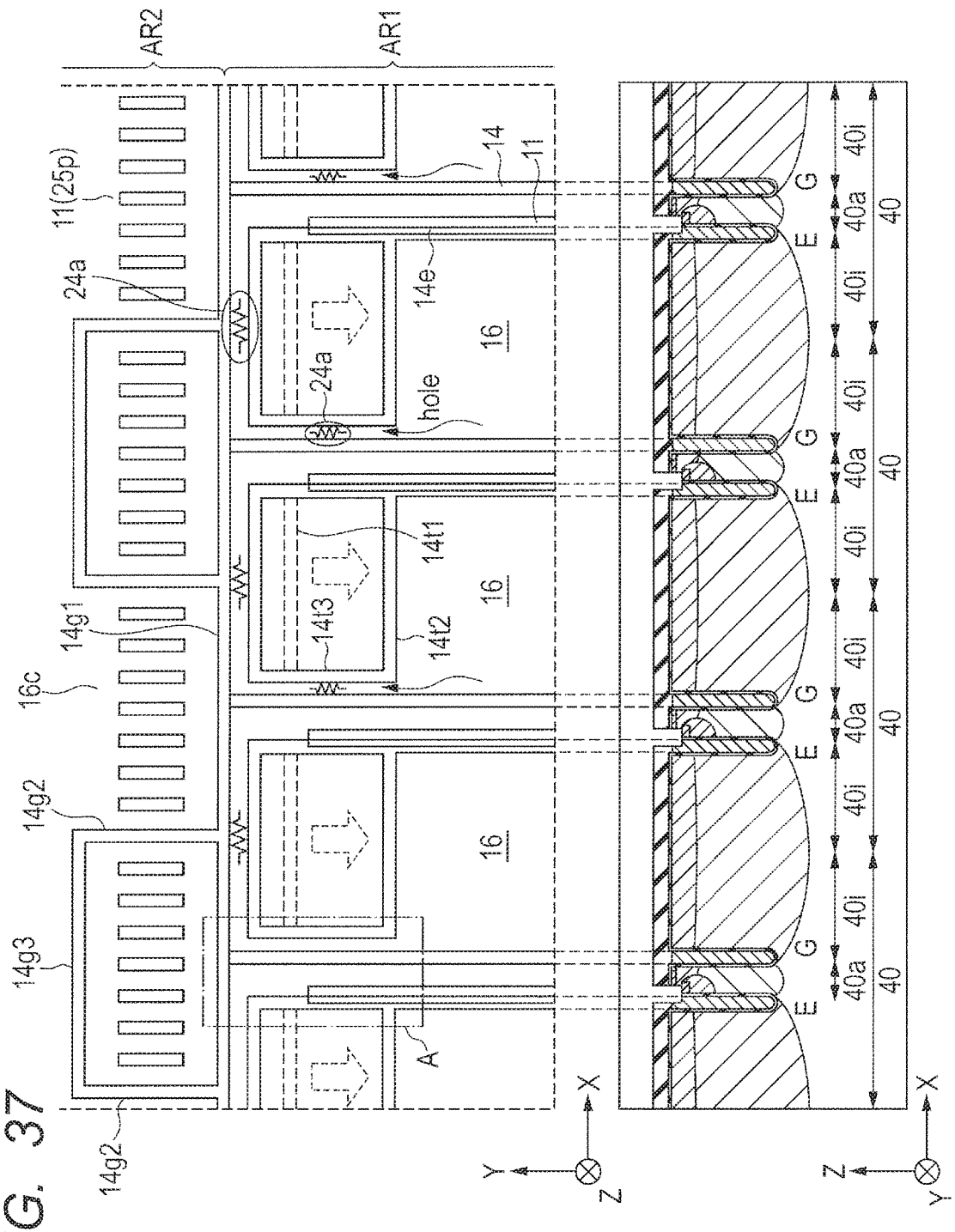
FIG. 37 illustrates a semiconductor device of a first modification.

FIG. 37 includes a plan view and a sectional view of a semiconductor device of a first modification.

The semiconductor device of the first modification is the same as that of the Example except for a layout of the trench end electrodes 14t1, 14t2, and 14t3 provided at ends of the p-type floating region 16. The hole barrier region 24a is formed between the trench gate electrode 14 and the trench end electrode 14t3. Length of the trench end electrode 14t3 extending in the y-axis direction is adjusted to be longer than that in the Example as shown by a broken-line arrow in FIG. 37, for example. This makes it possible to increase resistance against holes, and thus improve the isolation (hole barrier) effect. Such adjustment increases a region between the trench gate electrode 14 and the trench end electrode 14t3, which can contribute to adjustment of increasing gate capacitance (herein, capacitance between the gate and the emitter), so that the degree of freedom in design can be improved. Field strength of a portion enclosed by a broken line A is similar to that of the EGE-type IGBT.

Second Modification

Figure 38:
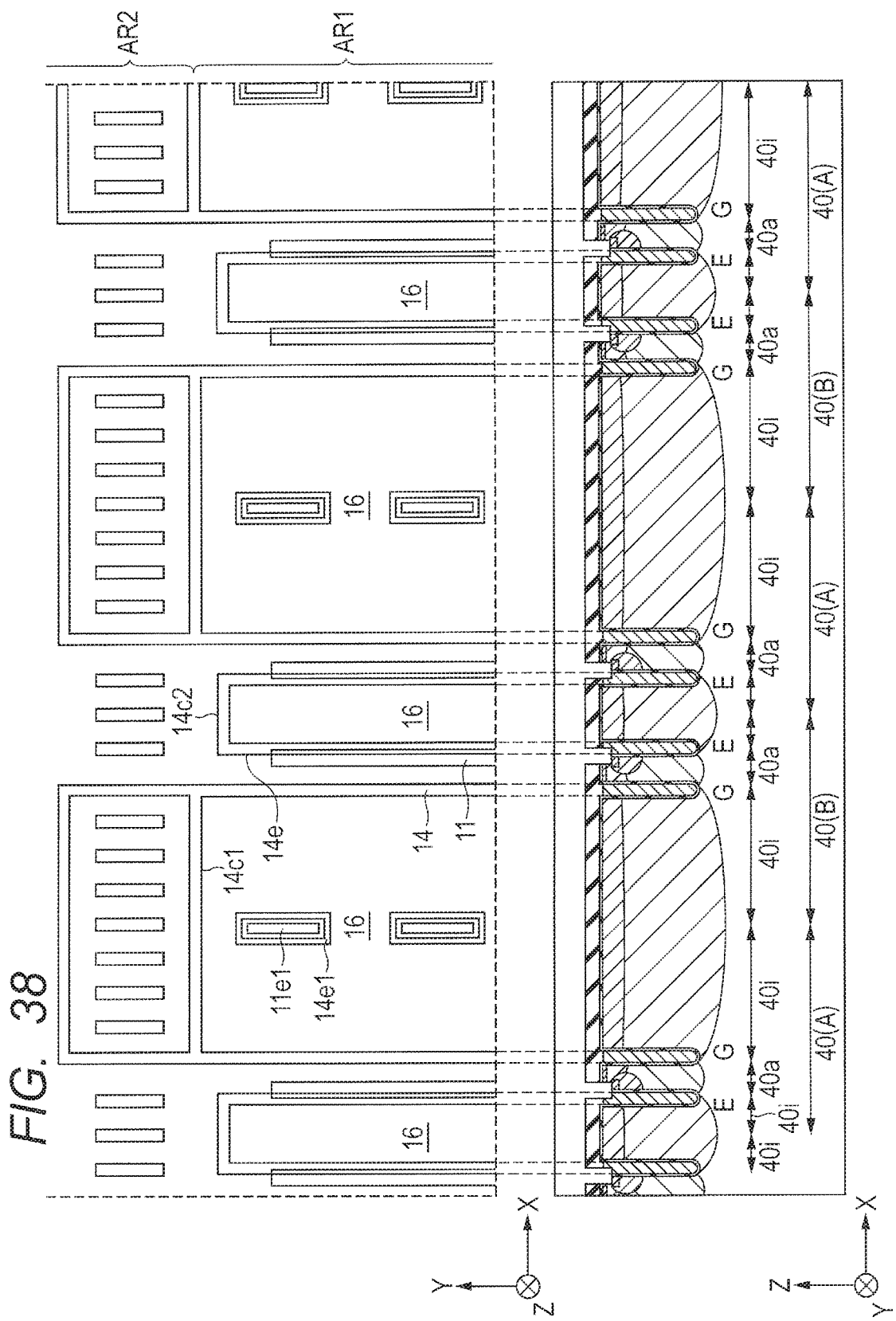
FIG. 38 illustrates a semiconductor device of a second modification.

FIG. 38 includes a plan view and a sectional view of a semiconductor device of a second modification.

In the Example, unit cell regions 40 each including one trench emitter electrode 14e and one trench gate electrode 14 are disposed in the same direction in the x-axis direction (only the unit cell regions 40(A) are disposed). On the other hand, in the semiconductor device of the second modification, unit cell regions 40(B), each including one trench emitter electrode 14e and one trench gate electrode 14, are disposed in a mirror-inverted manner in the x-axis direction (unit cell regions 40(A) and unit cell regions 40(B) as a mirror inversion of the unit cell regions 40(A) are alternately disposed). This makes it possible to enclose the p-type floating region 16 by the trench gate electrodes 14 or the trench emitter electrodes 14e (trench electrodes having the same electric potential), and thus the hole barrier region is not necessary to be provided unlike the Example.

On the other hand, the p-type floating region 16 surrounded by the two trench gate electrodes 14 and a trench coupling electrode 14c1 coupling the trench gate electrodes 14 together partially forms a parasitic p channel-type MOSFET to suppress a variation in gate potential. A plurality of trench emitter electrodes 14e1 each having a frame shape in planar view are provided to form the parasitic p channel-type MOSFET. Each trench emitter electrode 14e1 is coupled to the emitter electrode 8 via a contact trench 11e1. The p-type floating region 16 surrounded by the two trench emitter electrodes 14e and a trench coupling electrode 14c2 coupling the trench emitter electrodes 14e together forms a parasitic p channel-type MOSFET having a high hole discharge effect, and is thus made as small as possible so as not to reduce the IE effect.

Third Modification

Figure 39:
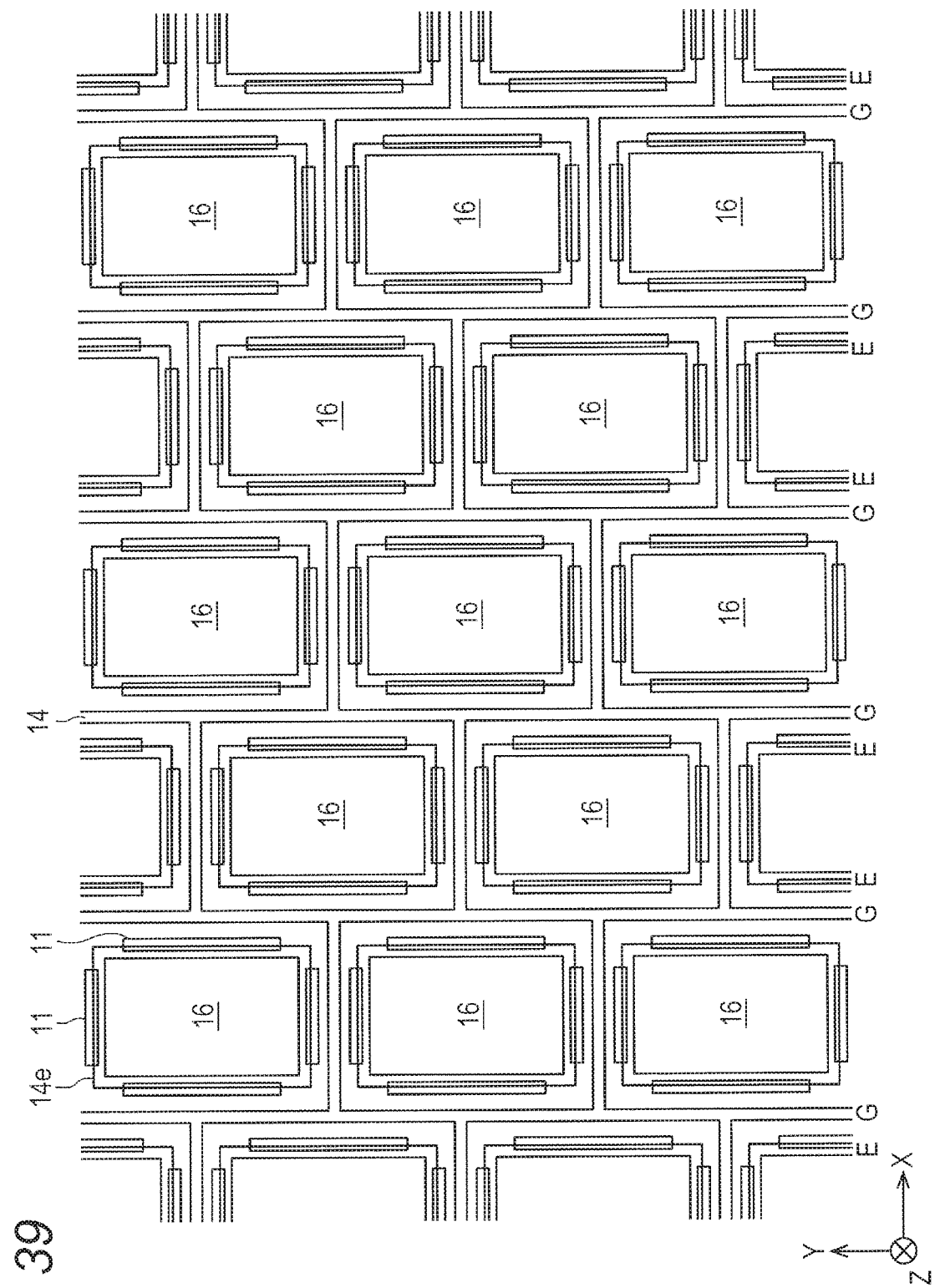
FIG. 39 illustrates a semiconductor device of a fourth comparative example.
Figure 40:
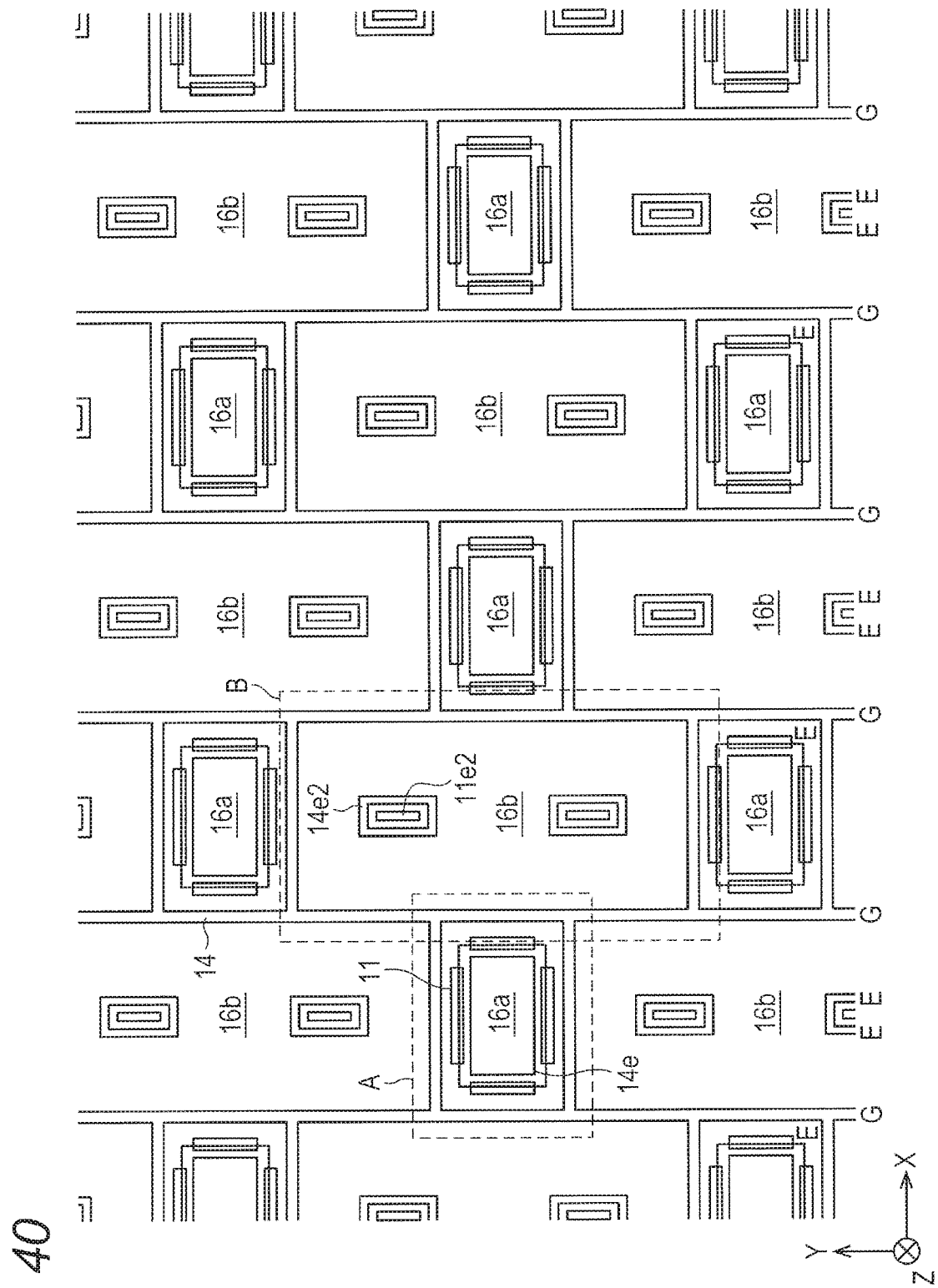
FIG. 40 illustrates a semiconductor device of a third modification.

FIG. 39 is a plan view of a semiconductor device of a fourth comparative example. FIG. 40 is a plan view of a semiconductor device of a third modification.

Although the semiconductor device of each of the Example and the first and second modifications has a structure of a stripe pattern as a plan layout, the semiconductor device of the fourth comparative example has a mesh pattern based on the EGE-S-type IGBT as a plan layout.

For example, a product (small chip) having a relatively small current capacity such as an intelligent power module (IPM) is desired to have a large gate capacitance to secure an electro-static discharge (ESD) tolerance and stabilize charge and discharge of a gate (small chip size easily causes jumping of current or voltage, and large oscillation). However, in the mesh type based on the EGE-S-type IGBT, as shown in FIG. 39, the p-type floating region 16 is surrounded by a flame-like trench emitter electrode 14e and coupled to the emitter electrode 8 via contact trenches 11 along the trench emitter electrode 14e. Hence, the number of the parasitic p channel-type MOSFETs formed for all the p-type floating regions 16 increases compared with the stripe structure (increases in correspondence to the increased number of contacts in a lateral direction (x-axis direction)). Hence, although the gate capacitance can be secured, the hole discharge effect is enhanced, so that the IE effect is greatly reduced.

As shown in FIG. 40, the floating region is configured by a p-type floating region 16a enclosed by a broken line A and a p-type floating region 16b enclosed by a broken line B. The p-type floating region 16a is surrounded by a frame-like trench emitter electrode 14e and coupled to the emitter electrode 8 via contact trenches 11e along the trench emitter electrode 14e, leading to a large region of the parasitic p channel-type MOSFET. This increases a hole discharge effect (reduction in the IE effect) of the parasitic p channel-type MOSFET, and thus the p-type floating region 16a is disposed with an area as small as possible.

In the p-type floating region 16b, the trench emitter electrode 14e2 having a frame shape in planar view and the contact trench 11e2 coupled to the emitter electrode 8 are disposed to form the parasitic p channel-type MOSFET in order to suppress influence of a variation in gate potential. However, the trench emitter electrode 14e2 is disposed to a minimum so as not to reduce the IE effect. The p-type floating region 16b has a small area of the parasitic p channel-type MOSFET, which makes it easier to improve the IE effect, and is thus formed to occupy a larger area than the p-type floating region 16a to improve the IE effect.

The third modification makes it possible to provide a mesh structure while increasing the IE effect of the floating region. Increasing cell density may secure a large gate capacitance. This makes it possible to secure the ESD tolerance of a product (small chip) having a small current capacity, leading to stability of switching operation.

Fourth Modification

Figure 41:
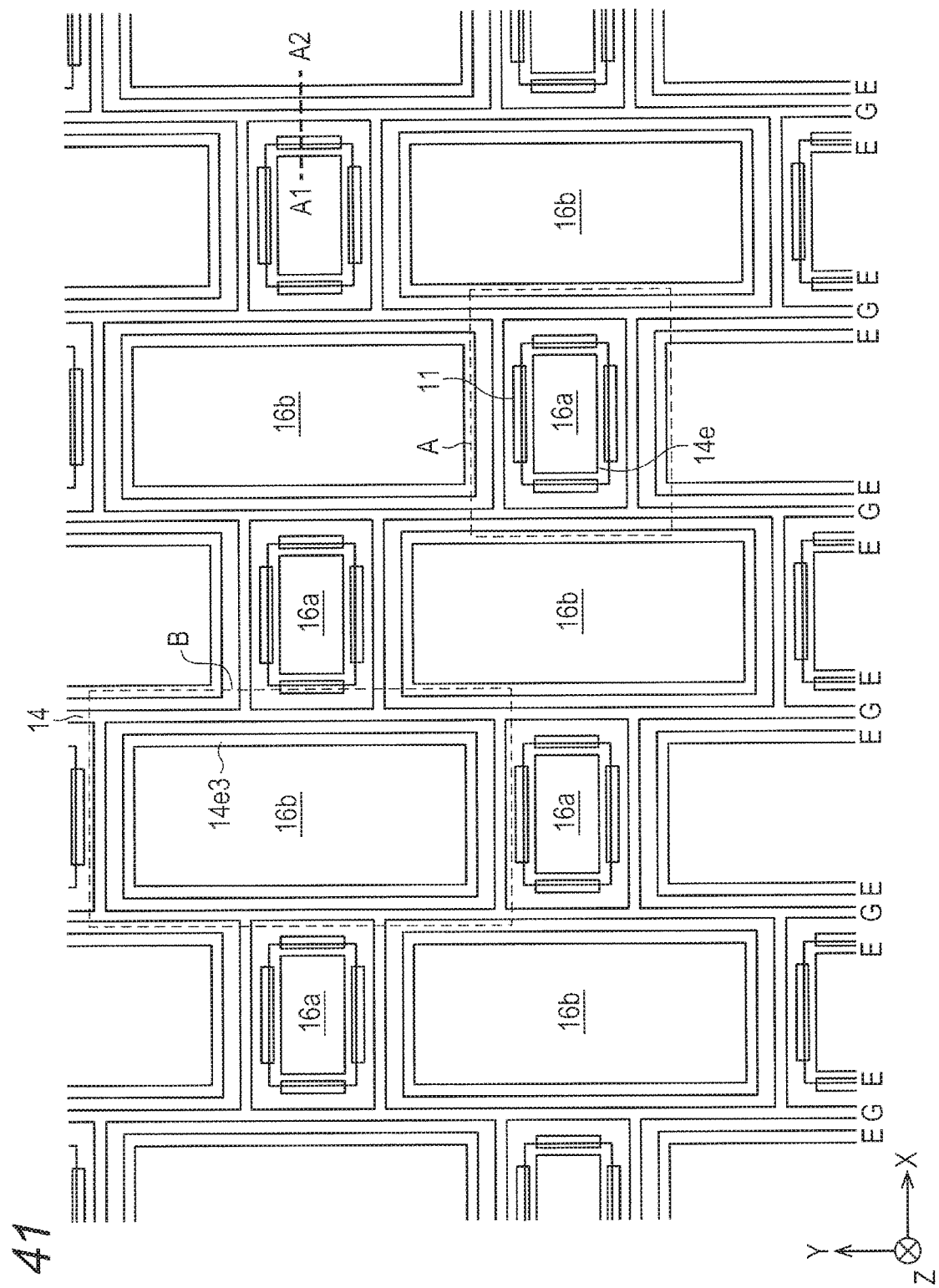
FIG. 41 illustrates a semiconductor device of a fourth Modification.
Figure 42:
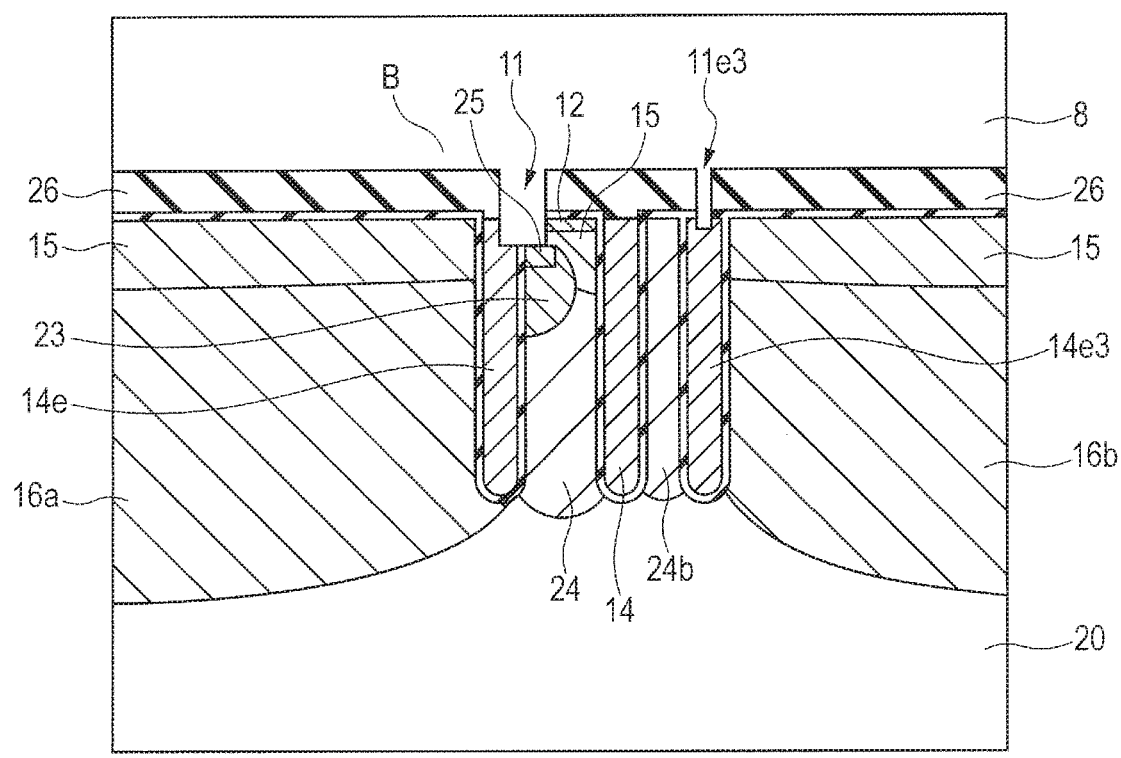
FIG. 42 illustrates the semiconductor device of the fourth modification.
Figure 43:
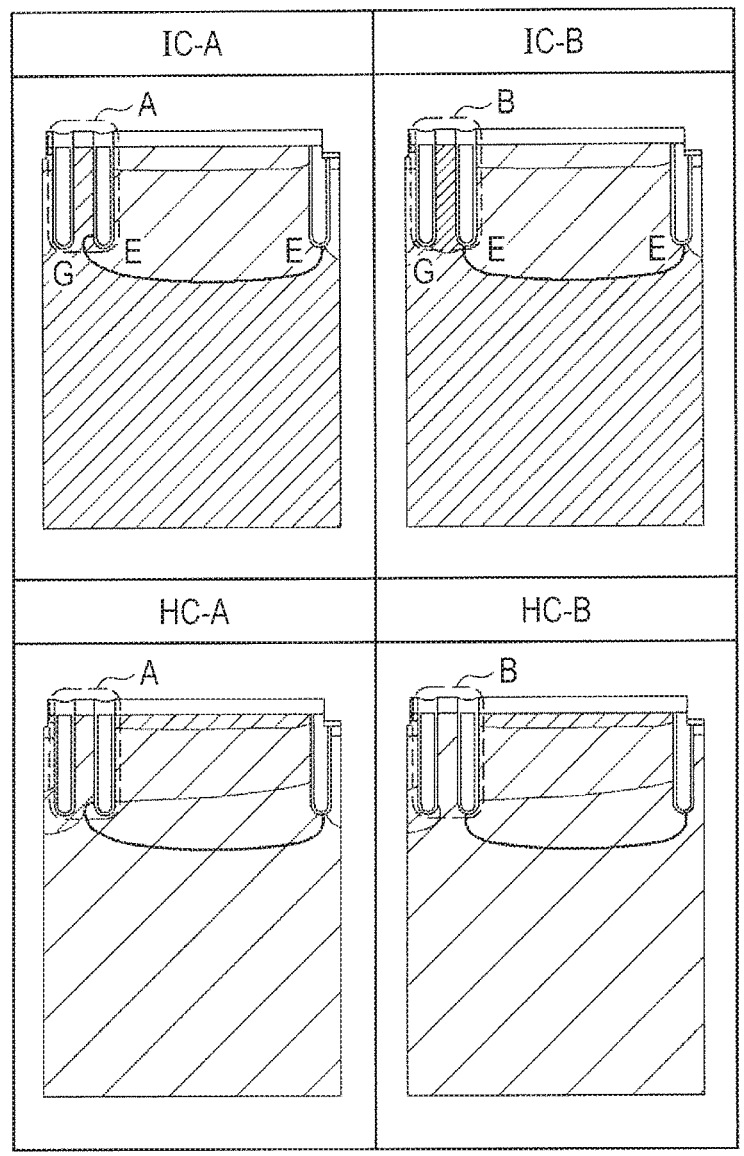
FIG. 43 is a view to explain, using TCAD, an effect of suppressing an increase in electric potential caused by carrier storage.

FIG. 41 is a plan view of a semiconductor device of a fourth modification. FIG. 42 is a sectional view along a line A1-A2 in FIG. 41. FIG. 43 is a view to explain, using 2D-TCAD, an effect of suppressing an increase in electric potential caused by storage of carriers (herein holes) in the region 24b in FIG. 42.

As shown in FIG. 41, the floating region is configured by a p-type floating region 16a enclosed by a broken line A and a p-type floating region 16b enclosed by a broken line B. The p-type floating region 16a has a configuration similar to that of the third modification. The p-type floating region 16a has a large region of the parasitic p channel-type MOSFET, and is thus disposed with an area as small as possible. In the p-type floating region 16b, a trench emitter electrode 14e3 is disposed in a frame shape in proximate to the trench gate electrode 14. The trench emitter electrode 14e3 is coupled to the emitter electrode 8 via a contact trench 11e3. The p-type floating region 16b has a small region of the parasitic p channel-type MOSFET, which makes it easier to improve the IE effect. Hence, the p-type floating region 16b is formed to occupy a larger area than the p-type floating region 16a to improve the IE effect. The p-type floating region 16b is isolated by a trench having an emitter potential without formation of the parasitic p channel-type MOSFET. Consequently, the IE effect can be more improved than in the third modification.

As shown in FIG. 42, the trench emitter electrode 14e3 is also provided between the trench gate electrode 14 and the p-type floating region 16b. As a result, the trench gate electrode 14 is isolated from the p-type floating region 16b, resulting in suppression of influence of a variation in electric potential of the floating region on the gate. A high-concentration n-type layer 24b is formed instead of the p-type body region 15 between the trench gate electrode 14 and the trench emitter electrode 14e3. The high-concentration n-type layer 24b formed between the trench gate electrode 14 and the trench emitter electrode 14e3 suppresses entrance of holes into between the trench gate electrode 14 and the trench emitter electrode 14e3 to prevent an increase in electric potential due to hole storage. This makes it possible to further improve isolation capability. The high-concentration n-type layer 24b is formed at the same time and in the same way with formation of the n-type hole barrier region 24 in the active cell region, thereby the number of process steps is not increased.

IC-A and HC-A of FIG. 43 show impurity concentration distribution and hole concentration distribution (conduction state (on state)), respectively, of a structure (structure A) having no high-concentration n-type layer between the trench gate electrode 14 and the trench emitter electrode 14e. IC-B and HC-B of FIG. 43 show impurity concentration distribution and hole concentration distribution (conduction state (on state)), respectively, of a structure (structure B) having the high-concentration n-type layer between the trench gate electrode 14 and the trench emitter electrode 14e. In FIG. 43, higher hatching density shows higher concentration.

As shown in IC-A and IC-B of FIG. 43, impurity concentration of a portion (portion enclosed by a broken line A or B) between the trench gate electrode 14 and the trench emitter electrode 14e is higher in the structure B than in the structure A. As shown in HC-A and HC-B of FIG. 43, hole concentration of the portion (portion enclosed by the broken line) between the trench gate electrode 14 and the trench emitter electrode 14e is lower in the structure B than in the structure A. In the structure A, the portion enclosed by the broken line has substantially the same hole concentration as that of the floating region, and thus electric potential increases due to carrier (hole) storage at the same level as that of the floating region. In the structure B, entrance of holes is prevented in the portion enclosed by the broken line B, and thus hole concentration can be reduced (carrier storage amount can be suppressed) and potential increase is suppressed in the portion.

In the fourth modification having the structure B, carrier (hole) concentration is low between the trench gate electrode 14 and the trench emitter electrode 14e3, and thus electric potential is not increased. Consequently, isolation capability is further improved compared with the structure having no high-concentration n-type layer.

The fourth modification achieves a mesh structure while the IE effect of the floating region is improved. A larger gate capacity can also be secured than in the third modification. The IE effect can be further improved compared with the third modification by the isolation structure shown in FIG. 42.

Fifth Modification

The isolation structure of the fourth modification can be applied to the stripe pattern as in the Example.

Figure 44:
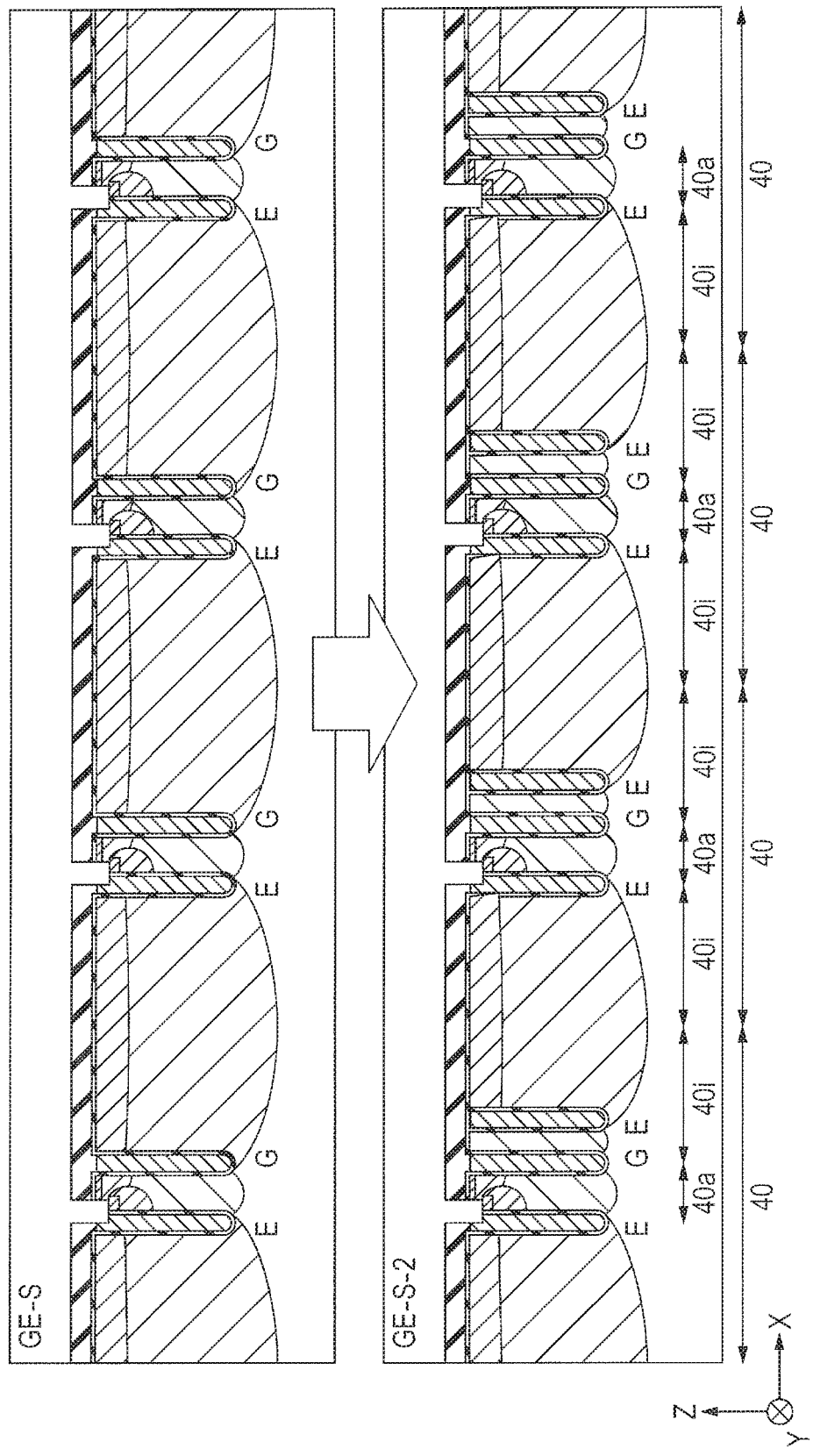
FIG. 44 illustrates a semiconductor device of a fifth modification.
Figure 45:
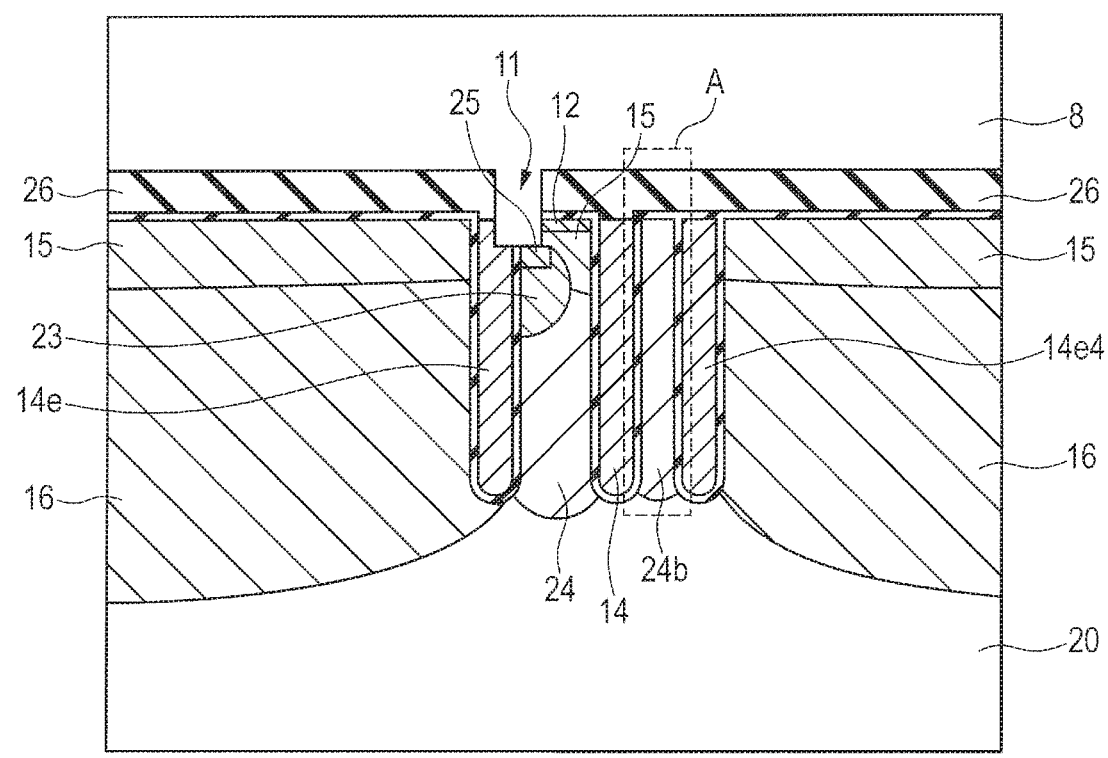
FIG. 45 illustrates the semiconductor device of the fifth modification.
Figure 46:
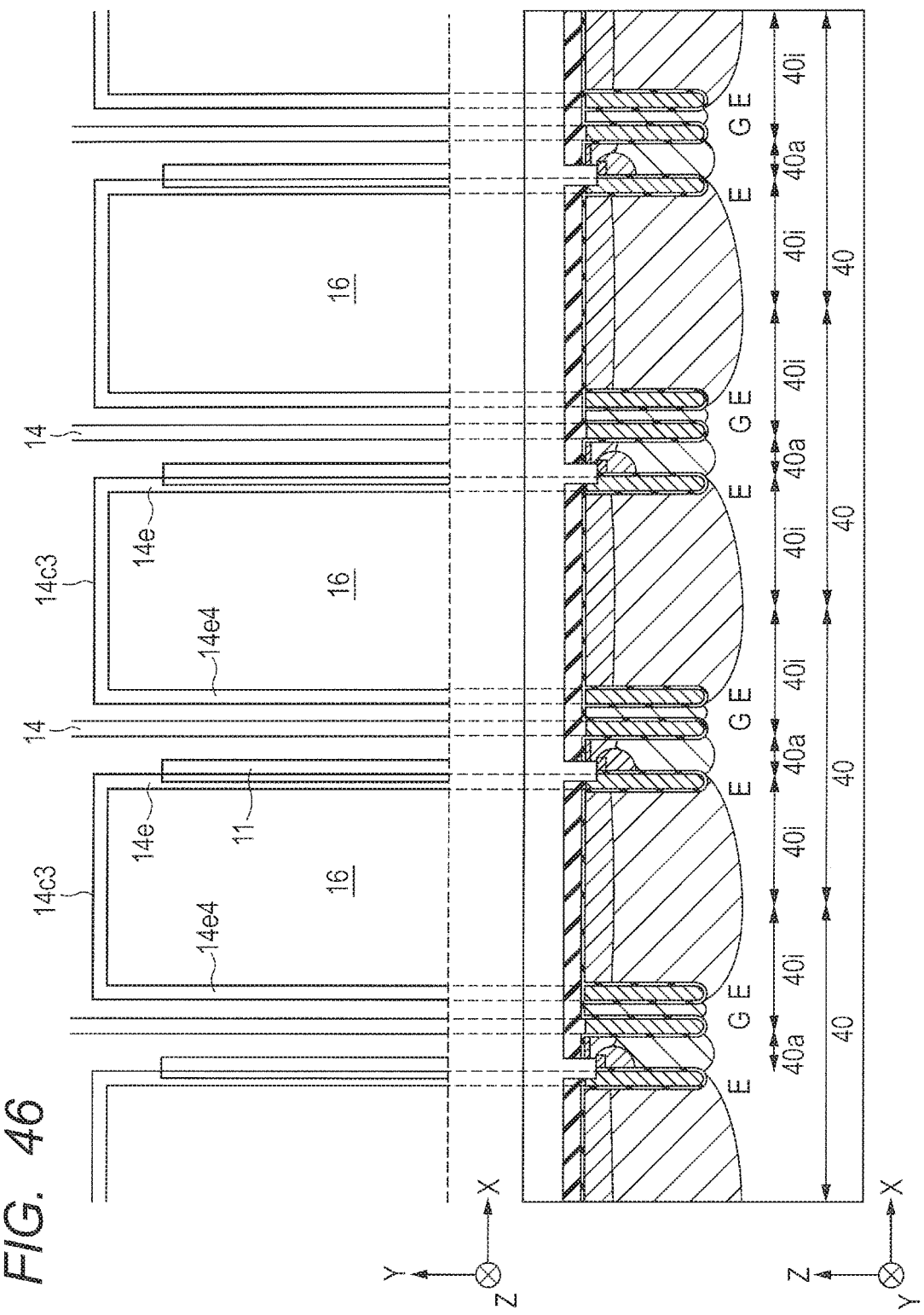
FIG. 46 illustrates the semiconductor device of the fifth modification.

FIG. 44 includes a sectional view of the semiconductor device of the Example and a sectional view of a semiconductor device of a fifth modification. FIG. 45 is a major-part enlarged view of FIG. 44. FIG. 46 includes a plan view and a sectional view of the semiconductor device of the fifth modification. The semiconductor device of the fifth modification is a GE-S-type IGBT, and may be referred to as GE-S_2.

The semiconductor device of the fifth modification further has a trench emitter electrode 14e4 between the trench gate electrode 14 and the p-type floating region 16 of the semiconductor device of the Example. The trench gate electrode 14, the trench emitter electrode 14e, and the trench emitter electrode 14e4 extend in the y-axis direction. The trench gate electrode 14 is coupled to the trench emitter electrode 14e4 by the trench coupling electrode 14c3. The high-concentration n-type layer 24b is formed instead of the p-type body region 15 between the trench gate electrode 14 and the trench emitter electrode 14e4. The trench gate electrode 14 is isolated from the p-type floating region 16, which suppresses influence of a variation in electric potential of the p-type floating region 16 on the gate, leading to further improvement in stability.

Figure 48A:
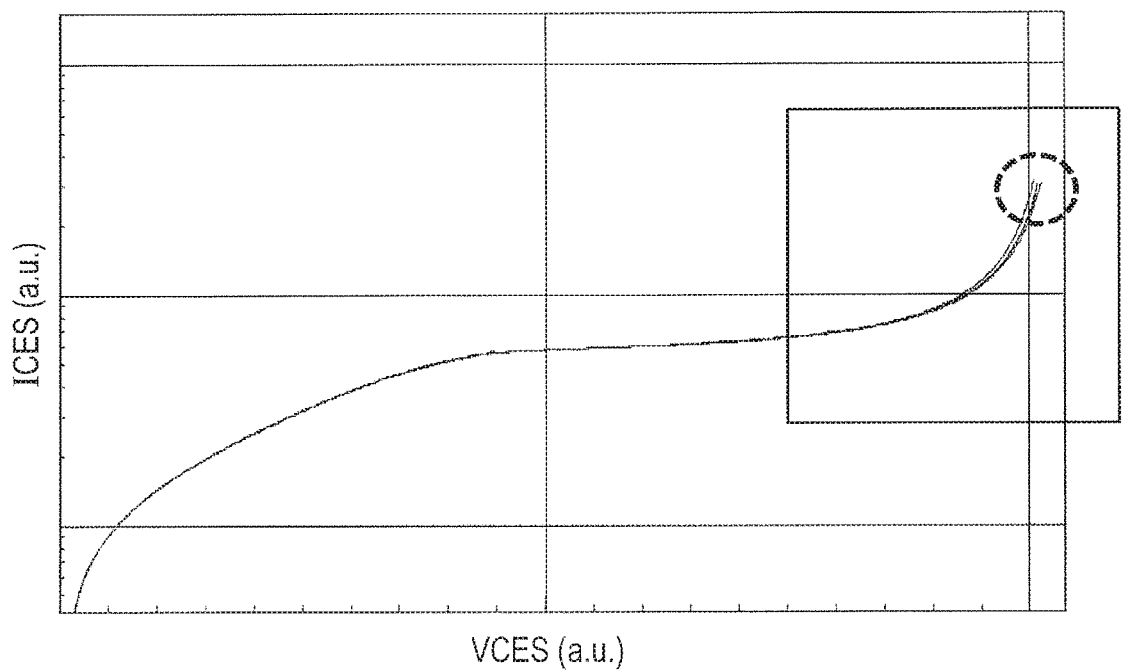
FIG. 48A is a view to explain withstand voltage of the semiconductor device of the fifth modification.
Figure 48B:
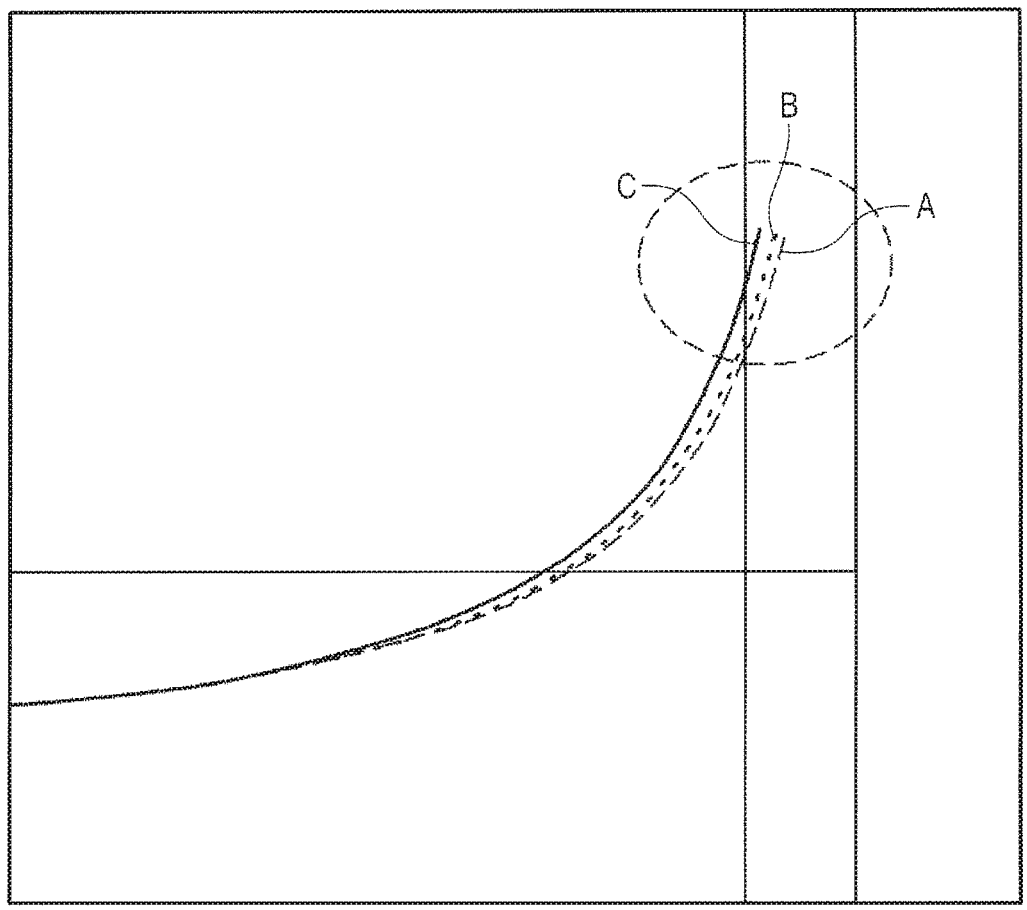
FIG. 48B is a view to explain the withstand voltage of the semiconductor device of the fifth modification.
Figure 50:
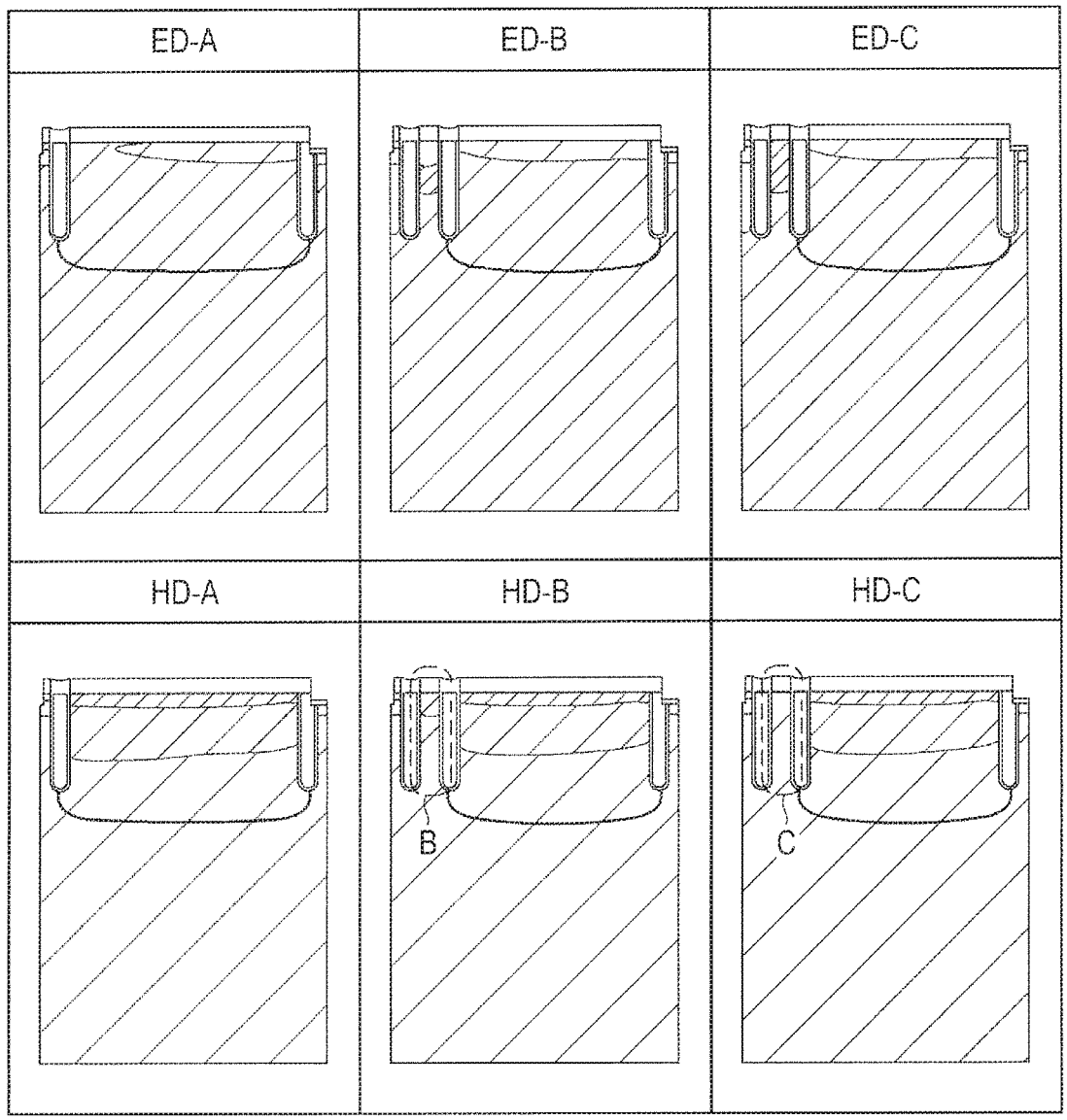
FIG. 50 is a view to explain carrier density distribution of the semiconductor device of the fifth modification.

FIG. 47 illustrates field strength distribution of the semiconductor device of the fifth modification. FIG. 48A illustrates collector withstand voltage characteristics (VCES-ICES) of the semiconductor device of the fifth modification. FIG. 48B is an enlarged view of a portion enclosed by a square in FIG. 48A. FIG. 49 illustrates current density distribution of the semiconductor device of the fifth modification. FIG. 50 illustrates carrier concentration distribution of the semiconductor device of the fifth modification.

IC-A and FI-A of FIG. 47 show impurity concentration distribution and field strength distribution, respectively, of the structure (structure A) of the Example. IC-B and FI-B show impurity concentration distribution and field strength distribution, respectively, of a structure (structure B) having a high-concentration n-type layer and a shallow p-type layer (p-type body region) in a portion (portion enclosed by a broken line B) between the trench gate electrode and the trench emitter electrode. IC-C and FI-C show impurity concentration distribution and field strength distribution, respectively, of a structure (structure C) having only the high-concentration n-type layer in a portion (portion enclosed by a broken line C) between the trench gate electrode and the trench emitter electrode. In FIG. 47, higher hatching density shows higher concentration or higher field strength.

As shown in FIG. 47, each of the structures B and C is reduced in field strength of the bottom portion of the trench gate electrode that is not covered with the floating region, as shown by broken-line circles BG and CG. The bottom portion of the trench emitter electrode having an emitter potential is also somewhat reduced in field strength. This is due to an increase in trench region (oxide film region) that mainly withstands the electric field.

FIG. 48A shows a graph of a relationship between a collector withstand voltage VCES and a collector leakage current ICES in an off state (gate voltage VG=0). In the structure C, the collector withstand voltage VCES does not lower but rather slightly rises compared with the structure A or B. FIG. 47 shows a state of the device under a condition shown in a broken line in FIG. 48A or 48B. As shown in the field strength distribution of FIG. 47, a field strength is reduced by insertion of the trench (oxide film region). Hole storage is therefore more suppressed between the gate electrode and the trench emitter electrode; hence, a shallow p-type layer (p-type body region) is unnecessary between the trench gate electrode and the trench emitter electrode.

EC-A and HC-A of FIG. 49 show electron current density distribution and hole current density distribution, respectively, of the structure A, EC-B and HC-B show electron current density distribution and hole current density distribution, respectively, of the structure B, and EC-C and HC-C show electron current density distribution and hole current density distribution, respectively, of the structure C. In FIG. 49, higher hatching density shows higher current density.

The structure B can suppress the hole current density distribution of a region (region corresponding to the sign 24b of FIG. 45) between the trench gate electrode and the emitter electrode. The structure C can also suppress the hole current density distribution to a level lower than that of the structure B.

ED-A and HD-A of FIG. 50 show electron density distribution and hole density distribution, respectively, of the structure A, ED-B and HD-B show electron density distribution and hole density distribution, respectively, of the structure B, and ED-C and HD-C show electron density distribution and hole density distribution, respectively, of the structure C. In FIG. 50, higher hatching density shows higher density.

As shown by broken lines B and C, in the structure B, the hole concentration is lower than in the floating region but high in a shallow p-type layer portion. In the structure C, the hole concentration is generally lower than in the floating region.

Sixth Modification

Figure 51:
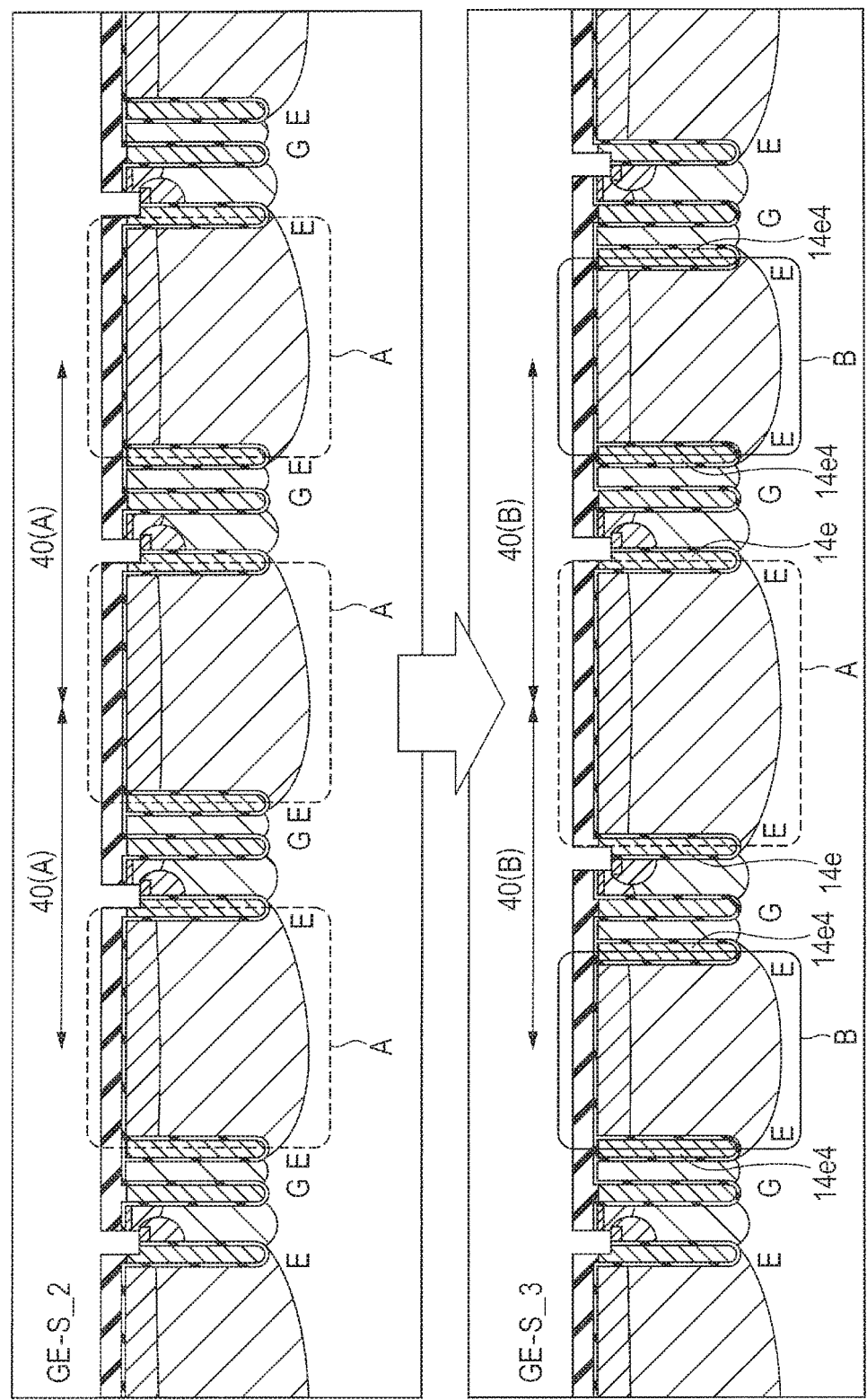
FIG. 51 illustrates a semiconductor device of a sixth modification.

FIG. 51 includes sectional views of the semiconductor devices of the fifth and sixth modifications. The semiconductor device of the sixth modification is a GE-S-type IGBT, and is referred to as GE-S_3.

In the fifth modification, unit cell regions 40 each including the trench emitter electrode 14e, the trench gate electrode 14, and the trench emitter electrode 14e4 are disposed in the same direction in the x-axis direction (only the unit cell regions 40(A) are disposed). On the other hand, in the semiconductor device of the sixth modification, unit cell regions 40 each including the trench emitter electrode 14e, the trench gate electrode 14, and the trench emitter electrode 14e4 are disposed in a mirror-inverted manner in the x-axis direction (unit cell regions 40(A) and unit cell regions 40(B) as a mirror inversion of the unit cell regions 40(A) are alternately disposed). The two trench emitter electrodes 14e4 sandwiching the p-type floating region 16 are coupled to each other by an undepicted conductor layer and thus coupled to the emitter electrode 8.

Although the parasitic p channel-type MOSFET is coupled to any of the floating regions in the Example, p-type floating regions coupled to the parasitic p channel-type MOSFETs and p-type floating regions uncoupled to the parasitic p channel-type MOSFETs are alternately disposed in the sixth modification. Consequently, since the region of the parasitic p channel-type MOSFET is smaller in the sixth modification than in the fifth modification, the sixth modification can be further improved in the IE effect.

Seventh Modification

Figure 52:
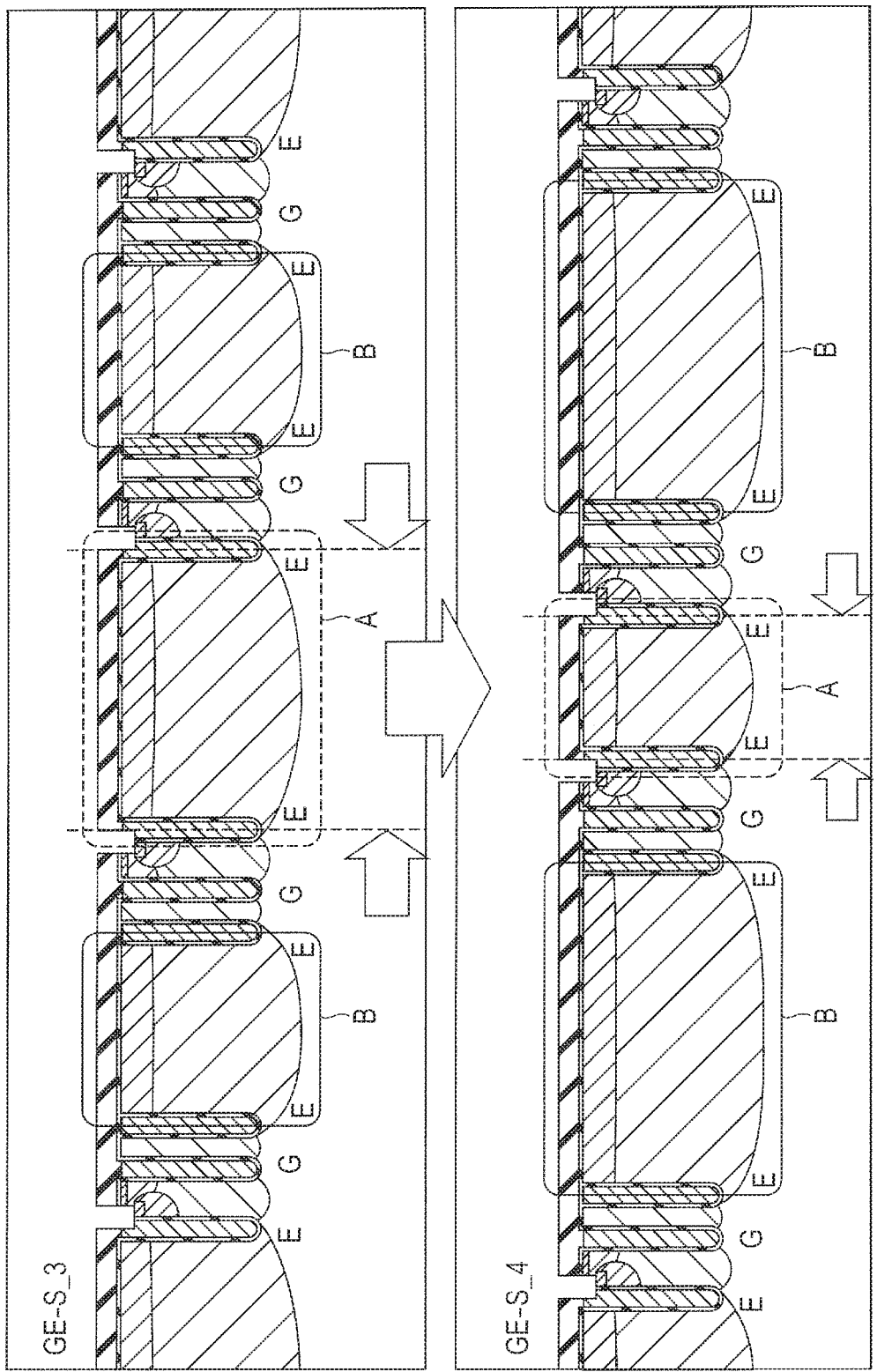
FIG. 52 illustrates a semiconductor device of a seventh modification.

FIG. 52 includes sectional views of the semiconductor devices of the sixth and seventh modifications. The semiconductor device of the seventh modification is a GE-S-type IGBT, and is referred to as GE-S_4.

The semiconductor device of the seventh modification is formed by modifying the semiconductor device of the sixth modification in such a manner that width (length in the x-axis direction) of a p-type floating region, which is coupled to the parasitic p channel-type MOSFET, is reduced, and width (length in the x-axis direction) of a p-type floating region, which is not coupled to the parasitic p channel-type MOSFET, is increased. The area of the parasitic p channel-type MOSFET is thus reduced, which allows the IE effect to be further improved.

Eighth Modification

Figure 53:
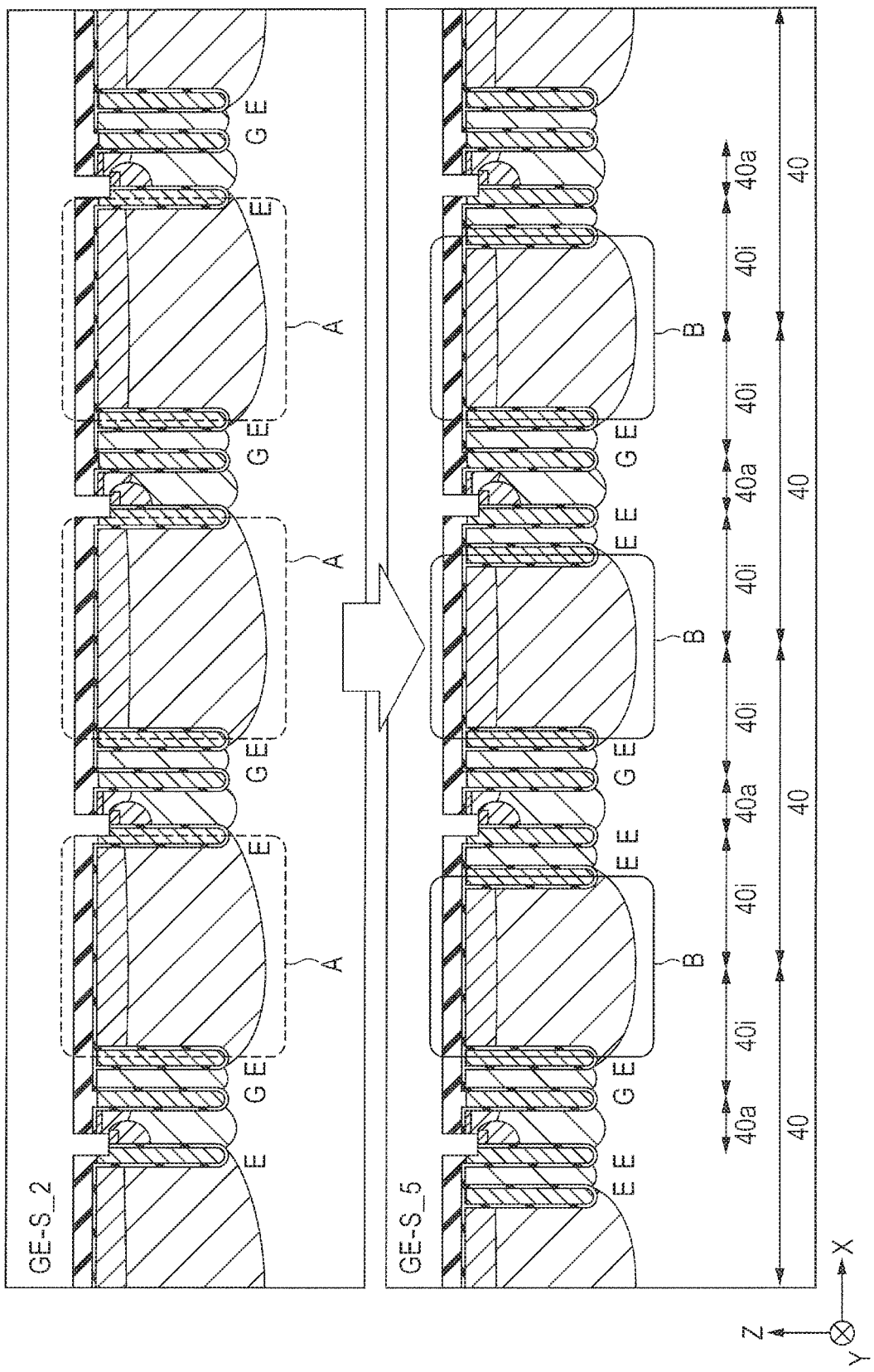
FIG. 53 illustrates a semiconductor device of an eighth modification.
Figure 54:
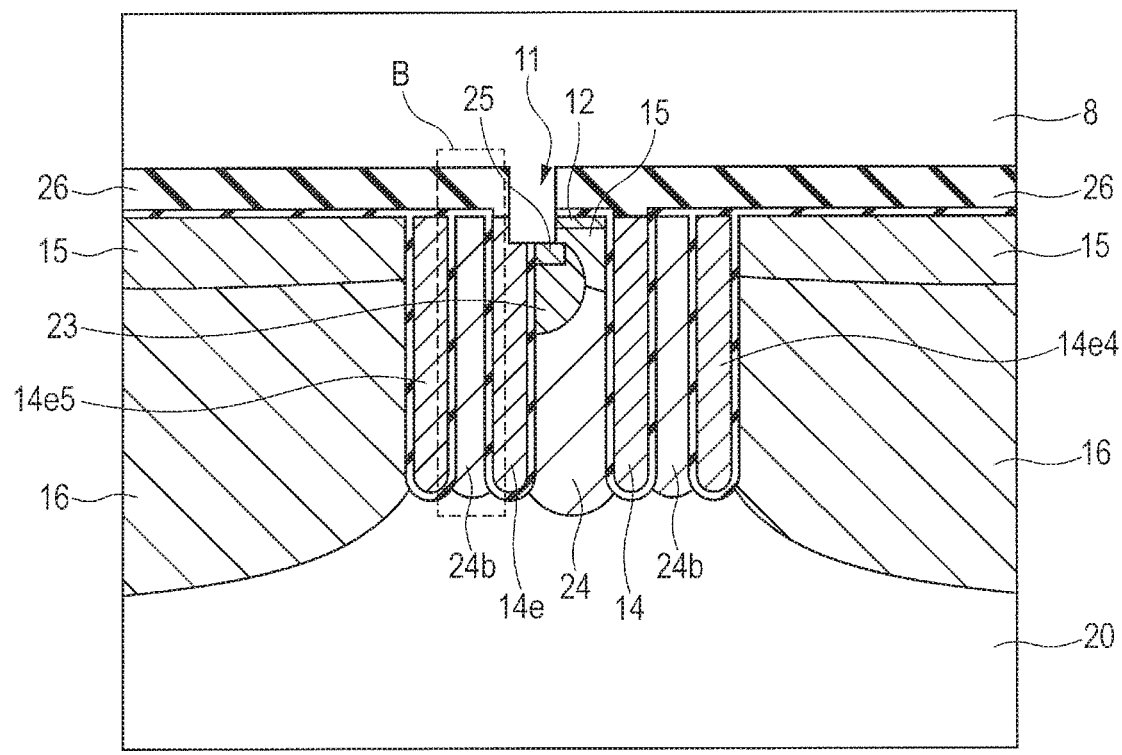
FIG. 54 illustrates the semiconductor device of the eighth modification.

FIG. 53 includes sectional views of the semiconductor devices of the fifth and eighth modifications. FIG. 54 is a major-part enlarged view of FIG. 53. The semiconductor device of the eighth modification is a GE-S-type IGBT, and is referred to as GE-S_5.

The semiconductor device of the eighth modification is formed by modifying the semiconductor device of the fifth modification in such a manner that a trench emitter electrode 14e5 is further provided between the trench emitter electrode 14e and the p-type floating region 16. The high-concentration n-type layer 24b is formed instead of the p-type body region 15 between the trench gate electrode 14 and the trench emitter electrode 14e4 and between the trench emitter electrode 14e and the trench emitter electrode 14e5. The trench emitter electrodes 14e4 and 14e5 sandwiching the p-type floating region 16 are coupled to each other by an undepicted conductor layer and thus coupled to the emitter electrode 8. This makes it possible to suppress the hole discharge effect by the parasitic p channel-type MOSFET and improve the IE effect.

The structure of the eighth modification does completely not have the parasitic p channel-type MOSFET, and is thus highest in the IE effect.

In the semiconductor devices of the fifth to seventh modifications, the trench emitter electrodes 14e4 in a portion enclosed by a broken line A as shown in FIG. 45 isolates the p-type floating region 16 from the trench gate electrode 14, and thus has an effect of suppressing influence of a displacement current on the gate. On the other hand, the semiconductor device of the eighth modification has a structure, in which the trench emitter electrodes 14e5 in a portion enclosed by a broken line B as shown in FIG. 54 isolates the p-type floating region 16 from the trench emitter electrode 14e, and thus has an effect of suppressing hole discharge by the parasitic p channel-type MOSFET formed in this portion.

Figure 55:
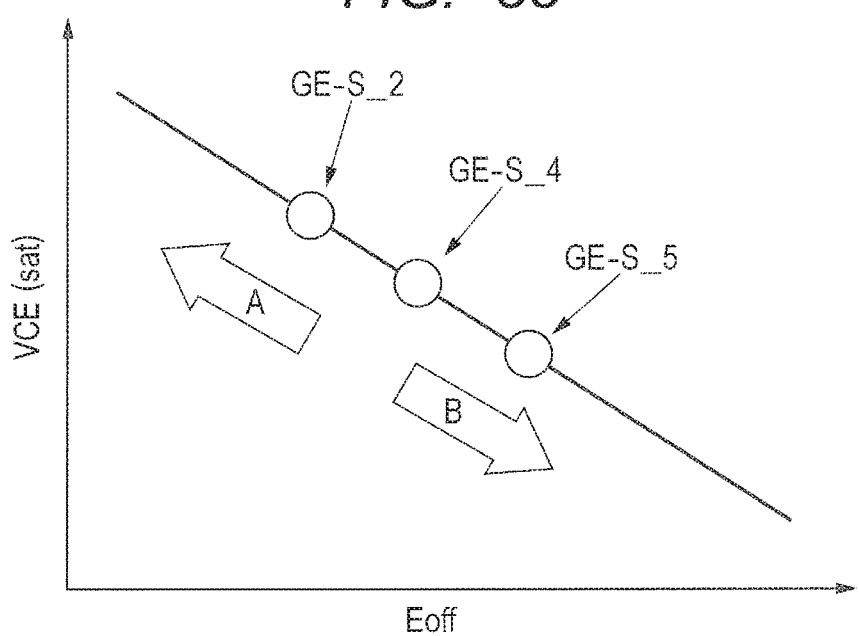
FIG. 55 is a view to explain tradeoff between switching-off characteristics and on resistance.

Proper uses of the respective semiconductor devices of the fifth to eighth modifications are now described with reference to FIG. 55. FIG. 55 illustrates tradeoff between switching turn-off loss and collector to emitter saturation voltage VCE(sat). The semiconductor devices (GE-S_2, GE-S_4, GE-S_5) of the fifth, the seventh, and the eighth modifications can be plotted on the tradeoff curve of the switching turn-off loss (Eoff) and the VCE(sat). The direction of an arrow A indicates higher-speed switching (smaller switching-off loss (Eof)). An arrow B indicates smaller VCE(sat). The semiconductor devices have different characteristics, allowing optimization corresponding to a specific application (specifically used frequency band). In a low frequency band, the number of times of switching is small, and a low VCE(sat) is required. In a high frequency band, conversely, the number of times of switching is large, and the switching-off loss is necessary to be reduced.

Ninth Modification

Figure 56:
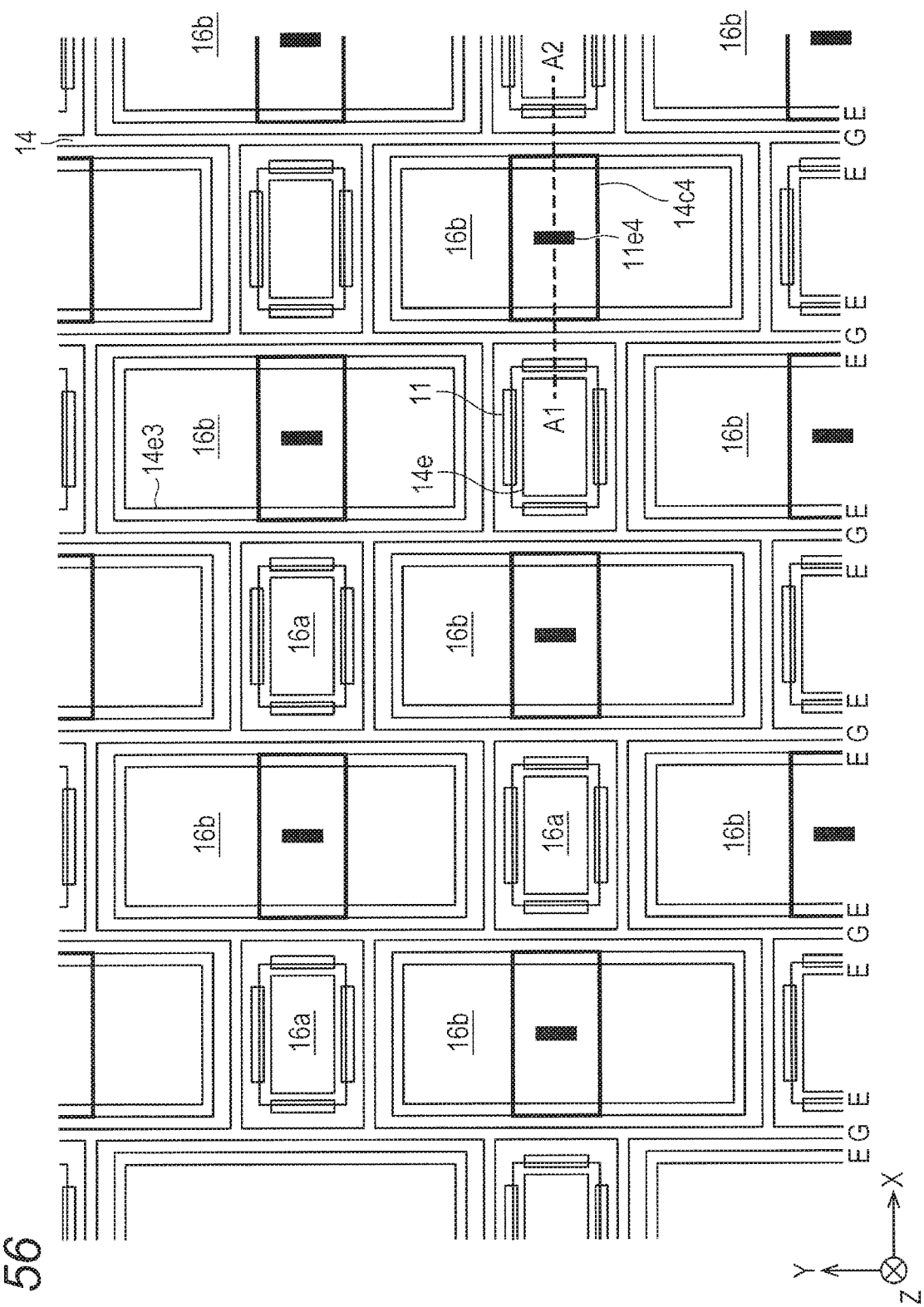
FIG. 56 illustrates a semiconductor device of a ninth modification.
Figure 57:
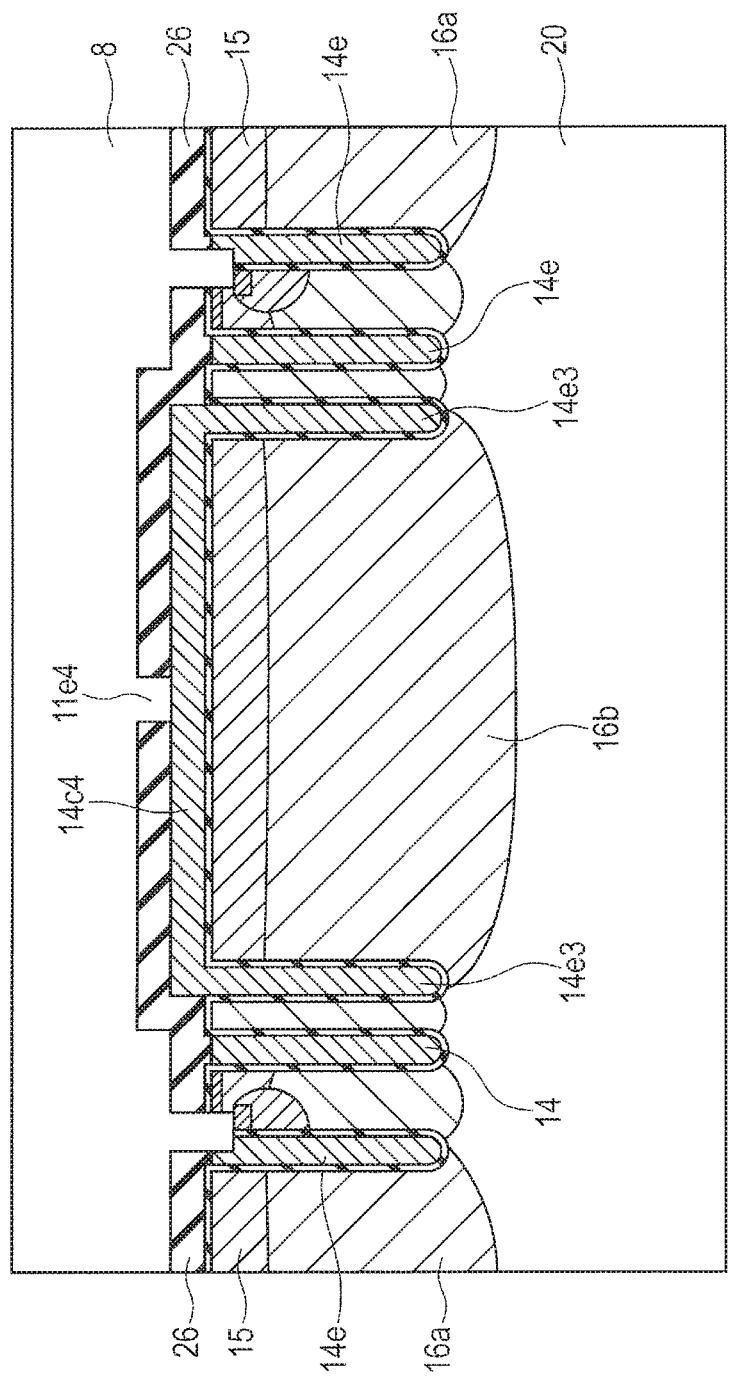
FIG. 57 illustrates the semiconductor device of the ninth modification.

FIG. 56 is a plan view of a semiconductor device of a ninth modification. FIG. 57 is a sectional view along a line A1-A2 in FIG. 56. The semiconductor device of the ninth modification is similar to that of the fourth embodiment except for a method for supplying an emitter potential of the trench emitter electrode 14e3 of the semiconductor device. The trench emitter electrode 14e3 in the p-type floating region 16b is coupled to the emitter electrode 8 via an emitter coupling part 14c4 including, for example, a polycrystalline silicon film extending in the x-axis direction and a contact hole 11e4 so as to receive the emitter potential.

Tenth Modification

Figure 58:
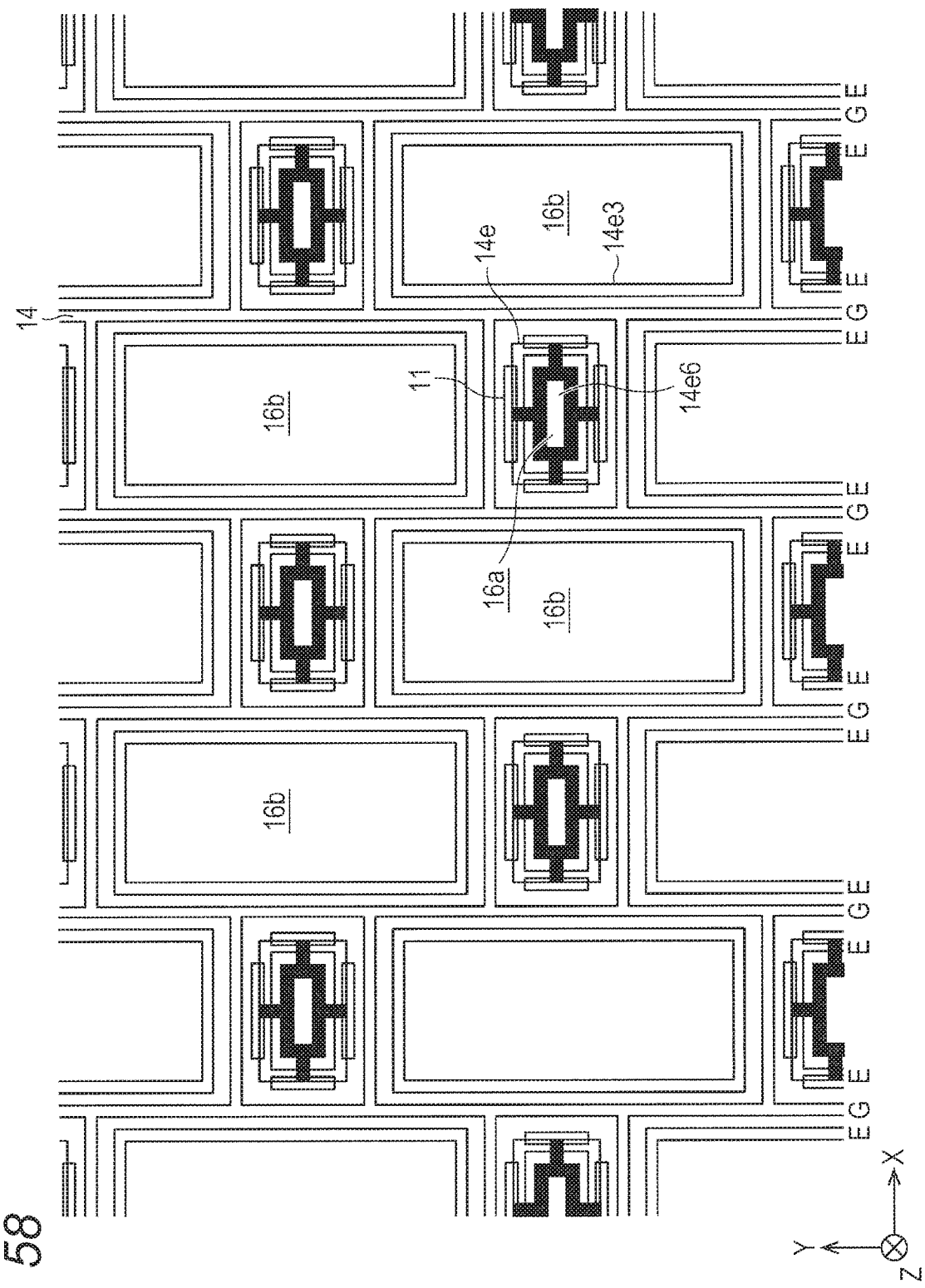
FIG. 58 illustrates a semiconductor device of a tenth modification.
Figure 59:
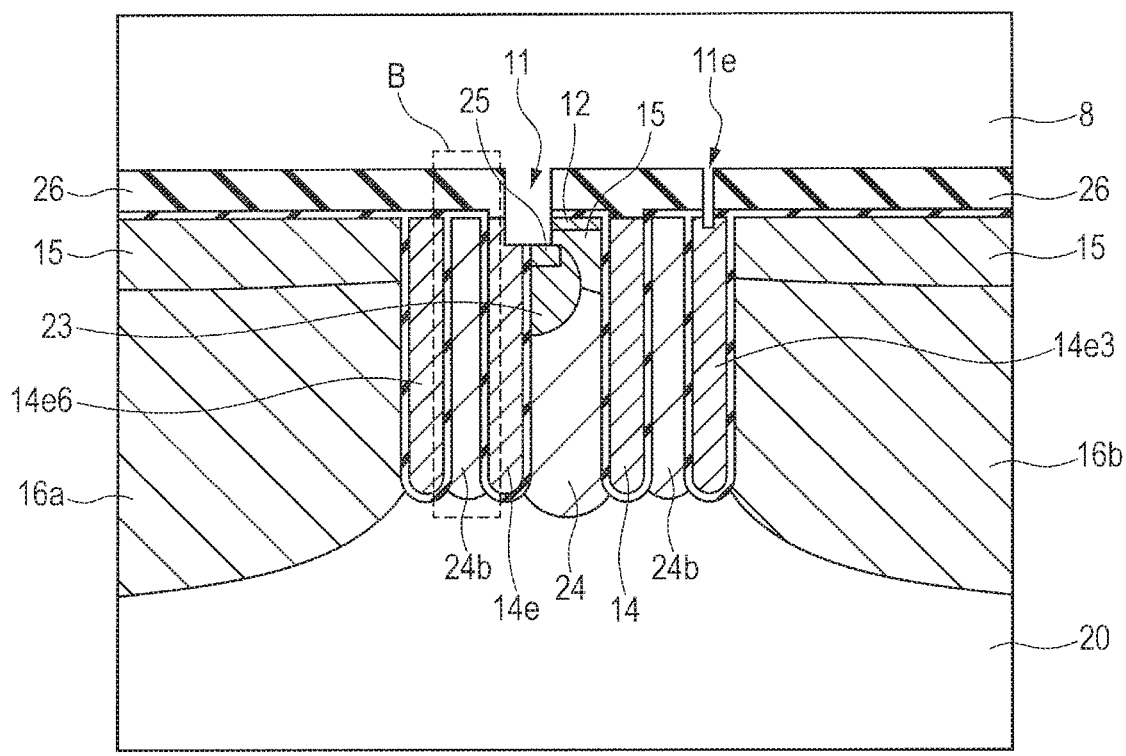
FIG. 59 illustrates the semiconductor device of the tenth modification.

The isolation structure of the eighth modification can be applied to the mesh pattern as in the fourth modification. FIG. 58 is a plan view of a semiconductor device of a tenth modification. FIG. 59 is a sectional view of the semiconductor device of the tenth modification.

In the semiconductor device of the tenth modification, a trench emitter electrode 14e6 having a frame shape in planar view is added to the p-type floating region 16a in the fourth modification. The trench emitter electrode 14e6 is coupled to the trench emitter electrode 14e at four points and thus coupled to the emitter electrode 8. This makes it possible to completely suppress operation of the parasitic p channel-type MOSFET, and thus further improve the IE effect compared with the fourth modification. In addition, the p-type floating region 16a is not necessary to be reduced, which expands the adjustment range of the gate capacity and remarkably increases the degree of freedom in design.

Eleventh Modification

Figure 60:
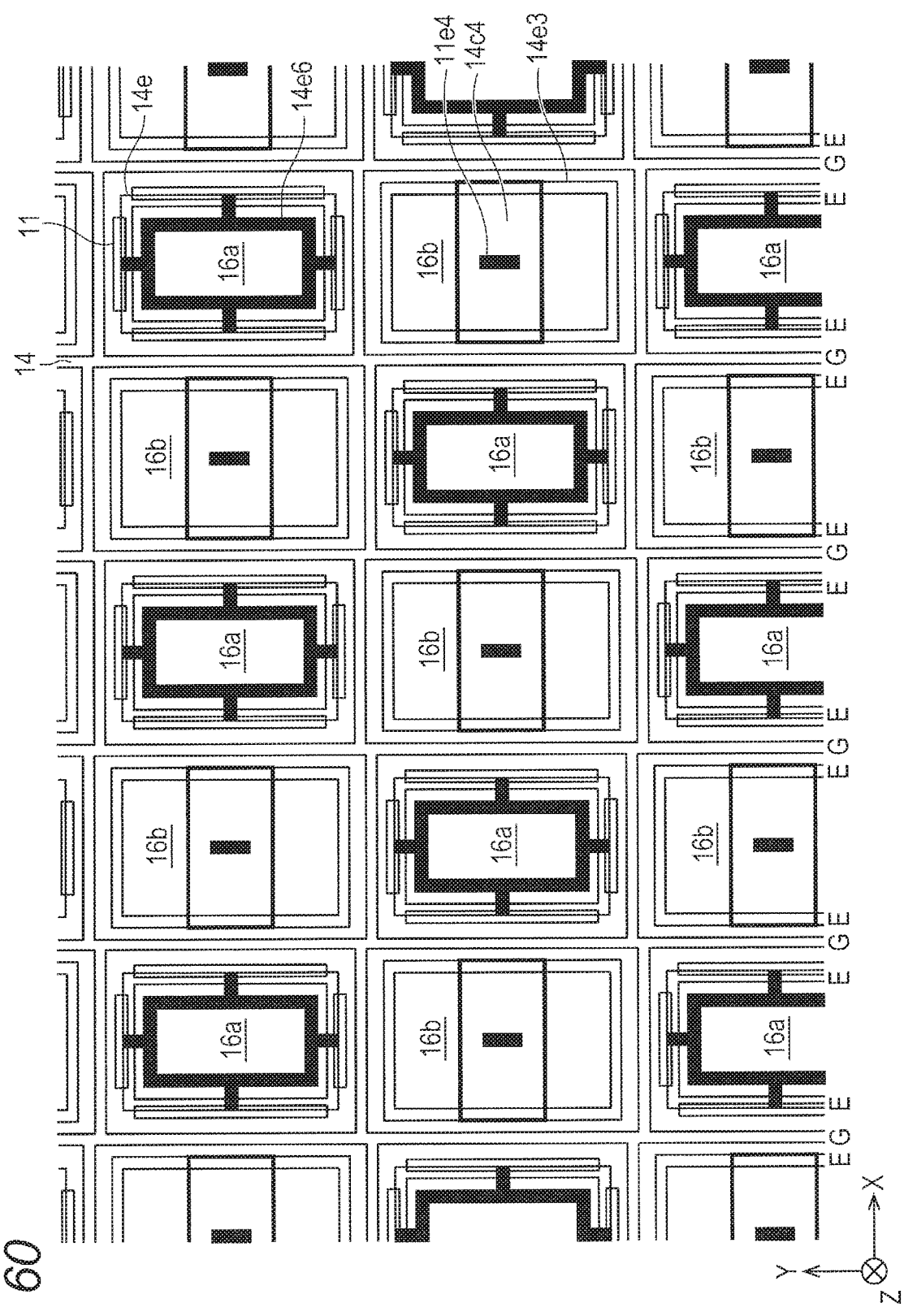
FIG. 60 illustrates a semiconductor device of an eleventh modification.

FIG. 60 is a plan view of a semiconductor device of an eleventh modification.

The semiconductor device of the eleventh modification is formed by modifying the semiconductor device of the tenth modification in such a manner that area of the p-type floating region 16a is increased while area of the p-type floating region 16b is decreased. In addition, the emitter potential is supplied in the same way as in the ninth modification. This makes it possible to increase a locatable area of the n$^+$-type emitter region 12 and thus expand a design range of saturation current, so that the semiconductor device can be adapted to a high-saturation current product.

Application
(Module Configuration)

An exemplary module, in which a plurality of semiconductor chips, each including the semiconductor device of one of the Example and the first to eleventh modifications, are coupled in parallel, is now described.

Figure 61:
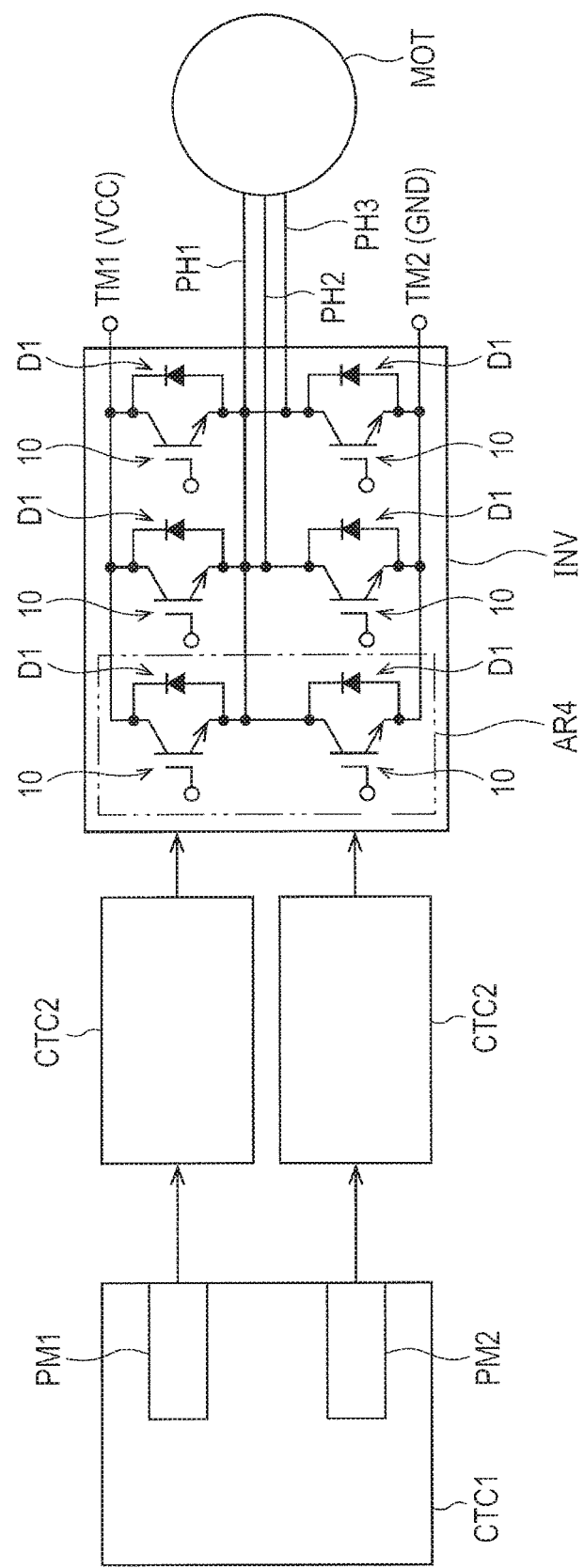
FIG. 61 illustrates an exemplary electronic system.
Figure 62:
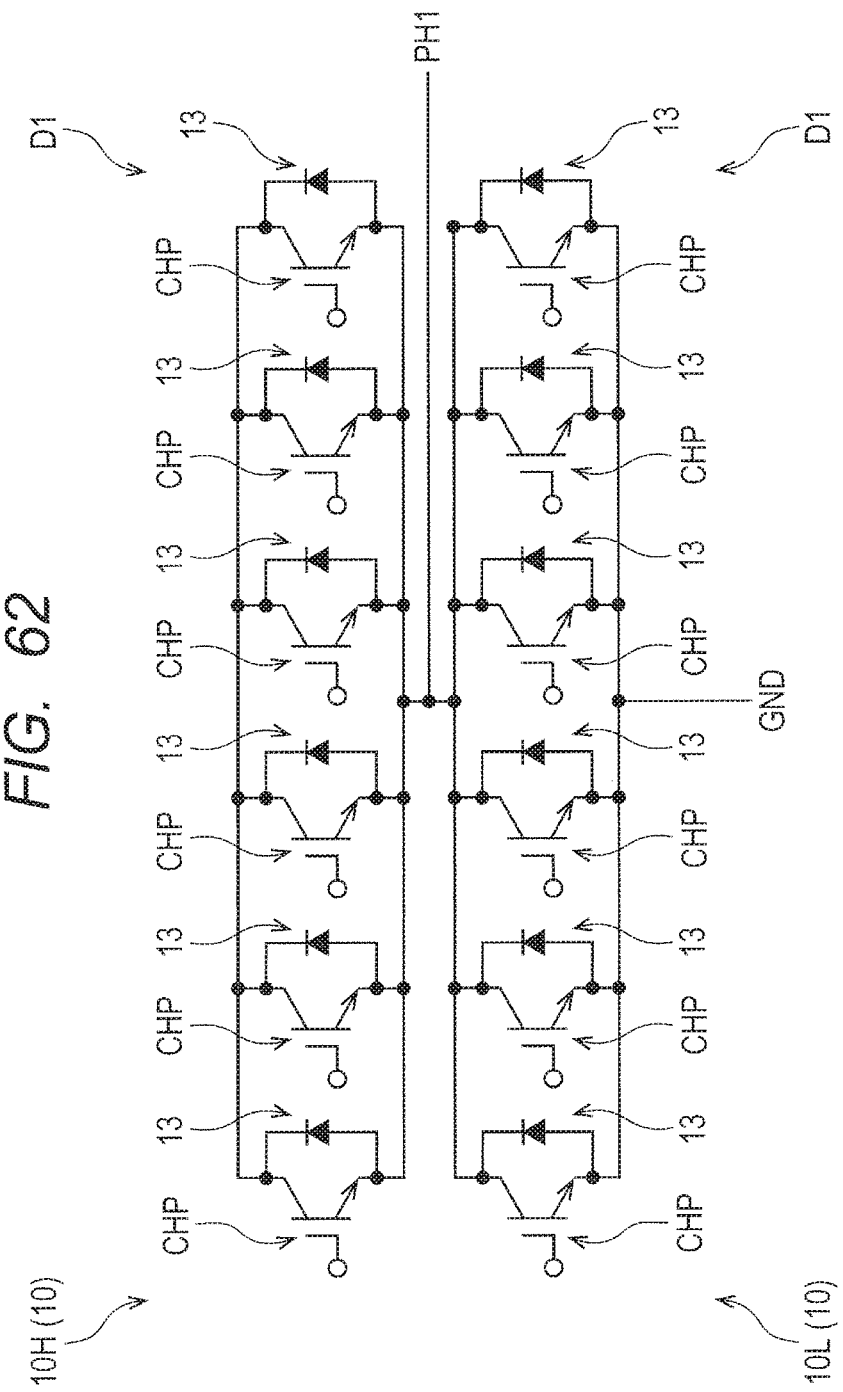
FIG. 62 illustrates a module in a region AR4 of FIG. 61.

FIG. 61 is a circuit block diagram showing an exemplary electronic system. FIG. 62 is an equivalent circuit diagram showing a module in a region AR4 of FIG. 61.

As shown in FIG. 61, the electronic system includes a load such as a motor MOT, an inverter INV, and control circuits CTC1 and CTC2. Such an electronic system includes, for example, a solar photovoltaic system, a wind power generation system, and an uninterruptible power supply (UPS) system. A three-phase motor is used as the motor MOT herein. The three-phase motor is driven by a three-phase voltage with different phases. The control circuit CTC1 includes a plurality of power modules PM1 and PM2.

In the electronic system of FIG. 61, for example, output of an undepicted power generation module of the solar photovoltaic system, the wind power generation system, or the uninterruptible power supply system is coupled to input terminals TM1 and TM2 of the inverter INV, and a DC voltage of that power generation module, i.e., DC power is supplied to the inverter INV.

The control circuit CTC1 is configured by, for example, an electronic control unit (ECU), and incorporates a control semiconductor chip such as a micro controller unit (MCU). The control circuit CTC1 includes the plurality of power modules PM1 and PM2. Each of the power modules PM1 and PM2 is also configured by, for example, ECU, and incorporates a control semiconductor chip such as MCU.

The power modules PM1 and PM2 in the control circuit CTC1 are coupled to the control circuit CTC2. The inverter INV is controlled by the control circuit CTC2. While not shown, the control circuit CTC2 includes a gate driver and a photocoupler, for example. The undepicted gate driver in the control circuit CTC2 is coupled to the inverter INV. Specifically, the gate driver in the control circuit CTC2 is coupled to a gate electrode of IGBT provided in the inverter INV.

The inverter INV is coupled to the motor MOT. The DC voltage, or DC power, supplied from the undepicted power generation module of the solar photovoltaic system, the wind power generation system, or the uninterruptible power supply system to the inverter INV is converted into AC voltage, or AC power, by the inverter INV and supplied to the motor MOT. The motor MOT is driven by the AC voltage, or the AC power, supplied from the inverter INV.

In the example shown in FIG. 61, the motor MOT is a three-phase motor including a U phase PH1, a V phase PH2, and a W phase 3. The inverter INV is therefore adaptable to the three phases including the U phase PH1, the V phase PH2, and the W phase 3. Such an inverter INV adaptable to the three phases has six sets in total of the IGBT modules 10 and the diode modules D1.

The IGBT module 10 includes a plurality of IGBT chips CHP as shown in FIG. 62, and each of the IGBT chips corresponds to the semiconductor chip 2 (see FIG. 23).

When the motor MOT is a two-phase motor, the inverter INV has four sets in total of the IGBT modules 10 and the diode modules D1.

A potential side of the inverter INV, having a potential close to the supply potential (VCC) INV with respect to the input potential of the motor MOT, is referred to as high side. A potential side of the inverter INV, having a potential close to the ground potential (GND) INV with respect to the input potential of the motor MOT, is referred to as low side. In the example shown in FIG. 61, three IGBT modules 10 are used as the high-side IGBT modules 10, and three IGBT modules 10 are used as the low-side IGBT modules 10. Three diode modules D1 are used as the high-side diode modules D1, and three diode modules D1 are used as the low-side diode modules D1.

In the two IGBT modules 10 adapted to, for example, the U phase in the region AR4 of FIG. 61, a high-side IGBT module 10H includes a plurality of, for example, six, IGBT chips CHP each including the semiconductor chip 2 as shown in FIG. 62. In the two IGBT modules 10 adapted to, for example, the U phase, a low-side IGBT module 10L includes a plurality of, for example, six, IGBT chips CHP each including the semiconductor chip 2. In each of the high-side and low-side IGBT modules 10, the emitter electrodes 8 of the IGBT chips CHP are electrically coupled together, and the collector electrodes CE thereof are also electrically coupled together.

The semiconductor devices of one of the Example and the first to eleventh modifications may be used as each of the IGBT chips CHP included in the IGBT module 10.

In the example of FIG. 62, the IGBT module 10 and the diode module D1 are coupled in inverse parallel between the supply potential (VCC) supplied to the inverter INV via the input terminals TM1 and TM2 and input potential of the motor MOT, i.e., on the high side, for each of the three phases including the U phase PH1, the V phase PH2, and the W phase 3. the IGBT module 10 and the diode module D1 are coupled in inverse parallel between the input potential of the motor MOT and the ground potential (GND), i.e., on the low side, for each of the three phases including the U phase PH1, the V phase PH2, and the W phase 3.

The control circuit CTC2 is coupled to each of the gate electrodes of the IGBT chips CHP included in each of the six IGBT modules 10, and controls each of the IGBT chips in the IGBT module 10. A plurality of diodes 13 are included in each of the six diode modules D1, and each diode 13 is coupled in inverse parallel with the IGBT chip CHP.

A current flowing through the IGBT module 10 is controlled using the control circuit CTC2, thereby the motor MOT is rotated. Specifically, the control circuit CTC2 is used to control on and off of the IGBT module 10, thereby the motor MOT can be driven. Although the IGBT module 10 is thus necessary to be turned on or off to drive the motor MOT, the motor MOT has inductance. Hence, when the IGBT module 10 is turned off, a current in a direction opposite to the current flow direction in the IGBT module 10 is generated due to the inductance of the motor MOT. Since the IGBT module 10 does not have a function of flowing such an inverse current, the diode module D1 is provided in inverse parallel with the IGBT module 10, thereby the inverse current is refluxed to release energy stored in the inductance.

As described above, the semiconductor device of one of the Example and the first to eleventh modifications can be used as each of the IGBT chips CHP included in the IGBT module 10.

Hence, the IGBT chips CHP included in the IGBT module 10 can each be improved in the IE effect, reduced in the switching loss at turn-on, and reduced in the collector to emitter saturation voltage VCE(sat) as with the semiconductor device of one of the Example and the first to eleventh modifications.

Control of high power is necessary for a module in the electronic system such as the solar photovoltaic system, the wind power generation system, or the uninterruptible power supply system, for example. In the module treating such high power, the number of parallel connection of the IGBT chips CHP increases with an increase in power. In a module including many IGBT chips CHP coupled in parallel, however, current is concentrated on some of the IGBT chips CHP due to influence of imbalance at switching, causing break or an increase in loss.

As described above, however, the semiconductor device of one of the Example and the first to eleventh modifications prompts the transient IE effect and thus allows on voltage to fall at higher speed at turn-on. Hence, the semiconductor device of one of the Example and the first to eleventh modifications is used for the IGBT chips CHP included in the IGBT module 10, thereby the imbalance at switching is less likely to occur in the IGBT module 10. As a result, an IGBT module 10 that is improved in stability and reduced in loss can be achieved.

Although the invention achieved by the inventors has been described in detail according to the embodiment, the Example, the modifications, and the application thereof hereinbefore, the invention should not be limited thereto, and it will be appreciated that various modifications or alterations thereof may be made within the scope without departing from the gist of the invention.

The above-described embodiment includes the following aspect.

Supplementary Note 1

A method of manufacturing a semiconductor device including a trench gate electrode located at a boundary of one end of an active cell region and an inactive cell region, and a trench emitter electrode located at a boundary of the other end of the active cell region and the inactive cell region, includes the steps of:

defining a first region and a second region adjacent to each other in a semiconductor substrate having a first surface and a first conductivity type;

forming the trench gate electrode in the inside of a first trench that runs from the first surface of the semiconductor substrate located in the first region to a first depth while a first insulating film is provided between the inside and the trench gate electrode, and forming the trench emitter electrode spaced from the first trench in the inside of a second trench that runs from the first surface of the semiconductor substrate to the first depth while a second insulating film is provided between the inside and the trench emitter electrode;

introducing an impurity having a second conductivity type into the semiconductor substrate located in the second region to form a floating region;

forming a first semiconductor region having the first conductivity type from the first surface of the semiconductor substrate located in the first region between the trench gate electrode and the trench emitter electrode to a second depth;

forming a second semiconductor region having the second conductivity type from the second depth of the semiconductor substrate located in the first region between the trench gate electrode and the trench emitter electrode to a position deeper than the second depth and shallower than the first depth;

forming an opening in the trench emitter electrode, the first semiconductor region, and the second semiconductor region; and forming a contact part in the opening so as to be electrically coupled to the trench emitter electrode, the first semiconductor region, and the second semiconductor region.

What is claimed is:

1. A semiconductor device, comprising:
a semiconductor substrate having a first main surface and a second main surface on a side opposite to the first main surface;
a first semiconductor region having a first conductivity type and provided in the semiconductor substrate;
a second semiconductor region having a second conductivity type different from the first conductivity type and provided in the semiconductor substrate between the first semiconductor region and the first main surface;
a third semiconductor region having the second conductivity type and provided in the semiconductor substrate between the first semiconductor region and the second main surface;
a first trench penetrating the second semiconductor region;
a second trench provided away from the first trench while penetrating the second semiconductor region;
a fourth semiconductor region having the first conductivity type and provided on a side close to the first main surface in the second semiconductor region so as to be in contact with a first side surface of the first trench, and located between the first trench and the second trench;
a first trench electrode provided over an inside of the first trench with a first insulating film in between;
a second trench electrode provided over an inside of the second trench with a second insulating film as in between;
a fifth semiconductor region having the second conductivity type and formed in the first semiconductor region in a portion located on a side opposite to the fourth semiconductor region across the first trench;
a sixth semiconductor region having the second conductivity type formed in the first semiconductor region in a portion located on a side opposite to the fourth semiconductor region across the second trench; and
a contact hole in contact with the second trench and the fourth semiconductor region.

2. The semiconductor device according to claim 1, further comprising a seventh semiconductor region having the first conductivity type and formed in the first semiconductor region in a portion located between the first trench and the second trench, wherein concentration of an impurity having the first conductivity type in the seventh semiconductor region is higher than concentration of an impurity having the first conductivity type in the first semiconductor region, and lower than concentration of an impurity having the first conductivity type in the fourth semiconductor region.

3. The semiconductor device according to claim 1, wherein depth of each of the fifth and sixth semiconductor regions from the first main surface is deeper than depth of each of the first trench and the second trench from the first main surface.

4. The semiconductor device according to claim 2, further comprising:
a third trench penetrating the second semiconductor region in a portion located on a side opposite to the first trench across the fifth semiconductor region;
a fourth trench penetrating the second semiconductor region in a portion located on a side opposite to the second trench across the sixth semiconductor region;
a first coupling trench provided so as to be coupled to the first trench and the fourth trench, and extending in a first direction in planar view;
a first end trench provided between the first trench and the fourth trench so as to be coupled to the second trench, and extending in the first direction in planar view;
a third trench electrode provided over an inside of the third trench with an insulating film in between;
a fourth trench electrode provided over an inside of the fourth trench with an insulating film in between;
a first trench coupling electrode provided over an inside of the first coupling trench with an insulating film in between;
a first trench end electrode provided over an inside of the first end trench with an insulating film in between; and
an eighth semiconductor region having the first conductivity type and running from the first main surface to a depth of a bottom of the first coupling trench between the first coupling trench and the first end trench, wherein the first trench electrode, the second trench electrode, the third trench electrode, and the fourth trench electrode are provided away from one another in a first direction and extend in a second direction orthogonal to the first direction in planar view, and wherein concentration of an impurity having the first conductivity type in the eighth semiconductor region is higher than the concentration of the impurity having the first conductivity type in the first semiconductor region, and lower than the concentration of the impurity having the first conductivity type in the fourth semiconductor region.

5. The semiconductor device according to claim 4, further comprising:
a second end trench running up to the first semiconductor region, and provided between the first trench and the fourth trench so as to be coupled to the first end trench, and extending in the second direction in planar view;
a second trench end electrode provided over an inside of the second end trench with an insulating film in between; and
the eighth semiconductor region provided between the fourth trench and the second end trench.

6. The semiconductor device according to claim 2, further comprising:
a third trench penetrating the second semiconductor region in a portion located on a side opposite to the first trench across the fifth semiconductor region;
a fourth trench penetrating the second semiconductor region in a portion located on a side opposite to the second trench across the sixth semiconductor region;
a first coupling trench provided so as to be coupled to the first trench and the third trench, and extending in a first direction in planar view;
a second coupling trench provided so as to be coupled to the second trench and the fourth trench, and extending in the first direction in planar view;
a fifth trench having a frame shape in planar view, and provided between the first trench, the third trench, and the first coupling trench while penetrating the second semiconductor region in the fifth semiconductor region;
a third trench electrode provided over an inside of the third trench with an insulating film in between;
a fourth trench electrode provided over an inside of the fourth trench with an insulating film in between;
a fifth trench electrode provided over an inside of the fifth trench with an insulating film in between;
a first trench coupling electrode provided over an inside of the first coupling trench with an insulating film in between;
a second trench coupling electrode provided over an inside of the second coupling trench with an insulating film in between; and
a contact hole in contact with the fifth trench and the second semiconductor region;
wherein the first trench electrode, the second trench electrode, the third trench electrode, and the fourth trench electrode are provided away from one another in a first direction and extend in a second direction orthogonal to the first direction.

7. The semiconductor device according to claim 2, further comprising:
a third trench penetrating the second semiconductor region in a portion located on a side opposite to the first trench across the fifth semiconductor region;
a fourth trench penetrating the second semiconductor region in a portion located on a side opposite to the second trench across the sixth semiconductor region;
a fifth trench penetrating the second semiconductor region in a portion located on a side opposite to the second trench across the fourth trench;
a sixth trench and a seventh trench provided so as to be coupled to the second trench and the fourth trench, and provided away from each other in a second direction while extending in a first direction in planar view;
a first coupling trench and a second coupling trench provided so as to be coupled to the first trench and the third trench, and provided away from each other in the second direction while extending in the first direction in planar view;
an eighth trench having a frame shape in planar view, and provided between the first trench, the third trench, the first coupling trench, and the second coupling trench while penetrating the second semiconductor region in the fifth semiconductor region;
a third coupling trench and a fourth coupling trench provided so as to be coupled to the first trench and the fifth trench, and provided away from each other in the second direction while extending in the first direction in planar view;
a ninth semiconductor region having the first conductivity type and provided on a side close to the first main surface in the second semiconductor region so as to be in contact with a first side surface of the fifth trench, and located between the fifth trench and the fourth trench;
a third trench electrode provided over an inside of the third trench with an insulating film in between;
a fourth trench electrode provided over an inside of the fourth trench with an insulating film in between;
a fifth trench electrode provided over an inside of the fifth trench with an insulating film in between;
a sixth trench electrode provided over an inside of the sixth trench with an insulating film in between;
a seventh trench electrode provided over an inside of the seventh trench with an insulating film in between;
an eighth trench electrode provided over an inside of the eighth trench with an insulating film in between;
a first trench coupling electrode provided over an inside of the first coupling trench with an insulating film in between;
a second trench coupling electrode provided over an inside of the second coupling trench with an insulating film in between;
a third trench coupling electrode provided over an inside of the third coupling trench with an insulating film in between;
a fourth trench coupling electrode provided over an inside of the fourth coupling trench with an insulating film in between;
a contact hole in contact with the fourth trench and the ninth semiconductor region; and
a contact hole in contact with the eighth trench and the second semiconductor region,
wherein area of a region enclosed by the first trench, the third trench, the first coupling trench, and the second coupling trench is larger than area of a region enclosed by the first trench, the fourth trench, the third coupling trench, and the fourth coupling trench.

8. The semiconductor device according to claim 2, further comprising:
- a third trench penetrating the second semiconductor region in a portion located on a side opposite to the first trench across the fifth semiconductor region;
- a fourth trench penetrating the second semiconductor region in a portion located on a side opposite to the second trench across the sixth semiconductor region;
- a fifth trench penetrating the second semiconductor region in a portion located on a side opposite to the second trench across the fourth trench;
- a sixth trench and a seventh trench provided so as to be coupled to the second trench and the fourth trench, and provided away from each other in a second direction while extending in a first direction in planar view;
- a first coupling trench and a second coupling trench provided so as to be coupled to the first trench and the third trench, and provided away from each other in the second direction while extending in the first direction in planar view;
- an eighth trench having a frame shape in planar view, and provided between the first trench, the third trench, the first coupling trench, and the second coupling trench while penetrating the second semiconductor region in the fifth semiconductor region;
- a third coupling trench and a fourth coupling trench provided so as to be coupled to the first trench and the fifth trench, and provided away from each other in the second direction while extending in the first direction in planar view;
- a third trench electrode provided over an inside of the third trench with an insulating film in between;
- a fourth trench electrode provided over an inside of the fourth trench with an insulating film in between;
- a fifth trench electrode provided over an inside of the fifth trench with an insulating film in between;
- a sixth trench electrode provided over an inside of the sixth trench with an insulating film in between;
- a seventh trench electrode provided over an inside of the seventh trench with an insulating film in between;
- an eighth trench electrode provided over an inside of the eighth trench with an insulating film in between;
- a first trench coupling electrode provided over an inside of the first coupling trench with an insulating film in between;
- a second trench coupling electrode provided over an inside of the second coupling trench with an insulating film in between;
- a third trench coupling electrode provided over an inside of the third coupling trench with an insulating film in between;
- a fourth trench coupling electrode provided over an inside of the fourth coupling trench with an insulating film in between;
- a ninth semiconductor region having the first conductivity type, and provided on a side close to the first main surface in the second semiconductor region so as to be in contact with a first side surface of the fifth trench while being located between the fifth trench and the fourth trench;
- a tenth semiconductor region having the first conductivity type, and running from the first main surface to a depth of a bottom of the first trench between the first trench and the eighth trench; and
- a contact hole in contact with the fourth trench and the ninth semiconductor region, wherein concentration of an impurity having the first conductivity type in the tenth semiconductor region is higher than the concentration of the impurity having the first conductivity type in the first semiconductor region, and lower than the concentration of the impurity having the first conductivity type in the fourth semiconductor region, and wherein area of a region enclosed by the first trench, the third trench, the first coupling trench, and the second coupling trench is larger than area of a region enclosed by the first trench, the fourth trench, the third coupling trench, and the fourth coupling trench.

9. The semiconductor device according to claim 2, further comprising:
- a third trench penetrating the second semiconductor region in a portion located on a side opposite to the first trench across the fifth semiconductor region;
- a fourth trench penetrating the second semiconductor region in a portion located on a side opposite to the second trench across the sixth semiconductor region;
- a fifth trench penetrating the second semiconductor region in a portion located on a side opposite to the third trench across the fifth semiconductor region;
- a sixth trench penetrating the second semiconductor region in a portion located on a side opposite to the second trench across the sixth semiconductor region;
- a first coupling trench provided so as to be coupled to the third trench and the fifth trench, and extending in a first direction in planar view;
- a second coupling trench provided so as to be coupled to the second trench and the sixth trench, and extending in the first direction in planar view;
- a third trench electrode provided over an inside of the third trench with an insulating film in between;
- a fourth trench electrode provided over an inside of the fourth trench with an insulating film in between;
- a fifth trench electrode provided over an inside of the fifth trench with an insulating film in between;
- a sixth trench electrode provided over an inside of the sixth trench with an insulating film in between;
- a first trench coupling electrode provided over an inside of the first coupling trench with an insulating film in between;
- a first trench end electrode provided over an inside of the first end trench with an insulating film in between; and
- an eighth semiconductor region having the first conductivity type and running from the first main surface to a depth of a bottom of the first trench between the first trench and the fifth trench, wherein the first trench electrode, the second trench electrode, the third trench electrode, the fourth trench electrode, the fifth trench electrode, and the sixth trench electrode are provided away from one another in the first direction, and extend in a second direction orthogonal to the first direction, and wherein concentration of an impurity having the first conductivity type in the eighth semiconductor region is higher than the concentration of the impurity having the first conductivity type in the first semiconductor region, and lower than the concentration of the impurity having the first conductivity type in the fourth semiconductor region.

10. The semiconductor device according to claim 2, further comprising:
- a third trench penetrating the second semiconductor region in a portion located on a side opposite to the first trench across the fifth semiconductor region;

a fourth trench penetrating the second semiconductor region in a portion located on a side opposite to the second trench across the sixth semiconductor region;
a fifth trench penetrating the second semiconductor region in a portion located on a side opposite to the third trench across the fifth semiconductor region;
a sixth trench penetrating the second semiconductor region in a portion located on a side opposite to the second trench across the sixth semiconductor region;
a third trench electrode provided over an inside of the third trench with an insulating film in between;
a fourth trench electrode provided over an inside of the fourth trench with an insulating film in between;
a fifth trench electrode provided over an inside of the fifth trench with an insulating film in between;
a sixth trench electrode provided over an inside of the sixth trench with an insulating film in between;
an eighth semiconductor region having the first conductivity type and running from the first main surface to a depth of a bottom of the first coupling trench between the first trench and the fifth trench;
a ninth semiconductor region having the first conductivity type and provided on a side close to the first main surface in the second semiconductor region so as to be in contact with a first side surface of the fourth trench, and located between the fourth trench and the sixth trench; and
a contact hole in contact with the sixth trench and the second semiconductor region,
wherein the first trench electrode, the second trench electrode, the third trench electrode, the fourth trench electrode, the fifth trench electrode, and the sixth trench electrode are provided away from one another in a first direction and extend in a second direction orthogonal to the first direction in planar view, and
wherein concentration of an impurity having the first conductivity type in the eighth semiconductor region is higher than the concentration of the impurity having the first conductivity type in the first semiconductor region, and lower than the concentration of the impurity having the first conductivity type in the fourth semiconductor region.

11. The semiconductor device according to claim 10, wherein width of the fifth semiconductor region between the first trench and the third trench is larger than width of the fifth semiconductor region between the second trench and the sixth trench.

12. The semiconductor device according to claim 2, further comprising:
a third trench penetrating the second semiconductor region in a portion located on a side opposite to the first trench across the fifth semiconductor region;
a fourth trench penetrating the second semiconductor region in a portion located on a side opposite to the second trench across the sixth semiconductor region;
a fifth trench penetrating the second semiconductor region in a portion located on a side opposite to the third trench across the fifth semiconductor region;
a sixth trench penetrating the second semiconductor region in a portion located on a side opposite to the second trench across the sixth semiconductor region;
a seventh trench penetrating the second semiconductor region in a portion located on a side opposite to the fifth trench across the fifth semiconductor region;
an eighth trench penetrating the second semiconductor region in a portion located on a side opposite to the sixth trench across the sixth semiconductor region;
a third trench electrode provided over an inside of the third trench with an insulating film in between;
a fourth trench electrode provided over an inside of the fourth trench with an insulating film in between;
a fifth trench electrode provided over an inside of the fifth trench with an insulating film in between;
a sixth trench electrode provided over an inside of the sixth trench with an insulating film in between;
a seventh trench electrode provided over an inside of the seventh trench with an insulating film in between;
an eighth trench electrode provided over an inside of the eighth trench with an insulating film in between;
an eighth semiconductor region having the first conductivity type and running from the first main surface to a depth of a bottom of the first trench between the first trench and the fifth trench; and
a ninth semiconductor region having the first conductivity type and running from the first main surface to a depth of a bottom of the second trench between the second trench and the eighth trench,
wherein the first trench electrode, the second trench electrode, the third trench electrode, the fourth trench electrode, the fifth trench electrode, and the sixth trench electrode are provided away from one another in the first direction and extend in a second direction orthogonal to the first direction in planar view; and
wherein concentration of an impurity having the first conductivity type in each of the eighth semiconductor region and the ninth semiconductor region is higher than the concentration of the impurity having the first conductivity type in the first semiconductor region, and lower than the concentration of the impurity having the first conductivity type in the fourth semiconductor region.

13. The semiconductor device according to claim 8, wherein the eighth trench electrode includes a first electrode and a second electrode that are provided away from each other in the first direction and extend in the second direction orthogonal to the first direction in planar view, and
wherein the semiconductor device further includes a conductive layer coupled to the first electrode and the second electrode and extending in the first direction, and a contact hole coupled to the conductive layer.

14. The semiconductor device according to claim 2, further comprising:
a third trench penetrating the second semiconductor region in a portion located on a side opposite to the first trench across the fifth semiconductor region;
a fourth trench penetrating the second semiconductor region in a portion located on a side opposite to the second trench across the sixth semiconductor region;
a fifth trench penetrating the second semiconductor region in a portion located on a side opposite to the second trench across the fourth trench;
a sixth trench and a seventh trench provided so as to be coupled to the second trench and the fourth trench, and provided away from each other in the second direction while extending in the first direction in planar view;
an eighth trench having a frame shape in planar view, and provided between the first trench, the third trench, the first coupling trench, and the second coupling trench while penetrating the second semiconductor region in the fifth semiconductor region;
a ninth trench having a frame shape and provided in a region enclosed by the second trench, the fourth trench, the sixth trench, and the seventh trench in planar view while penetrating the second semiconductor region in the sixth semiconductor region;

a first coupling trench and a second coupling trench provided so as to be coupled to the first trench and the third trench, and provided away from each other in the second direction while extending in the first direction in planar view;

a third coupling trench and a fourth coupling trench provided so as to be coupled to the first trench and the fifth trench, and provided away from each other in the second direction while extending in the first direction in planar view;

a third trench electrode provided over an inside of the third trench with an insulating film in between;

a fourth trench electrode provided over an inside of the fourth trench with an insulating film in between;

a fifth trench electrode provided over an inside of the fifth trench with an insulating film in between;

a sixth trench electrode provided over an inside of the sixth trench with an insulating film in between;

a seventh trench electrode provided over an inside of the seventh trench with an insulating film in between;

an eighth trench electrode provided over an inside of the eighth trench with an insulating film in between;

a ninth trench electrode provided over an inside of the ninth trench with an insulating film in between;

a first trench coupling electrode provided over an inside of the first coupling trench with an insulating film in between;

a second trench coupling electrode provided over an inside of the second coupling trench with an insulating film in between;

a third trench coupling electrode provided over an inside of the third coupling trench with an insulating film in between;

a fourth trench coupling electrode provided over an inside of the fourth coupling trench with an insulating film in between;

a ninth semiconductor region having the first conductivity type, and provided on a side close to the first main surface in the second semiconductor region so as to be in contact with a first side surface of the fifth trench while being located between the fifth trench and the fourth trench;

a tenth semiconductor region having the first conductivity type and running from the first main surface to a depth of a bottom of the first trench between the first trench and the eighth trench;

an eleventh semiconductor region having the first conductivity type and provided in the semiconductor substrate between the first semiconductor region and the first main surface between the ninth trench and the second trench, the fourth trench, the sixth trench, as well as the seventh trench;

a contact hole in contact with the fourth trench and the ninth semiconductor region; and a contact hole in contact with the eighth trench and the second semiconductor region as the p-type body region, wherein concentration of an impurity having the first conductivity type in each of the tenth semiconductor region and the eleventh semiconductor region is higher than the concentration of the impurity having the first conductivity type in the first semiconductor region, and lower than the concentration of the impurity having the first conductivity type in the fourth semiconductor region.

15. The semiconductor device according to claim 14, wherein the eighth trench electrode includes a first electrode and a second electrode that are provided away from each other in the first direction and extend in a second direction orthogonal to the first direction in planar view, and wherein the semiconductor device further includes a conductive layer coupled to the first electrode and the second electrode and extending in the first direction, and a contact hole coupled to the conductive layer.

16. The semiconductor device according to claim 1, further comprising a gate electrode, an emitter electrode, and a collector electrode, wherein the first trench electrode is electrically coupled to the gate electrode, and wherein the second trench electrode is electrically coupled to the gate electrode.

* * * * *